(12) United States Patent
Arao et al.

(10) Patent No.: US 7,365,386 B2
(45) Date of Patent: *Apr. 29, 2008

(54) SEMICONDUCTOR DEVICE AND METHOD OF MANUFACTURING THE SEMICONDUCTOR DEVICE

(75) Inventors: Tatsuya Arao, Atsugi (JP); Hideomi Suzawa, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 49 days.

This patent is subject to a terminal disclaimer.

(21) Appl. No.: 10/649,667

(22) Filed: Aug. 28, 2003

(65) Prior Publication Data

US 2004/0056296 A1    Mar. 25, 2004

Related U.S. Application Data

(62) Division of application No. 09/768,830, filed on Jan. 25, 2001, now Pat. No. 6,639,265.

(30) Foreign Application Priority Data

Jan. 26, 2000  (JP) ............................. 2000-017425
Feb. 4, 2000   (JP) ............................. 2000-027597

(51) Int. Cl.
    *H01L 29/76* (2006.01)
(52) U.S. Cl. ................... 257/303; 257/59; 257/347; 257/350; 257/351; 257/357; 257/408; 257/431; 257/532
(58) Field of Classification Search ................ 257/303, 257/347, 350, 351, 357, 59, 408, 431, 452
    See application file for complete search history.

(56) References Cited

U.S. PATENT DOCUMENTS 5,247,190 A    9/1993   Friend et al.
(Continued)

FOREIGN PATENT DOCUMENTS

EP    1 001 467 A2    5/2000

(Continued)

OTHER PUBLICATIONS

H. Shenk et al., "Polymers for Light-emitting Diodes," Euro Display Proceedings 1999, pp. 33-37.

(Continued)

*Primary Examiner*—Edward Wojciechowicz
(74) *Attorney, Agent, or Firm*—Eric J. Robinson; Robinson Intellectual Property Law Office, P.C.

(57) ABSTRACT

A semiconductor device having improved reliability is provided. The semiconductor device has a pixel portion. The pixel portion has a TFT and a storage capacitor. The TFT and the storage capacitor has a semiconductor layer which includes first and second regions formed continuously. The TFT has the first region of the semiconductor layer including a channel forming region, a source region and a drain region located outside the channel forming region, a gate insulating film adjacent to the first region of the semiconductor layer, and a gate electrode formed on the gate insulating film. The storage capacitor has the second region of the semiconductor layer, an insulating film formed adjacent to the second region of the semiconductor layer, and a capacitor wiring formed on the insulating film. The second region of the semiconductor layer contains an impurity element for imparting n-type or p-type conductivity. The thickness of the insulating film adjacent to the second region of the semiconductor layer is thinner than that of the film on the region in which the TFT is formed.

29 Claims, 37 Drawing Sheets

U.S. PATENT DOCUMENTS

| | | | |
|---|---|---|---|
| 5,343,066 A | 8/1994 | Okamoto et al. | |
| 5,365,079 A | 11/1994 | Kodaira et al. | |
| 5,399,502 A | 3/1995 | Friend et al. | |
| 5,608,251 A | 3/1997 | Konuma et al. | |
| 5,620,905 A | 4/1997 | Konuma et al. | |
| 5,643,826 A | 7/1997 | Ohtani et al. | |
| 5,671,027 A | 9/1997 | Sasano et al. | |
| 5,739,882 A | 4/1998 | Shimizu et al. | |
| 5,923,962 A | 7/1999 | Ohtani et al. | |
| 5,942,310 A | 8/1999 | Moon | |
| 5,978,061 A | 11/1999 | Miyazaki et al. | |
| 6,066,860 A | 5/2000 | Katayama et al. | |
| 6,077,731 A | 6/2000 | Yamazaki et al. | |
| 6,088,258 A | 7/2000 | Aitken et al. | |
| 6,133,967 A | 10/2000 | Moon | |
| 6,140,667 A | 10/2000 | Yamazaki et al. | |
| 6,147,667 A | 11/2000 | Yamazaki et al. | |
| 6,163,357 A | 12/2000 | Nakamura | |
| 6,166,414 A | 12/2000 | Miyazaki et al. | |
| 6,236,445 B1 | 5/2001 | Foschaar et al. | |
| 6,275,061 B1 | 8/2001 | Tomita | |
| 6,278,131 B1 * | 8/2001 | Yamazaki et al. | 257/59 |
| 6,285,042 B1 | 9/2001 | Ohtani et al. | |
| 6,335,541 B1 | 1/2002 | Ohtani et al. | |
| 6,348,368 B1 | 2/2002 | Yamazaki et al. | |
| 6,356,330 B1 | 3/2002 | Ando et al. | |
| 6,465,268 B2 | 10/2002 | Hirakata et al. | |
| 6,638,781 B1 | 10/2003 | Hirakata et al. | |
| 6,639,265 B2 * | 10/2003 | Arao et al. | 257/303 |
| 6,743,650 B2 | 6/2004 | Hirakata et al. | |
| 2001/0029070 A1 | 10/2001 | Yamazaki et al. | |
| 2002/0175376 A1 | 11/2002 | Ohtani et al. | |
| 2004/0207789 A1 | 10/2004 | Hirakata et al. | |
| 2004/0218112 A1 | 11/2004 | Hirakata et al. | |
| 2005/0110016 A1 * | 5/2005 | Yamazaki | 257/66 |

FOREIGN PATENT DOCUMENTS

| | | |
|---|---|---|
| EP | 1 005 094 A2 | 5/2000 |
| EP | 1 020 920 | 7/2000 |
| JP | 03-280018 | 12/1991 |
| JP | 04-219736 | 8/1992 |
| JP | 05-034718 | 2/1993 |
| JP | 06-013407 | 1/1994 |
| JP | 06-148685 | 5/1994 |
| JP | 06-260645 | 9/1994 |
| JP | 7-130652 | 5/1995 |
| JP | 07-235680 | 9/1995 |
| JP | 08-078329 | 3/1996 |
| JP | 08-274336 | 10/1996 |
| JP | 10-294280 | 11/1997 |
| JP | 09-312260 | 12/1997 |
| JP | 10-092576 | 4/1998 |
| JP | 10-153797 | 6/1998 |
| JP | 10-319440 | 12/1998 |
| JP | 10-325959 | 12/1998 |
| JP | 10-339889 | 12/1998 |
| JP | 11-015004 | 1/1999 |
| JP | 11-095194 | 4/1999 |
| JP | 11-191628 | 7/1999 |
| JP | 2000-183356 | 6/2000 |
| WO | WO90/13148 | 11/1990 |

OTHER PUBLICATIONS

U.S. Appl. No. 09/487,432, including specification and drawing, "Semiconductor Device and Process for Production Thereof," Shunpei Yamazaki, Jan. 19, 2000.

Preliminary Amendment submitted in U.S. Appl. No. 09/874,670 (now U.S. 2001/0029070) on Jul. 5, 2001.

U.S. Appl. No. 09/479,842, including specification, drawings, and filing receipt, "Semiconductor Device and Method of Fabricating the Same," Shunpei Yamazaki, et al., Jan. 10, 2000.

Ohtani et al., "LP-B: Late-News Poster: A 60-in. HDTV Rear-Projector with Continuous-Grain-Silicon Technology," May 17-22, 1998, pp. 467-470, SID 98 Digest, International Symposium Digest of Technical Papers, vol. XXIX.

Shimokawa et al., "Characterization of High-Efficiency Cast-Si Solar Cell Wafers by MBIC Measurement," Japanese Journal of Applied Physics, vol. 27, No. 5, May 1988, pp. 751-758.

U.S. Appl. No. 09/714,891, including specification, drawings, "Semiconductor Device with Tapered Gate and Insulating Film," Koji Ono, et al., Nov. 17, 2000.

U.S. Appl. No. 09/477,865, including specification, drawings, "Semiconductor Device and Manufacturing Method Thereof,".

* cited by examiner

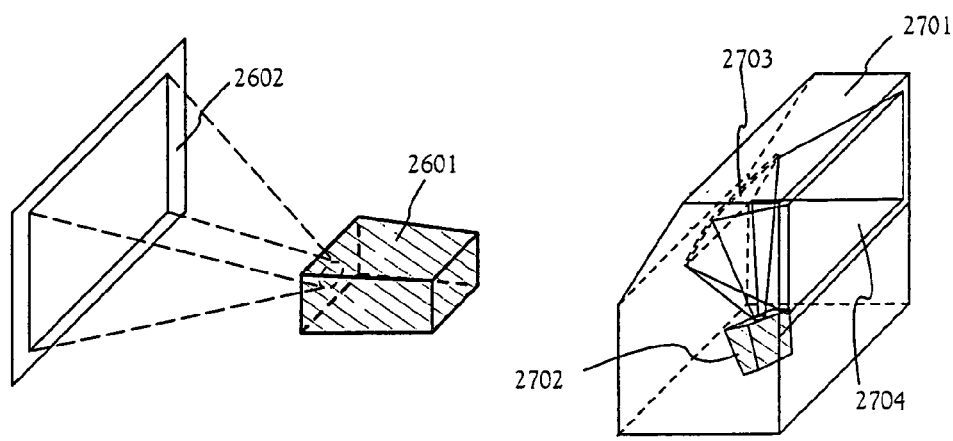
FIG. 27A
FIG. 27B
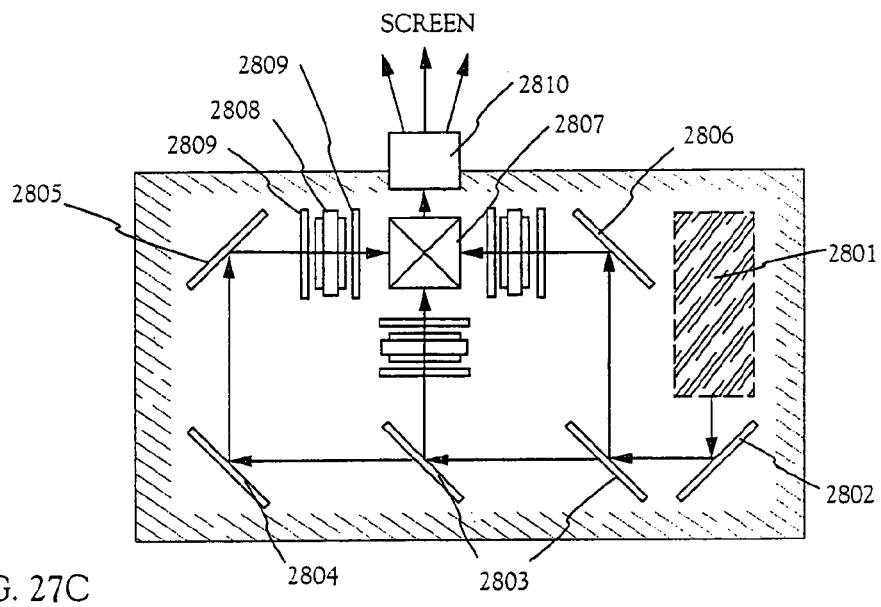
FIG. 27C
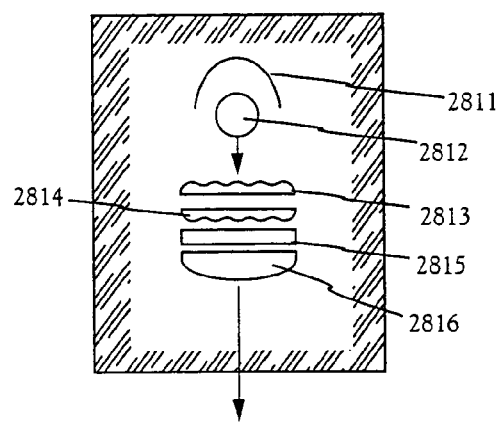
FIG. 27D

SECTIONAL VIEW OF SPACER

FIG. 37A-1
FIG. 37A-2
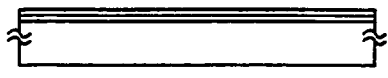
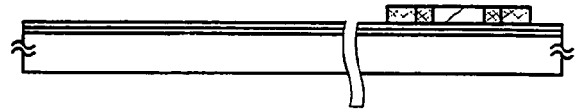
FIG. 37B-1
FIG. 37B-2
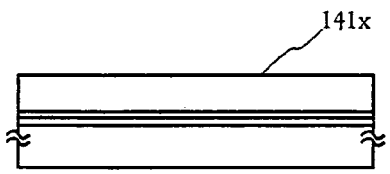
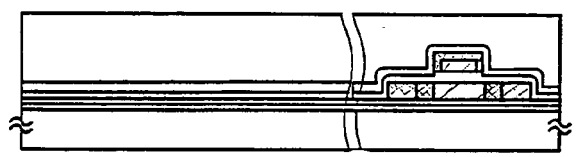
141x
FIG. 37C-1
FIG. 37C-2
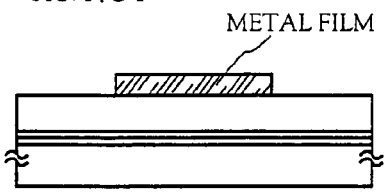
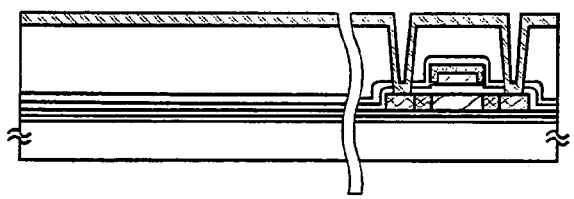
METAL FILM
FIG. 37D-1
FIG. 37D-2
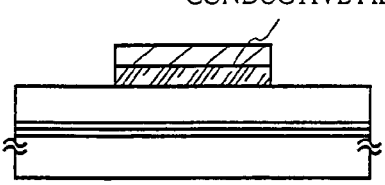
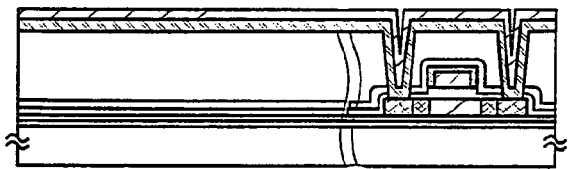
TRANSPARENT CONDUCTIVE FILM
FIG. 37E-1
FIG. 37E-2
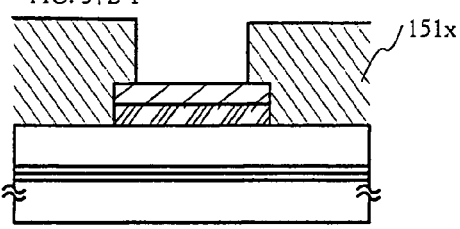
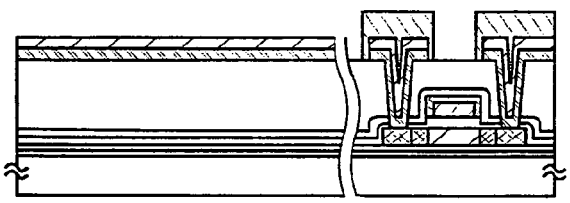
151x

SEMICONDUCTOR DEVICE AND METHOD OF MANUFACTURING THE SEMICONDUCTOR DEVICE

BACKGROUND OF THE INVENTION

1. Field of the Invention

The present invention relates to a semiconductor device having a circuit constituted of a thin-film transistor (hereinafter referred to as TFT) formed on a substrate having an insulating surface, and to a method of manufacturing the semiconductor device. Specifically, the present invention can be applied to electro-optical devices represented by liquid crystal displays having pixel portions and a driver circuit formed on the periphery of each pixel portion, the pixel portions and the driver circuits being formed on one substrate, and to electrical apparatuses incorporating such electro-optical devices. In this specification, "semiconductor device" denotes a category consisting of all devices capable of functioning semiconductor characteristics, including the above-mentioned electro-optical devices and electrical apparatuses incorporating electro-optical devices.

2. Description of the Related Art

The development of techniques for forming TFTs on a substrate having an insulating surface is being promoted. It is not possible for a TFT using a film of an amorphous semiconductor (typically, amorphous silicon) as an active layer to have a field effect mobility of 10 $cm^2$/Vsec or higher because of electrical and physical factors relating to the amorphous structure, etc. In active matrix liquid crystal displays, therefore, this kind of TFT cannot be used in a pixel portion to form a driver circuit for performing image display, although it can be used as a switching element (pixel TFT) for driving the liquid crystal in a pixel portion. Therefore, to form driver circuits, techniques for mounting driver ICs and the like, based on a tape automated bonding (TAB) or a chip-on-glass (COG) method are presently being used.

On the other hand, a TFT using a semiconductor film including a crystal structure (hereinafter referred to as a crystalline semiconductor) (typically, crystalline silicon film or polycrystalline silicon film) as an active layer can be used in combination with various functional circuits by being formed on one glass substrate together with such circuits, because it can have a high field effect mobility. That is, a shift register circuit, a level shifter circuit, a buffer circuit, a sampling circuit, etc., other than the TFT can be formed in a driver circuit.

An aluminum film having a low resistivity is frequently used as a wiring material with the above-described TFTs.

To realize an active matrix liquid crystal display having a large screen, aluminum (Al), copper (Cu), etc., have been used as wiring materials. This is because there is no suitable low-resistance material comparable to aluminum (Al) and copper (Cu) with respect to use for manufacture of a large-screen display device.

However, these materials are disadvantageously low in corrosion resistance and heat resistance. It is not always preferable to form a TFT gate electrode of one of these materials. Also, each of these materials cannot easily be introduced into a TFT manufacturing process. Conventional TFT manufacturing processes using aluminum as a wiring material have been such that a heat treatment forms hillocks, whiskers, and the like, or causes diffusion of aluminum atoms in a channel forming region, resulting in a TFT operation failure or a deterioration in TFT characteristics.

For this reason, trials have been made to use materials containing tantalum (Ta) or titanium (Ti) as a main constituent in place of aluminum (Al), copper (Cu) and other conventional wiring materials. This is because tantalum and titanium have high heat resistance, although they have a resistivity higher than that of aluminum.

TFTs having an active layer formed of a crystalline semiconductor layer are superior in TFT characteristics. However, a complicated process consisting of a lager number of steps is required for manufacturing of TFTs adapted to various circuits in addition to pixel TFTs. Needless to say, an increase in the number of process steps leads not only to an increase in the cost of manufacturing but also to a reduction in yield.

However, a TFT circuit in a pixel portion and a TFT circuit in a driver circuit do not always operate under the same conditions and, therefore, the characteristics which the TFTs in these circuits respectively need to have differ to some extent. For example, a pixel TFT formed as an n-channel TFT is driven as a switching element to apply a voltage to a liquid crystal. A liquid crystal is driven by an AC voltage and a system for performing frame-inversion drive is used as a liquid crystal drive system in many cases. In this system, a characteristic required of a pixel TFT to limit the power consumption is a sufficiently small off current value (a drain current when the TFT is off). On the other hand, a high drive voltage is applied to a buffer circuit or the like in a driver circuit, and it is necessary to increase the withstand voltage of a TFT in such a circuit to prevent breakdown when a high voltage is applied. Also, to improve the current drive capability, it is necessary to set a sufficiently large on current value (a drain current that flows when the TFT is on).

As a TFT structure devised to reduce the off current, a lightly doped drain (LDD) structure is known. In this structure, a region doped with an impurity element at a low concentration, which is called an LDD region, is provided between a channel forming region and a source region or a drain region formed by doping with an impurity element at a high concentration. A gate-drain overlapped LDD (GOLD) structure in which an LDD structure is provided in a state of overlapping a gate electrode with a gate insulating film interposed therebetween is also known as a means for preventing a reduction in the on current value due to hot carriers. It is known that this structure is effective in limiting hot carrier injection by reducing the high intensity of electric field in the vicinity of the drain and, hence, in avoiding degradation caused by hot carrier injection.

However, pixel TFTs and TFTs in a driver circuit, e.g., a shift register circuit, a buffer circuit, and the like are not always operated in the same biased state. For example, while a high reverse bias voltage (negative voltage in the case of an n-channel TFT) is applied to the gate of a pixel TFT, a TFT in a driver circuit is basically operated without being set in a reverse-biased state. The GOLD structure is advantageously effective in limiting the reduction in the on current value, but it may increase the off current value if the LDD region is only arranged to simply overlap the gate electrode. On the other hand, the ordinary LDD structure is advantageously effective in limiting the off current value but its effect of limiting degradation caused by hot carrier injection is low. These problems have become evident with the improvement in characteristics of crystalline silicon TFTs and with the increase in the required level of performance of active matrix liquid crystal displays. Consequently, to suitably operate TFTs by considering different operating conditions and to prevent the above-described hot carrier effect, it is necessary to optimize the concentration and distribution of an impurity in the LDD region and other factors.

SUMMARY OF THE INVENTION

In view of the above-described problems, an object of the present invention is to provide a semiconductor device, typically an active matrix display device formed by using TFTs in which a material having a low resistivity and high heat resistance is used as a wiring and electrode material in each of different circuits, and in which the structure of a TFT provided in each circuit is optimized according to the function of the circuit, whereby the operating characteristics and the reliability of the semiconductor device are improved, and the number of manufacturing process steps is reduced to reduce the manufacturing cost and to improve the yield.

To achieve the above-described object, according to the present invention, there is provided a semiconductor device comprising a pixel portion having a pixel TFT and a storage capacitor, the pixel TFT having a channel forming region, a source region, and a drain region, which are provided in a first region of a semiconductor layer, a gate insulating film in contact with the first region, and a gate electrode on the gate insulating film, the storage capacitor having a second region of the semiconductor layer, an insulating film in contact with the second region, and a capacitor wiring on the insulating film, characterized in that the second region contains an impurity element which imparts n-type or p-type conductivity, and the thickness of the insulating film in contact with the second region is thinner than the thickness of the gate insulating film in contact with the first region.

According to another aspect of the present invention, there is provided a semiconductor device comprising a pixel portion having a pixel TFT and a storage capacitor, the pixel TFT having a channel forming region, a source region, and a drain region, which are provided in a first region of a semiconductor layer, a gate insulating film in contact with the first region, and a gate electrode on the gate insulating film, the pixel TFT being an n-channel TFT, the storage capacitor having a second region of the semiconductor layer, an insulating film in contact with the second region, and a capacitor wiring on the insulating film, characterized in that the second region contains an impurity element which imparts one conductivity at a concentration in a concentration range of from $1 \times 10^{20}$ to $1 \times 10^{21}$ atoms/cm$^3$, and the thickness of the insulating film in contact with the second region is thinner than the thickness of the gate insulating film in contact with the first region.

According to still another aspect of the present invention, there is provided a semiconductor device comprising a pixel portion and a driver circuit formed over the same substrate, the driver circuit having a p-channel TFT and an n-channel TFT, the n-channel TFT having a channel forming region, a source region, a drain region, and an LDD region, which are provided in a semiconductor layer, a gate insulating film in contact with the semiconductor layer, and a gate electrode on the gate insulating film, characterized in that the gate electrode has a first conductive layer and a second conductive layer, and the second conductive layer overlaps the LDD region via the gate insulating film.

According to yet another aspect of the present invention, there is provided a semiconductor device comprising a pixel portion and a driver circuit formed over the same substrate, the pixel portion having a pixel TFT and a storage capacitor, the pixel TFT having a channel forming region, a source region, and a drain region, which are provided in a first region of a semiconductor layer, a gate insulating film in contact with the first region, and a gate electrode on the gate insulating film, the pixel TFT being an n-channel TFT, the storage capacitor having a second region of the semiconductor layer, an insulating film in contact with the second region, and a capacitor wiring on the insulating film, characterized in that the thickness of the insulating film in contact with the second region is thinner than the thickness of the gate insulating film in contact with the first region; the driver circuit has a p-channel TFT and an n-channel TFT; the n-channel TFT of the driver circuit has a semiconductor layer including a channel forming region, a source region, a drain region and an LDD region, a gate insulating film in contact with the semiconductor layer, and a gate electrode on the gate insulating film; the gate electrode has a first conductive layer and a second conductive layer; the second conductive layer is formed so as to overlap the LDD region via the gate insulating film; and the second conductive layer is formed of the same material as the capacitor wiring.

According to a further aspect of the present invention, there is provided a semiconductor device comprising a pixel portion and a driver circuit formed over the same substrate, the pixel portion having an n-channel TFT and a storage capacitor, the storage capacitor having a semiconductor layer, an insulating film in contact with the semiconductor layer and functioning as a dielectric for the storage capacitor, and a capacitor wiring formed on the insulating film, characterized in that the semiconductor layer contains an impurity element which imparts one conductivity at a concentration in the range of from $1 \times 10^{20}$ to $1 \times 10^{21}$ atoms/cm$^3$; the thickness of the insulating film in a region in which the n-channel TFT is not formed is thinner than the thickness of that in a region in which the n-channel TFT is formed; the driver circuit has a p-channel TFT and an n-channel TFT; each of the p-channel TFT and the n-channel TFT of the driver circuit has a semiconductor layer, a gate insulating film in contact with the semiconductor layer, and a gate electrode on the gate insulating film; and the gate electrode has a tapered portion.

According to still a further aspect of the present invention, there is provided a semiconductor device comprising a pixel portion and a driver circuit formed over the same substrate, the pixel portion having an n-channel TFT and a storage capacitor, the n-channel TFT of the pixel portion having a semiconductor layer including a channel forming region, an LDD region outside the channel forming region, and one of a source region and a drain region outside the LDD region, a gate insulating film in contact with the semiconductor layer, and a gate electrode on the gate insulating film, an insulating film being formed so as to continue to the gate insulating film, to be used as a dielectric for the storage capacitor, and to be reduced in thickness in comparison with other regions, the driver circuit having a p-channel TFT and an n-channel TFT, the n-channel TFT of the driver circuit having a semiconductor layer including a channel forming region, an LDD region outside the channel forming region, one of a source region and a drain region outside the LDD region, a gate insulating film in contact with the semiconductor layer, and a gate electrode on the gate insulating film, characterized in that each of the gate electrode of the n-channel TFT of the pixel portion and the gate electrode of the n-channel TFT of the driver circuit has a tapered portion and is formed so as to partially overlap the LDD region.

In the above-described semiconductor devices of the present invention, the capacitor wiring forming the storage capacitor and the second conductive layer may be formed of one element selected from the group consisting of aluminum (Al) and a copper (Cu), a compound containing at least one of these elements as a constituent, or a compound material formed of a combination of these elements.

In the above-described semiconductor devices of the present invention, the first conductive layer may be formed of one element selected from the group consisting of tungsten (W), a tantalum (Ta), titanium (Ti), and molybdenum (Mo), a compound containing as a component at least one of the above-described elements, a compound formed of a combination of above-described elements, a nitride containing at least one of the above-described elements as a component, and a silicide containing at least one of the above-described elements as a constituent.

BRIEF DESCRIPTION OF THE DRAWINGS

FIGS. 27A to 27D are diagrams showing examples of semiconductor devices of Embodiment 10;

FIGS. 37A-1 to 37E-1 and 37A-2 to 37E-2 are diagrams showing a process of manufacturing an input terminal portion of a liquid crystal display device of Embodiment 4.

DESCRIPTION OF THE PREFERRED EMBODIMENTS

Embodiment 1

An embodiment of the present invention will be described with reference to FIGS. 1A through 5B. The embodiment will be described with respect to details of steps of a process in which pixel TFTs in a pixel portion and TFTs in driver circuits provided on the periphery of the pixel portion are manufactured over one substrate.

Figure 1A:
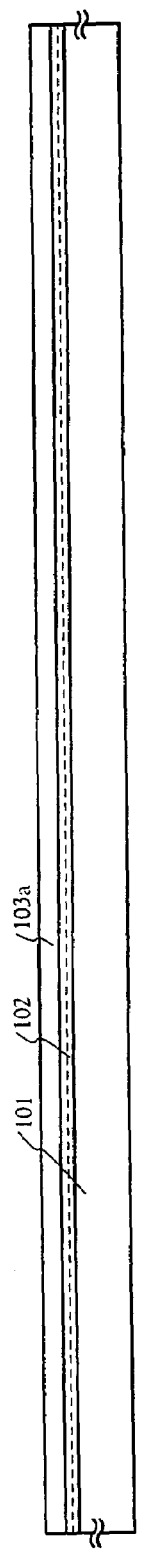
FIGS. 1A to 1D are cross-sectional views showing a process of manufacturing a pixel TFT, a storage capacitor, and TFTs in a driver circuit of Embodiment 1.

Referring to FIG. 1A, a low-alkali glass substrate or a quartz substrate is used as a substrate 101. In this embodiment, a low-alkali glass substrate is used. The glass substrate may be heat-treated in advance at a temperature lower than the glass strain point by 10 to 20° C. On the surface of the substrate 101 on which TFTs are to be formed, a base film 102, which is a silicon oxide film, a silicon nitride film or a silicon nitride oxide film, is formed for the purpose of preventing impurity diffusion from the substrate 101. For example, a silicon nitride oxide film made from $SiH_4$, $NH_3$, and $N_2O$ is deposited by plasma chemical vapor deposition (plasma CVD) to form a layer having a thickness of 100 nm, and another silicon nitride oxide film made from $SiH_4$ and $N_2O$ is then deposited by plasma CVD to form a layer having a thickness of 200 nm.

Next, a semiconductor film 103a of an amorphous structure having a thickness of 20 to 150 nm (preferably, 30 to 80 nm) is formed by a well-known method such as plasma CVD or sputtering. In this embodiment, an amorphous silicon film having a thickness of 55 nm is formed by plasma CVD. The semiconductor film of an amorphous structure comprises an amorphous semiconductor film and a microcrystalline semiconductor film. A chemical compound semiconductor film of an amorphous structure, such as an amorphous silicon germanium film, may also be used. The base film 102 and the amorphous silicon film 103a may be successively formed without intermission since they can be formed by the same film forming method. Not exposing atmosphere after the formation of the base film can be avoided to prevent contamination of the surface, thereby reducing variations in the characteristics and variation in the threshold voltage of TFTs manufactured. (FIG. 1A).

From the amorphous silicon film 103a, a crystalline silicon film 103b is formed by using a well-known crystallization technique. For example, laser annealing, thermal annealing (solid-phase growth), or rapid thermal annealing (RTA) may be used to form the crystalline silicon film 103b. Further, the laser annealing or the RTA can be combined with the thermal annealing. If the above-described glass substrate or a plastic substrate inferior in heat resistance is used, it is preferable to use laser annealing in particular. In RTA, an infrared lamp, a halogen lamp, a metal halide lamp, a xenon lamp, or the like may be used as a light source.

Figure 1B:
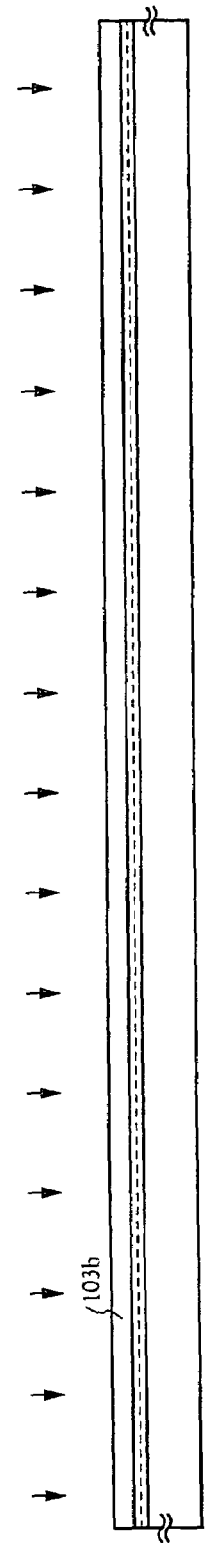

In this embodiment, crystalline silicon film 103b is formed by crystallization using a catalytic element in accordance with a technique disclosed in Japanese Patent Application Laid-open No. Hei 7-130652. If a crystallization process using laser is performed, it is desirable that a heat treatment at 400 to 500° C. for about one hour should be performed before a crystallization step to reduce the hydrogen content to 5 atomic % or less before crystallization. When the amorphous silicon film is crystallized, reconfiguration of atoms occurs and the amorphous silicon film becomes denser. For this reason, the thickness of the crystalline silicon film manufactured is reduced by about 1 to 15% from that of the original amorphous silicon film (55 nm in this embodiment). (FIG. 1B)

Figure 1C:
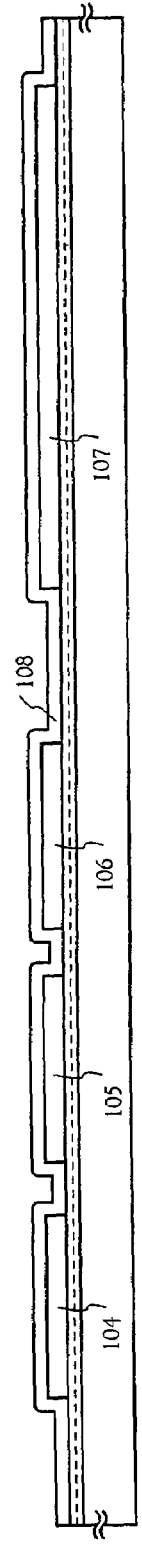

The crystalline silicon film 103b is then divided into island-like portions to form island-like semiconductor layers 104 to 107. The island-like semiconductor layer 107 has a first region which is to form active layers of pixel TFTs afterward, and a second region which is to form a lower electrode of a storage capacitor afterward. Thereafter, a mask layer 108 formed of a silicon oxide film having a thickness of 50 to 100 nm is formed by plasma CVD or sputtering. (FIG. 1C)

A resist mask 109 is then formed and, for the purpose of threshold voltage control, boron (B) provided as an impurity element for imparting p-type conductivity is added to the material forming the entire surfaces of the island-like semiconductor layers 105 to 107 for forming n-channel TFTs so that its concentration in the material is about $1 \times 10^{16}$ to $5 \times 10^{17}$ atoms/$cm^3$ (atoms/$cm^3$ is a unit representing the number of atoms in 1 $cm^3$). Boron (B) may be added by ion doping or may be added to silicon when the amorphous silicon film is formed. This addition of boron (B) is not always necessary. However, the forming of semiconductor layers 110 to 112, to the material of which boron (B) is added, is favorable for setting the threshold voltages of n-channel TFTs within predetermined ranges. (FIG. 1D)

Figure 1D:
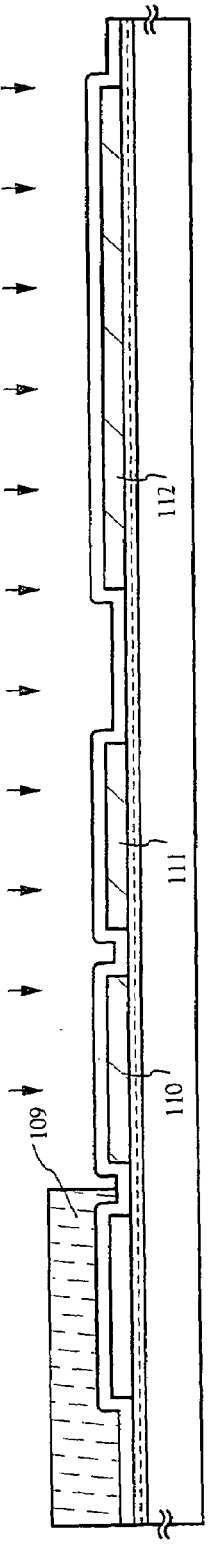

The mask layer 108 is then removed by using fluoric acid or the like and a step of activating the impurity element added in the step shown in FIG. 1D is performed. Activation may be performed by a heat treatment at 500 to 600° C. for 1 to 4 hours in a nitrogen atmosphere or laser activation. Such a heat treatment and laser activation may be performed in combination. In this embodiment, laser activation is performed by using a linear beam of KrF excimer laser light (wavelength: 248 nm) and by scanning the entire surface of the substrate with the linear beam at an oscillation frequency of 5 to 50 Hz, at an energy concentration of 100 to 500 mJ/$cm^2$ and at a linear beam overlapping ratio of 80 to 98%, thereby processing the entire surface of the substrate in which the island-like semiconductor layers are formed. There are no restriction on setting of laser irradiation conditions, which may be determined according to the operator's need.

Figure 2A:
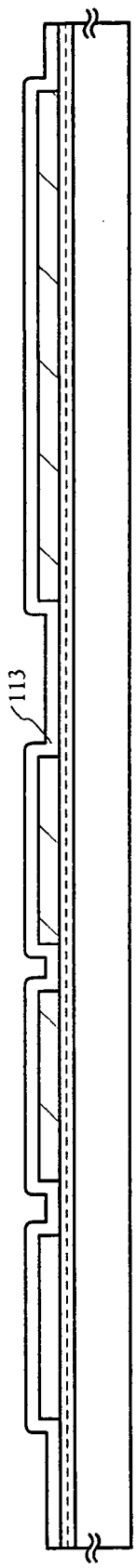
FIGS. 2A to 2C are cross-sectional views showing a process of manufacturing a pixel TFT, a storage capacitor, and TFTs in a driver circuit of Embodiment 1.

An insulating film containing silicon and having a thickness of 10 to 150 nm is then formed as gate insulating film 113 by plasma CVD or sputtering. For example, a silicon nitride oxide film having a thickness of 120 nm is formed. The gate insulating film may be a single-layer or lamination structure of other insulating films containing silicon. (FIG. 2A)

Next, a conductive layer 114 for forming gate electrodes is formed. This conductive layer 114 may be formed as a single layer or may be formed as a lamination structure, such as a two- or three-layer structure, if necessary. As an alternative material for the conductive layer 114, tungsten silicide, titanium silicide, or molybdenum silicide may be used. For example, a tungsten (W) layer is formed and a specific resistance value of 20 μΩcm or less is realized therein by limiting the oxygen concentration to 30 ppm or less.

Figure 2B:
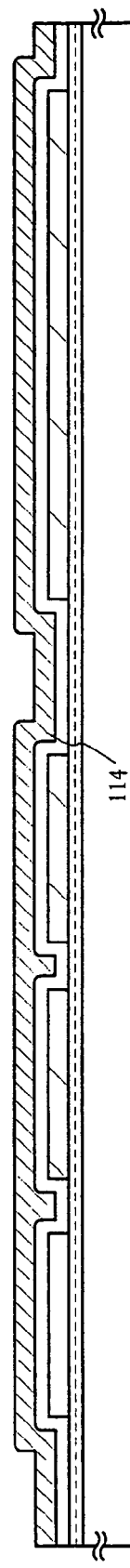

The thickness of conductive layer 114 may be set to 200 to 400 nm (preferably, 250 to 350 nm). In this embodiment, a tungsten layer having a thickness of 350 nm is formed as conductive layer 114 by sputtering. When such a film is formed by sputtering a suitable amount of Xe or Kr may be added to a sputtering Ar gas to reduce internal stress in the formed film for the purpose of preventing the film from being peeled off. Forming a silicon film doped with phosphorus (P) and having a thickness of about 2 to 20 nm as a layer on which the conductive layer 114 is formed is effective in achieving improved adhesion of the conductive layer, in preventing oxidization of the conductive film 114, and preventing alkali metal elements contained as minute contents in the conductive film from being diffused in the gate insulating film 113. (FIG. 2B)

Figure 2C:
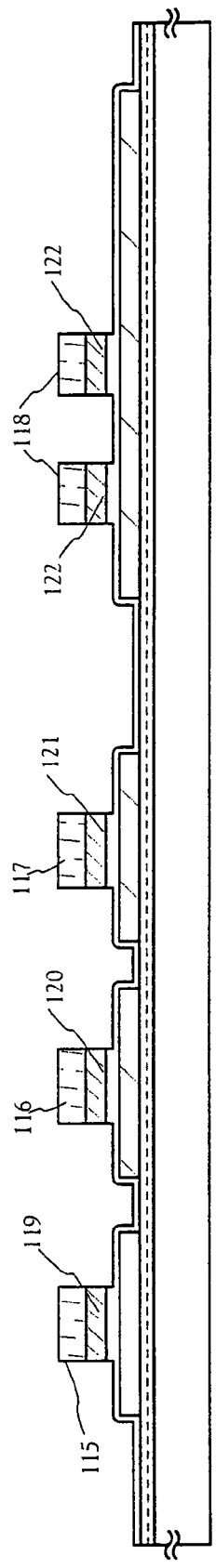

Resist masks 115 to 118 are then formed, the conductive layer is dry-etched to form gate electrodes 119 to 122. (FIG. 2C)

In this step of etching the conductive layer, the regions where no gate electrode is formed (the exposed portions of the silicon nitride oxide film continuously formed as gate insulating film 113) are simultaneously etched by 20 to 50 nm to be reduced in film thickness. According to the present invention, this silicon nitride oxide film reduced in thickness is used as a dielectric for storage capacitors to obtain a larger capacitance without increasing the storage capacitor area.

Figure 3A:
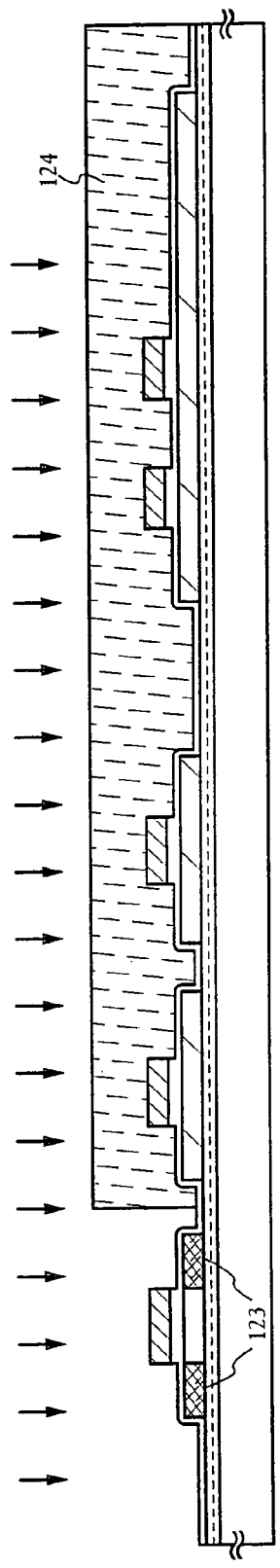
FIGS. 3A to 3C are cross-sectional views showing a process of manufacturing a pixel TFT, a storage capacitor, and TFTs in a driver circuit of Embodiment 1.

Next, a step of adding an impurity element for imparting p-type conductivity is performed to form a source region and a drain region for a p-channel TFT in a driver circuit. In this step, impurity regions are formed in a self-aligning manner with gate electrode 119 used as a mask. When this step is performed, the region in which n-channel TFTs are to be formed is covered with a resist mask 124. Impurity regions 123 are formed by ion doping with diborane ($B_2H_6$). The concentration of boron (B) in these regions is set to $3\times10^{20}$ to $3\times10^{21}$ atoms/cm$^3$. In this specification, the concentration of the impurity element for imparting p-type conductivity, contained in the formed impurity regions 123, is expressed as (p+). (FIG. 3A)

While in this embodiment the entire surface of the semiconductor layer 112 is covered with resist mask 124, the step of adding an impurity element for imparting p-type conductivity may be performed without forming a resist mask on regions where capacitor wiring is to be provided.

Next, impurity regions each capable of functioning as a source or drain region in an n-channel TFT are formed. Resist masks 125 to 128 are formed and an impurity element for imparting n-type conductivity is added to form impurity regions 129 to 132. This addition is performed by ion doping with phosphine ($PH_3$), and the concentration of phosphorus (P) in these regions is set to $1\times10^{20}$ to $1\times10^{21}$ atoms/cm$^3$. In this specification, the concentration of the impurity element for imparting n-type conductivity, contained in the formed impurity regions 129 to 132, is expressed as (n+). In the semiconductor layer for forming an active layer for a first n-channel TFT afterward, a region where the impurity is not doped is formed only between a channel forming region and a drain region by doping with the mask 126. The TFT constitutes a logic circuit capable of high-speed operation, which is considered important, in an active matrix liquid crystal display. Examples of the logic circuit includes a shift register circuit, a frequency divider circuit, a signal divider circuit, a level shifter circuit, a buffer circuit, and the like. A structure in which resistance components are minimized and which uses means for protection against hot carriers, to which means importance is attached, can be realized by forming an impurity region on only one side of a channel forming region (drain region side).

Figure 3B:
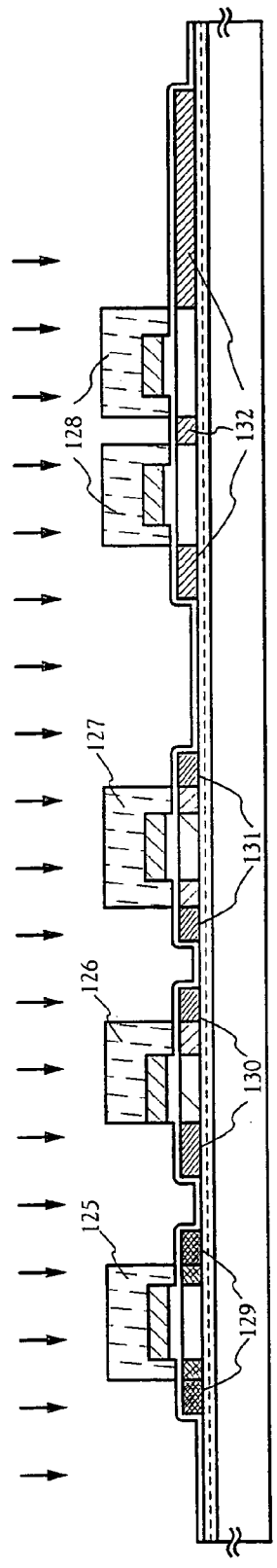

Since no mask is formed above the semiconductor layer (second region) which is to form a lower electrode of a storage capacitor afterward, the impurity element is added to the material of the semiconductor layer (second region). In this manner, the conductivity of the lower electrode can be increased (FIG. 3B).

The impurity regions 129 to 132 contain phosphorus (P) or boron (B), which is added in the preceding step. However, phosphorus (P) added in this step is of a sufficiently high concentration in comparison with the concentration of phosphorus (P) or boron (B) added in the preceding step. Therefore, it is not necessary to consider the influence of phosphorus (P) or boron (B) added in the preceding step. The concentration of phosphorus (P) added to the impurity region 129 is ½ to ⅓ of the concentration of boron (B) added in the step shown in FIG. 3A, so that suitable p-type conductivity is maintained and there is no considerable influence upon TFT characteristics.

Figure 3C:
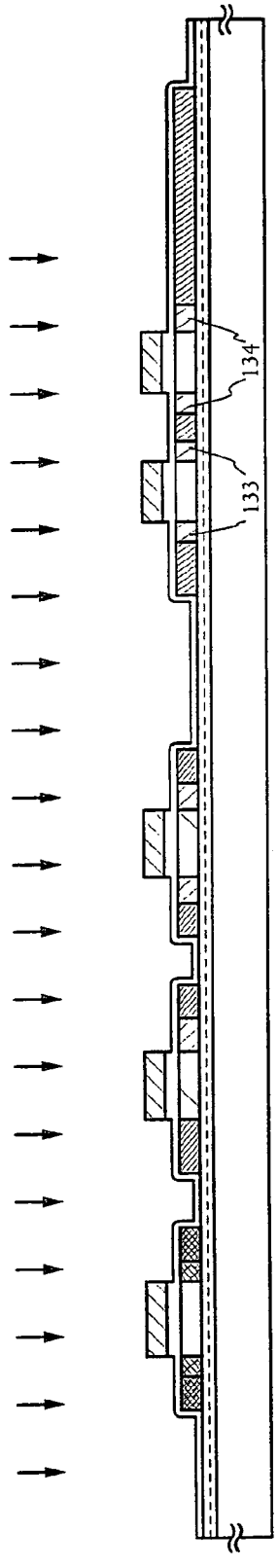

A step of adding an impurity for imparting n-type conductivity is then performed to form an LDD region for each pixel TFT. In this step, impurity elements for imparting n-type conductivity are added by ion doping in a self-aligning manner with gate electrode 22 used as a mask. The concentration of phosphorus (P) added is $1\times10^{16}$ to $5\times10^{18}$ atoms/cm$^3$, lower than the densities of the impurities added in the steps shown in FIGS. 3A and 3B. Thus, substantial impurity regions 133 and 134 are formed. In this specification, the concentration of the impurity for imparting n-type conductivity, contained in the impurity regions 133 and 134, is expressed as (n−). (FIG. 3C)

Thereafter, a heat treatment step is performed to activate each of the added impurity elements at the desired densities and to impart n-type or p-type conductivity. As heat treatment of this step, furnace annealing, laser annealing, rapid thermal annealing (RTA), or the combination thereof may be performed. In this embodiment, furnace annealing is performed in this activation step. The heat treatment is performed at a temperature of 400 to 800° C., typically 500 to 600° C. in a nitrogen atmosphere in which the oxygen concentration is 1 ppm or lower, preferably 0.1 ppm or lower. In this embodiment, the heat treatment is performed at 550° C. for 4 hours. If the substrate 101 is a quartz substrate or the like having high heat resistance, the heat treatment may be performed at 800° C. for 1 hour. The impurity elements are suitably activated and the junction between the impurity regions to which the impurity elements are added and the channel forming regions are suitably formed.

During this heat treatment, conductive layers 119b to 122b are formed in the metal film forming the gate electrodes 119 to 122 to have a thickness of 5 to 80 nm from the surface. For example, if the conductive layers 119 to 112 are formed of tungsten (W), tungsten nitride (WN) is formed. If the conductive layers 119 to 122 are formed of tantalum (Ta), tantalum nitride (TaN) is formed. The conductive layers 119b to 122b can also be formed by exposing the gate electrodes 119 to 122 to a plasma atmosphere prepared by using nitrogen or ammonia-containing nitrogen. Further, as a step of hydrogenating the island-like semiconductor layers, a heat treatment is performed at 300 to 450° C. for 1 to 12 hours in an atmosphere containing 3 to 100% of hydrogen. This is a step of terminating the dangling bonds of the semiconductor layer by thermally excited hydrogen. Another hydrogenation means based on plasma hydrogenation (using hydrogen excited by plasma) may alternatively be performed.

Figure 4A:
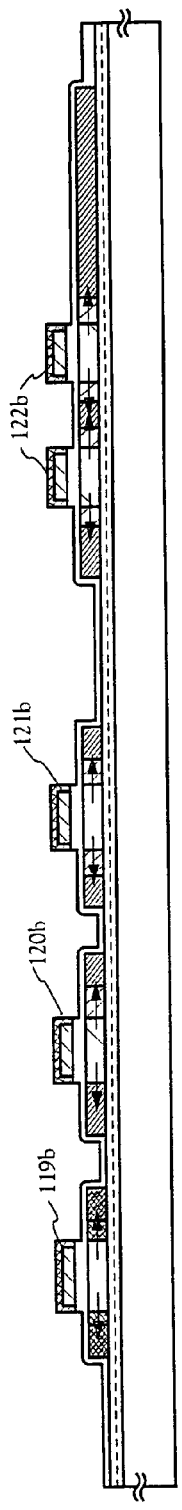
FIGS. 4A to 4D are cross-sectional views showing a process of manufacturing a pixel TFT, a storage capacitor, and TFTs in a driver circuit of Embodiment 1.

When the island-like semiconductor layers are made by a method of crystallization from the amorphous silicon film using a catalytic element, a minute amount of the catalytic element remained in the island-like semiconductor layers. Needless to say, TFTs can be completed even in such a state. However, removing the residual catalytic element at least from the channel forming regions is preferred. As one of possible means for removing the catalytic element, a means utilizing the gettering effect of phosphorus (P) is used. The concentration of phosphorus (P) necessary for gettering is substantially the same as that in the impurity regions ($n^+$) formed in the step shown in FIG. 3B. During the above-described heat treatment in the activation step, the catalytic element is removed from the channel forming regions for the n-channel and p-channel TFTs by gettering. (FIG. 4A)

Figure 6A:
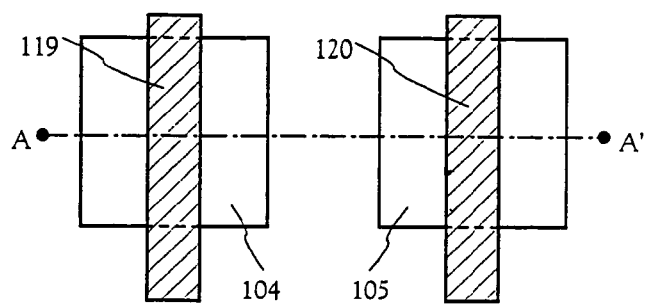
FIGS. 6A to 6C are top views showing a process of manufacturing a pixel TFT, a storage capacitor, and TFTs in a driver circuit.
Figure 7A:
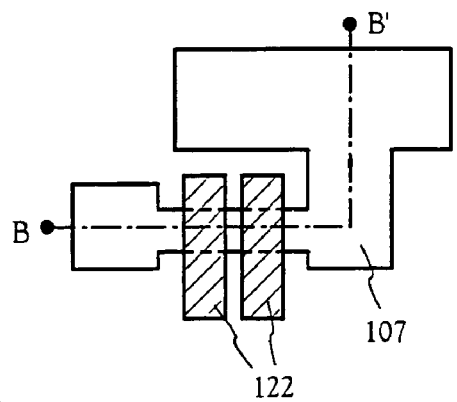
FIGS. 7A to 7C are top views showing a process of manufacturing a pixel TFT, a storage capacitor, and TFTs in a driver circuit of Embodiment 1.

FIGS. 6A and 7A are top views of the TFT structure formed by the preceding steps. Cross sections taken along the line A-A' and the line B–B' in FIGS. 6A and 7A correspond to the portions A–A' and B–B' of FIG. 3D. The island-like semiconductor layers 104 to 107 and the gate electrodes 119 to 122 are formed by the preceding steps at least as shown in the top views of FIGS. 6A and 7A, in which the gate insulating film is omitted.

Figure 4B:
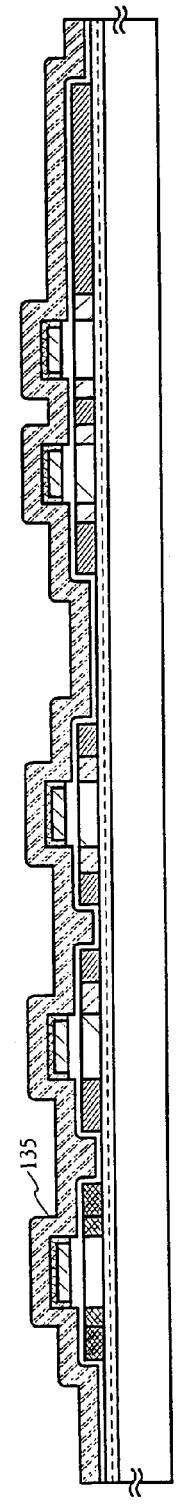
Figure 4C:
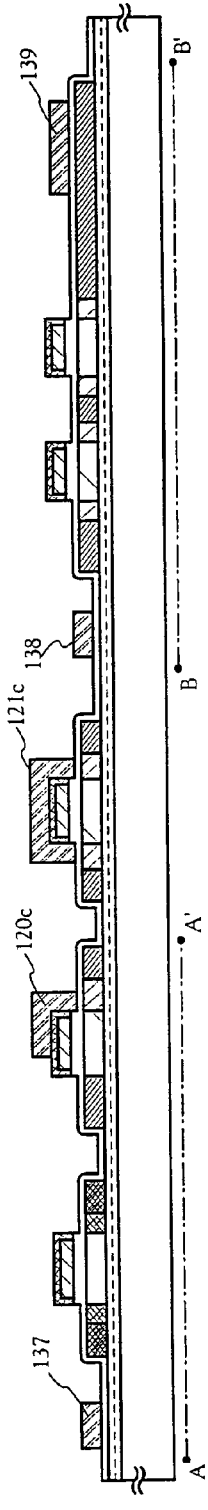
Figure 4D:
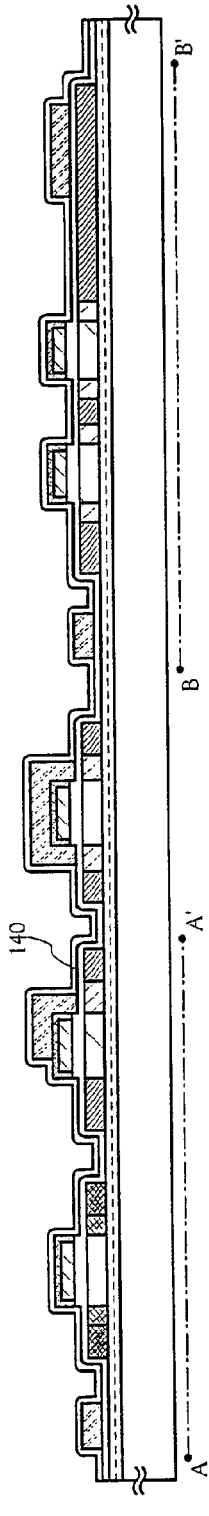

After the completion of the activation and hydrogenation step, a film having aluminum as a main constituent is formed for forming capacitor wiring in a pixel portion. To form this film, a material containing a low-resistance material, such as aluminum (Al) or copper (Cu), as a main constituent may be used. In this embodiment, an aluminum (Al) film 135 containing 0.1 to 2 wt % of titanium (Ti) is formed and gate wiring 137 and 138 and a capacitor wiring 139 used as a storage capacitor upper electrode are formed by patterning of the aluminum film 135. (FIGS. 4B and 4C)

Figure 6B:
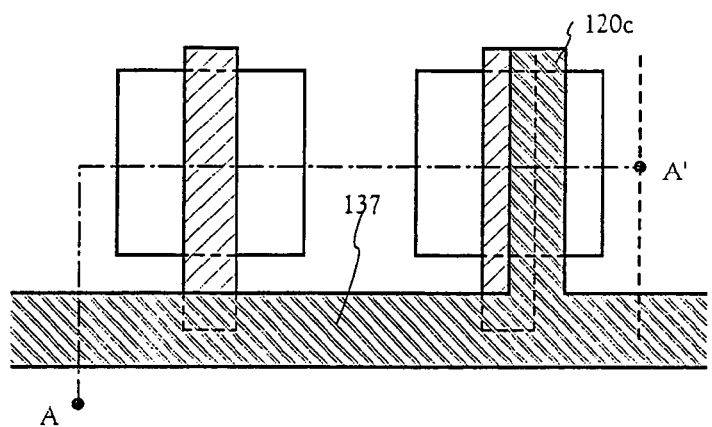
Figure 7B:
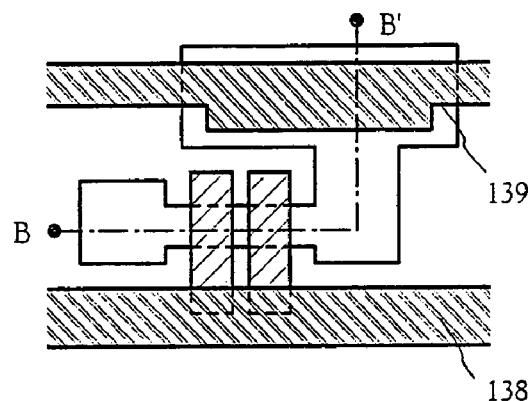

FIGS. 6B and 7B are top views of this state. Cross sections taken along the line A–A' and the line B–B' in FIGS. 6B and 7B correspond to the portions A–A' and B-B' of FIG. 4B. Referring to FIGS. 6B and 7B, a part of the gate wiring 137 and 138 overlap the gate electrodes 119, 120, and 122 and are in electrical contact with the same as shown in a region 120.

Next, a protective insulating film 140 is formed. The protective insulating film 140 may be formed of a silicon oxide film, a silicon nitride oxide film, a silicon nitride film or a lamination film consisting of a combination of these films. The material of the protective insulating film 140 is selected from inorganic insulating materials. The thickness of protective insulating film 140 is set to 100 to 200 nm. In this embodiment, a silicon oxide film is formed as protective insulating film 140 by plasma CVD using a mixture of tetraethyl orthosilicate (TEOS) and $O_2$, setting the reaction pressure to 10 Pa and the substrate temperature to 300 to 400° C., and causing discharge at a radio frequency (13.56 MHz) and at a power concentration of 0.5 to 0.8 W/cm$^2$.

Thereafter, for leveling, an interlayer insulating film 141 formed of an organic insulating material and having an average thickness of 1.0 to 2.0 µm is formed. As this organic insulating material, an organic resin material, such as polyimide, acrylic, polyamide, polyimide-amide, or benzocyclobutene, may be used. If a type of polyimide to be heat-polymerized after being applied to the substrate is used, raw materials in a two-liquid system may be used to form interlayer insulating film 141 in such a manner that a mixture of the main ingredient and the curing agent is prepared and applied to the entire substrate surface by a spinner, is preheated at 80° C. for 60 seconds by a hot plate, and further is baked at 250° C. for 60 minutes in a clean oven.

Apart from that for leveling, an interlayer insulating film is generally formed by using an organic resin material having a low dielectric constant, because parasitic capacitance can be reduced thereby. However, such a material has hygroscopicity and is not suitable for use as a protective film. Therefore, if such a material is used, it is necessary that the material be used in combination with a silicon oxide film, such as that formed as protective insulating film 140 in this embodiment.

After the formation of the interlayer insulating film 141, a resist mask having a predetermined pattern is formed and contact holes are formed so as to reach the source and drain regions in the form of island-like semiconductor layers.

In this step, a gas prepared by mixing $CF_4$, $O_2$, and He is used as etching gas to first etch the interlayer insulating film 141 made of organic resin material. The gate insulating film is then etched by changing the etching gas to $CHF_3$ in order to increase the selection ratio to the island-like semiconductor layers, thus suitably forming contact holes.

For forming source and drain wiring in this embodiment, a titanium (Ti) film having a thickness of 50 to 150 nm is formed and an aluminum (Al) film having a thickness of 300 to 400 nm is formed over the titanium film. Alternatively, a lamination film consisting of Ti/TiN/Al may be formed.

As a pixel electrode, a transparent conductive film is formed by, for example, sputtering or vacuum deposition using indium oxide ($In_2O_3$), an indium oxide-tin oxide alloy ($In_2O_3$—$SnO_2$; ITO). To etch such a material, a solution containing hydrochloric acid as a main constituent is used. Etching of ITO, however, is particularly apt to produce a residue. To improve etching workability, an indium oxide-zinc oxide alloy ($In_2O_3$—ZnO) may be used. A film of indium oxide-zinc oxide alloy has excellent surface smoothness and also has thermal stability higher than that of ITO and is therefore effective in preventing corrosion reaction with Al in the contact with the end surface of the drain wiring. Similarly, zinc oxide (ZnO) is also a suitable material. Further, zinc oxide with gallium (Ga) added (ZnO:Ga) or the like may be used for the purpose of improving the transmittance with respect to visible light and the conductivity. In this embodiment, film of an indium oxide-zinc oxide alloy is formed as a transparent conductive film to form a pixel electrode 156.

Figure 5A:
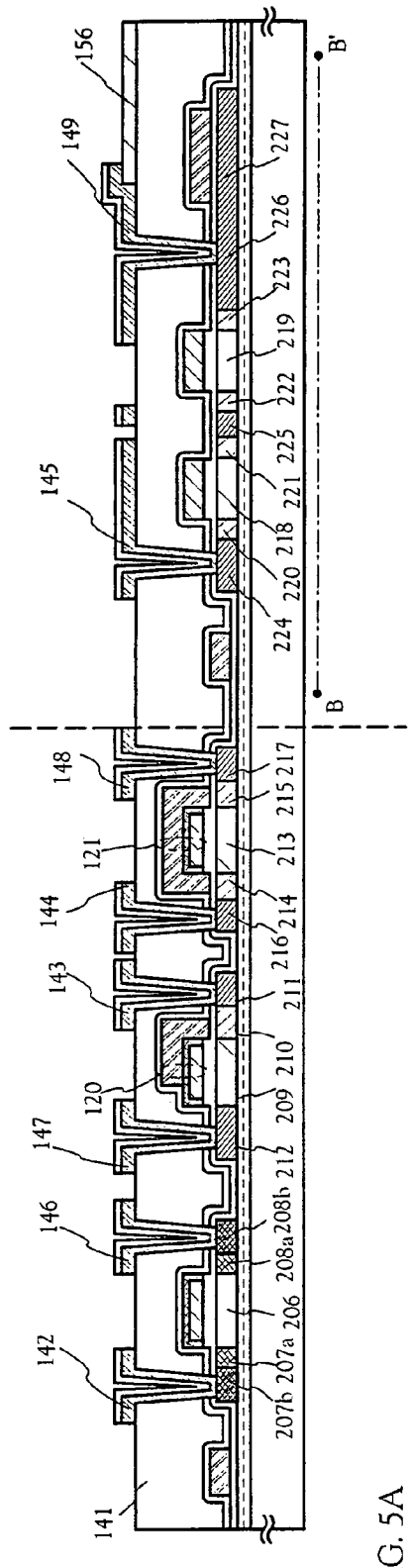
FIGS. 5A and 5B are cross-sectional views showing a process of manufacturing a pixel TFT, a storage capacitor, and TFTs in a driver circuit of Embodiment 1.

A resist mask pattern is formed with a photomask, and source wirings 142, 144, 145 and 147 and drain wirings 143, 146, 148 and 149 are formed by etching. (FIG. 5A)

Figure 6C:
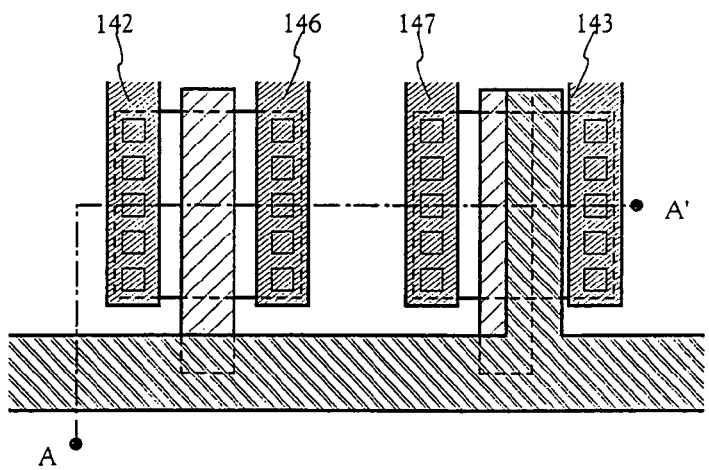
Figure 7C:
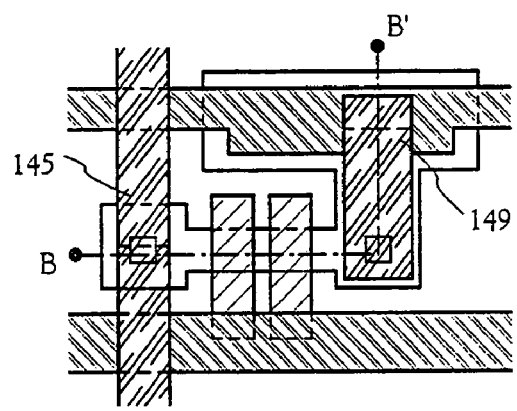

FIGS. 6C and 7C are top views of this state. Cross sections taken along the line A–A' and the line B–B' in FIGS. 6C and 7C correspond to the portions A–A' and B–B' of FIG. 5A. Referring to FIGS. 6C and 7C, in which the first interlayer insulating film is omitted, the source wirings 142, 145 and 147, and the drain wirings 143, 146 and 149 are connected to the source and drain regions (not shown) in the island-like semiconductor layers 104, 105, and 107 via the contact holes formed in the interlayer insulating film.

Thus, a substrate, on which TFTs in driver circuits and TFTs in a pixel portion are formed is completed. That is, a p-channel TFT 201, a first n-channel TFT 202, and a second n-channel TFT 203 are formed in the driver circuit 250, a pixel TFT 204 and a storage capacitor 205 are formed in the pixel portion 251. In this specification, for convenience' sake, a substrate with circuit components formed in the above-described manner will be referred to as "active matrix substrate".

The p-channel TFT 201 in the driver circuit has, in the island-like semiconductor layer 104, a channel forming region 206, source regions 207a and 207b, and drain regions 208a and 208b. The first n-channel TFT 202 has, in the island-like semiconductor layer 105, a channel forming region 209, an LDD region 210 overlapping the gate electrode 129 (similar LDD regions hereinafter referred to as "Lov region", "ov" denoting "over"), a source region 212, and a drain region 211. The length of this Lov region in the direction of channel length is 0.5 to 3.0 µm, preferably 1.0 to 1.5 µm. The second n-channel TFT 203 has, in the island-like semiconductor layer 106, a channel forming region 213, LDD regions 214 and 215, a source region 216, and a drain region 217. These LDD regions are a Lov region and an LDD region which does not overlap the gate electrode 121 (similar LDD regions are hereinafter referred to as "Loff region", "off" denoting "offset"). The length of this Loff region in the direction of channel length is 0.3 to 2.0 µm, preferably 0.5 to 1.5 µm. The pixel TFT 204 has, in the island-like semiconductor layer 107, channel forming regions 218 and 219, Loff regions 220 to 223, and source or drain regions 224 to 226. The length of the Loff regions in the direction of the channel length is 0.5 to 3.0 µm, preferably 1.5 to 2.5 µm. Further, the storage capacitor 205 is formed by an upper electrode (capacitor wiring) 139, a dielectric (an insulating film formed of the same material as the gate insulating film), and a lower electrode (a semiconductor layer which is connected to the drain region 226 of the pixel TFT 204, and to the material of which an impurity element for imparting n-type conductivity is added) 227. While the structure of the pixel TFT 204 shown in FIG. 5A is a double-gate structure, it may alternatively be a single-gate structure or a multi-gate structure having a plurality of gate electrodes.

Figure 5B:
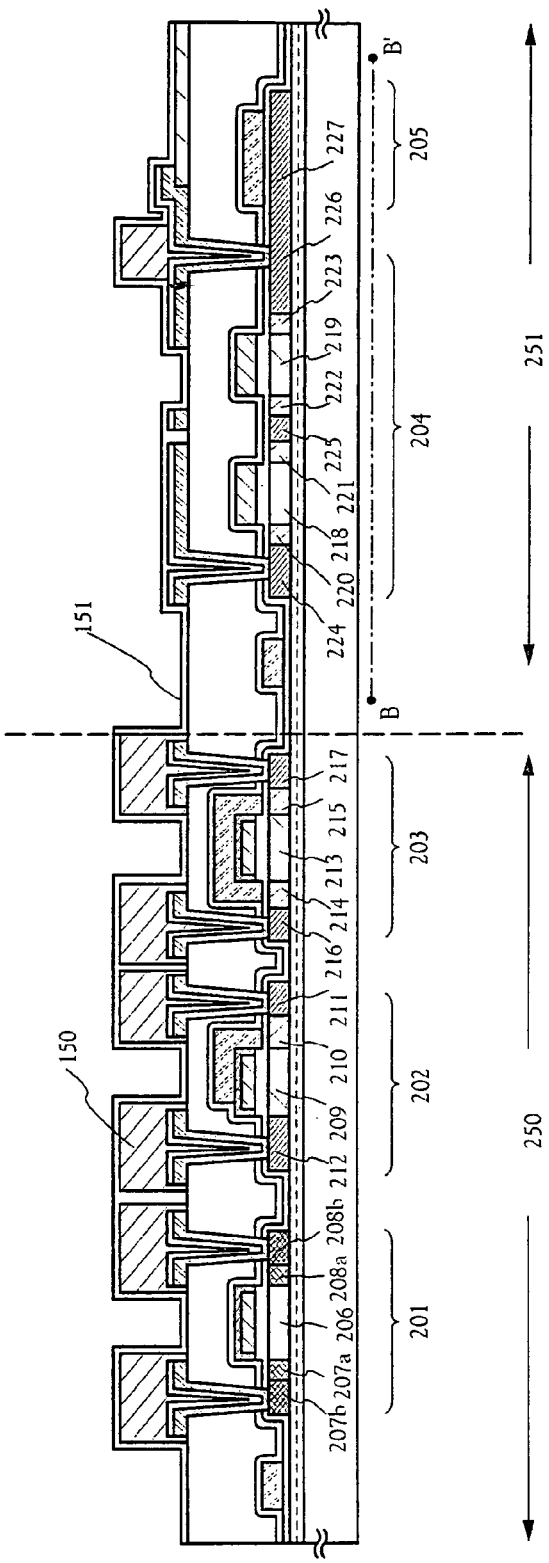
Figure 36:
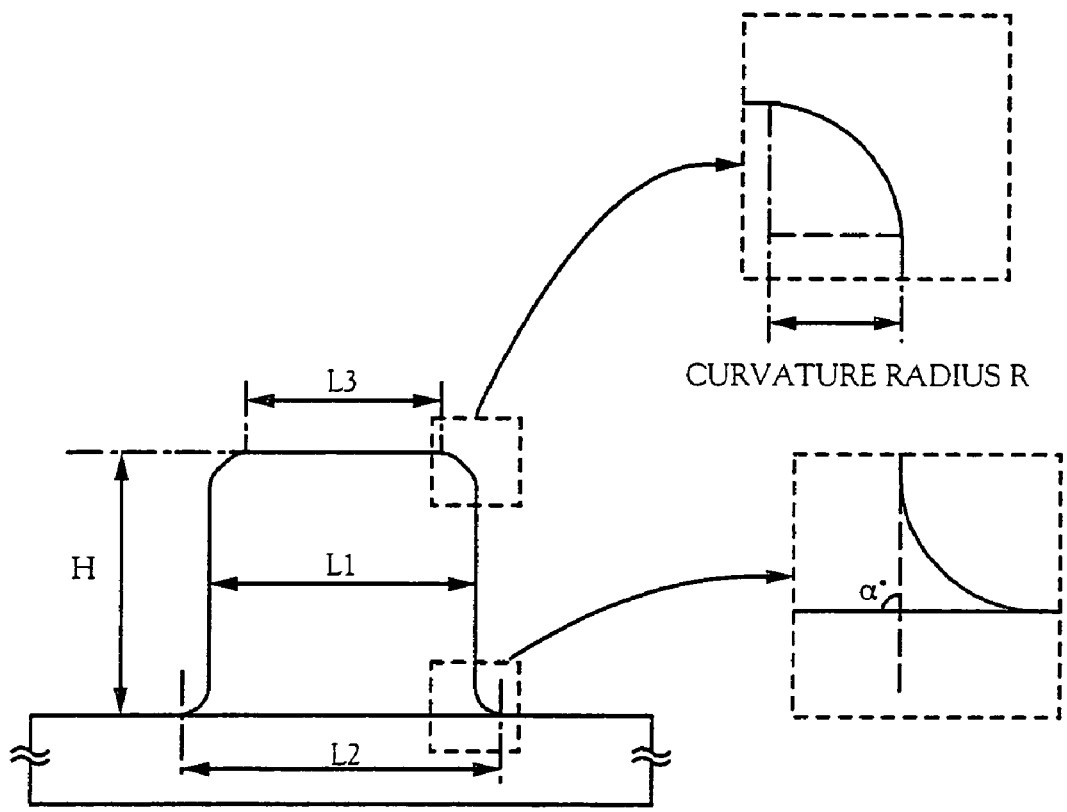
FIG. 36 is a diagram showing the shape of a columnar spacer of Embodiment 1.

Further, columnar spacers 150 are formed as shown in FIG. 5B. In this embodiment, the columnar spacers 150 are formed in such a manner that NN700, a product from JSR Corporation is applied by a spinner and the material is by exposure and development processing with a predetermined pattern. (Preferably, each columnar spacer 150 is formed into the shape of a column having a flat top, as shown in FIG. 36, thereby ensuring a sufficient mechanical strength of a liquid crystal panel formed by combining the active matrix substrate with an opposed substrate. The shape of the columnar spacers 150 is not limited to a particular shape; the columnar spacers 150 may have the shape of a cone, pyramid, or the like. For example, if the columnar spacers 150 have a conical shape, the height H is set to 1.2 to 5 μm, the average diameter L1 is set to 5 to 7 μm, and the ratio of the average diameter L1 to the diameter L2 of the bottom is set to 1:1.5. In this case, the tapering angle of the side surface is set to ±15° or less.) Further, the material is hardened by being heated at 150 to 200° C. in a clean oven or the like.

The placement of the spacers may be freely determined. In the pixel portion, however, it is preferred that a columnar spacer 150 be formed above the contact portion of the drain wiring 149 so as to cover the contact portion. This is because the flatness of the contact portion is reduced to such an extent that liquid crystal molecules cannot be suitably aligned at this portion. The columnar spacer 150 is formed so that the contact portion is filled with the spacer resin, thereby preventing disclination or the like.

As shown in FIG. 5B, a protective film 151 for protection of the side surfaces of the columnar spacers 150 during the manufacturing process is formed.

Thereafter, an orientation film (not shown) is formed on the surface of the active matrix substrate, and rubbing is performed on the orientation film to align liquid crystal molecules with a certain pretilt angle. The width of a non-rubbed area in the rubbing direction from the end portion of the columnar spacer 150 provided in the pixel portion is set to 2 m or less. Ordinarily, when this kind of rubbing processing is performed, generation of static electricity becomes a problem. However, spacers 150 formed above the TFTs in the driver circuit have an effect of protecting the TFTs from static electricity as well as the original spacing function.

Thus, the active matrix substrate on which columnar spacers 150 for maintaining the desired substrate spacing are formed integrally with the substrate 101 is completed.

On the opposed substrate mated with the active matrix substrate, a light-shielding film 230, color filters (not shown), a transparent conductive film 231 and an orientation film 232 are formed. The light-shielding film 230 is formed of Ti, Cr, Al, or the like and has a thickness of 150 to 300 nm.

The active matrix substrate on which the pixel portion and the driver circuits are formed and the opposed substrate are attached to each other. Thereafter, a liquid crystal material 234 is injected into the space between the substrates and is kept therein by complete sealing with a sealing material (not shown) to complete a liquid crystal panel.

According to the present invention, as described above, the insulating film forming a storage capacitor in each storage capacitor region is reduced in thickness in comparison with that of other regions, and an impurity is added to the semiconductor layer so that its concentration in the semiconductor layer is high. Therefore, a storage capacitor having a large capacitance for its area can be formed. While the conventional art has the problem of the aperture ratio being reduced if the capacitance of the storage capacitor is increased, the present invention makes it possible to form a storage capacitor having a large capacitance while maintaining a high aperture ratio. Also, since the second conductive layer that shields the LDD regions is not formed in the step of activating impurities, the LDD can be sufficiently activated.

The TFT structure for forming each of the circuits can be optimized according to the specifications required with respect to the pixel TFT and the driver circuits, thereby improving the operating performance and reliability of the semiconductor device. Further, the gate electrode is formed of a conductive material having substantially high heat resistance, thereby facilitating activation of the LDD region or the source and drain regions. Also, the gate wiring is formed of a low-resistance material to effectively reduce the wiring resistance. Thus, the semiconductor device of the present invention can be applied to a display device whose pixel portion (screen size) is in the 4-inch or higher class.

Embodiment 2

Figure 15A:
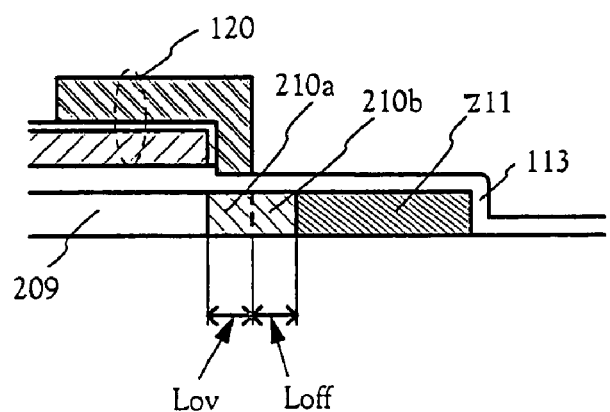
FIGS. 15A to 15C are diagrams showing the positional relationship between a gate electrode and an LDD region of Embodiment 2.
Figure 15B:
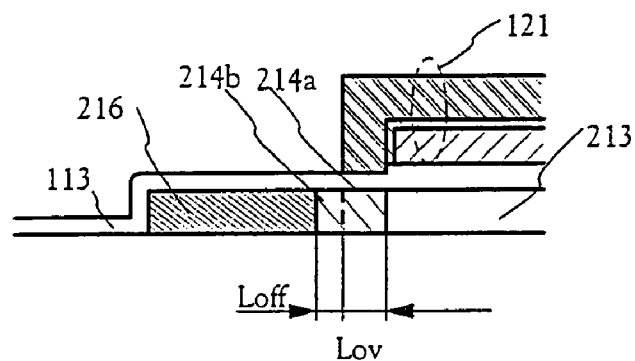
Figure 15C:
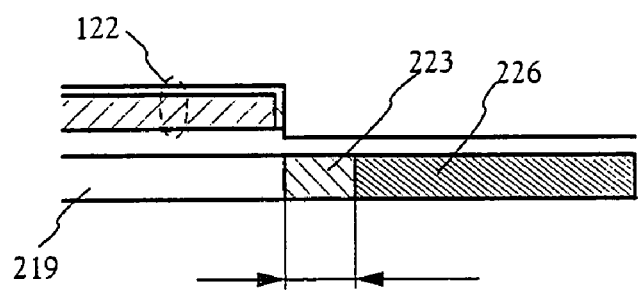

FIGS. 15A to 15C are illustrations of the structure of a TFT according to the invention, showing the positional relationship between the gate electrode and LDD region in a TFT having a semiconductor layer channel-forming region, an LDD region, a gate insulating film on the semiconductor layer and a gate electrode on the gate insulating film.

The first n-channel type TFT is explained in FIG. 15A. The construction thereof is provided with a semiconductor layer having a channel-forming region 209, LDD regions 210a, 210b and drain region 211, and a gate insulating film 113 and gate electrode 120 formed thereover. The LDD region is a one-sided structure which is only provided at between the channel-forming region and the drain region. The LDD region 210a is an Lov provided overlapping the gate electrode 120 via the gate insulating film 113. The Lov has the function of attenuating the high electric field generated near the drain while preventing deterioration by hot carriers, and it can be suitably used in a controlling circuit comprising a shift register circuit, a level shifter circuit, a buffer circuit or the like.

Figure 11:
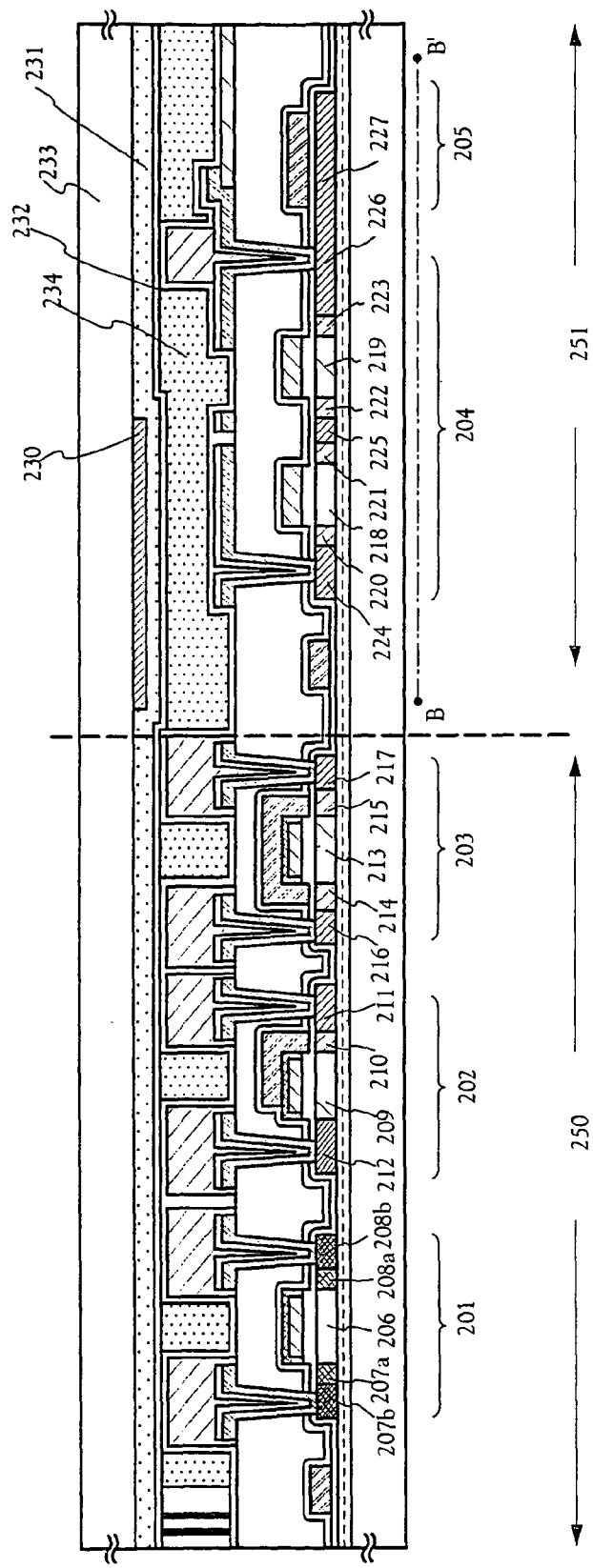
FIG. 11 is a cross-sectional view of the structure of a liquid crystal display device of Embodiment 1.

The second n-channel type TFT is explained in FIG. 15B. In FIG. 15B, because the second n-channel TFT is symmetrical, right and left are revered compared with FIG. 11. The construction thereof is provided with a semiconductor layer having a channel-forming region 213, LDD regions 214a, 214b and a drain region (source region) 216, and a gate insulating film 113 and gate electrode 121 formed on the semiconductor layer. The LDD region 214a is provided overlapping the gate electrode 121 via the gate insulating film 120. Also, the LDD region 214b is an $L_{off}$ provided without overlapping the gate electrode 121. The $L_{off}$ has the function of reducing the off-current value, and the structure provided with the $L_{ov}$ and $L_{off}$ can prevent deterioration by hot carriers while also reducing the off-current value, so that it may be suitably used in an n-channel TFT of the sampling circuit of a controlling circuit.

The pixel TFT is explained in FIG. 15C. The semiconductor layer is provided with a channel-forming region 219, an LDD region 223 and a drain region 226. The LDD region 223 is an $L_{off}$ provided without overlapping the gate electrode 122, and it can effectively reduce the off-current value and is therefore suitable for use in a pixel TFT.

Embodiment 3

The structure of this active matrix-type liquid crystal display device will now be explained with reference to the perspective view in FIG. 12 and the top view in FIG. 13. The same numerals are used in FIGS. 12 and 13 for correspondence with the cross-sectional structural diagrams of FIGS. 1 to 5 and FIG. 11. The cross-sectional structure along B–B' in FIG. 13 corresponds to the cross-sectional diagram of the pixel portion shown in FIG. 5.

Figure 12:
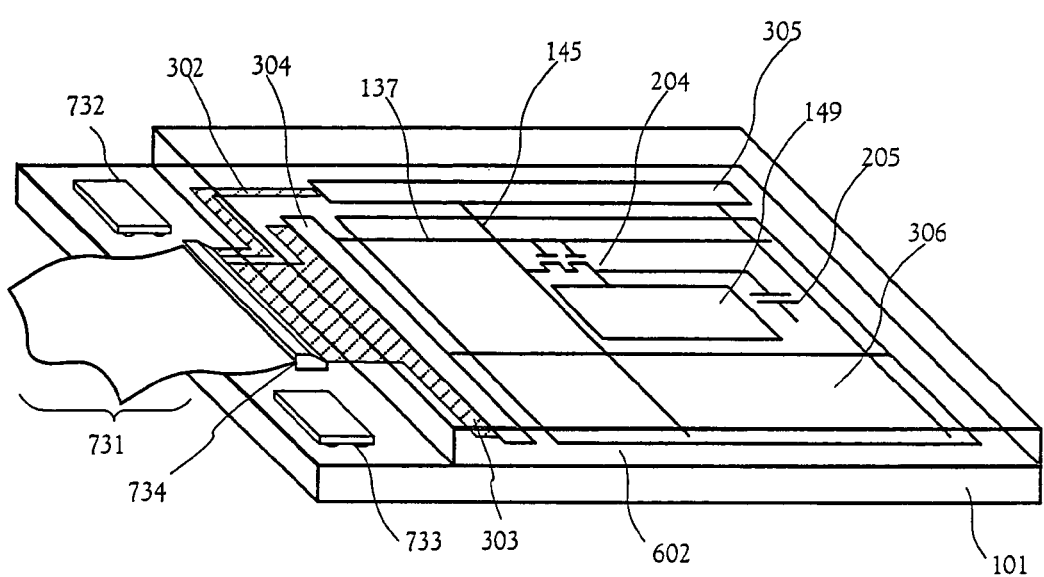
FIG. 12 is an oblique view of the structure of a liquid crystal display device of Embodiment 3.

In FIG. 12, the active matrix substrate is constructed of a pixel portion 306, a scanning signal driver circuit 304 and an image signal driver circuit 305 formed on a glass substrate 101. A pixel TFT 204 is provided in the pixel portion, and the driver circuit provided around it is constructed based on a CMOS circuit. The scanning signal driver circuit 304 and the image signal driver circuit 305 are each connected to the pixel TFT 204 with a gate wiring 137 and source wiring 145, respectively. Also, an FPC 731 is connected to an external input terminal 734 and is connected to each driver circuit with input wirings 302, 303.

Figure 13:
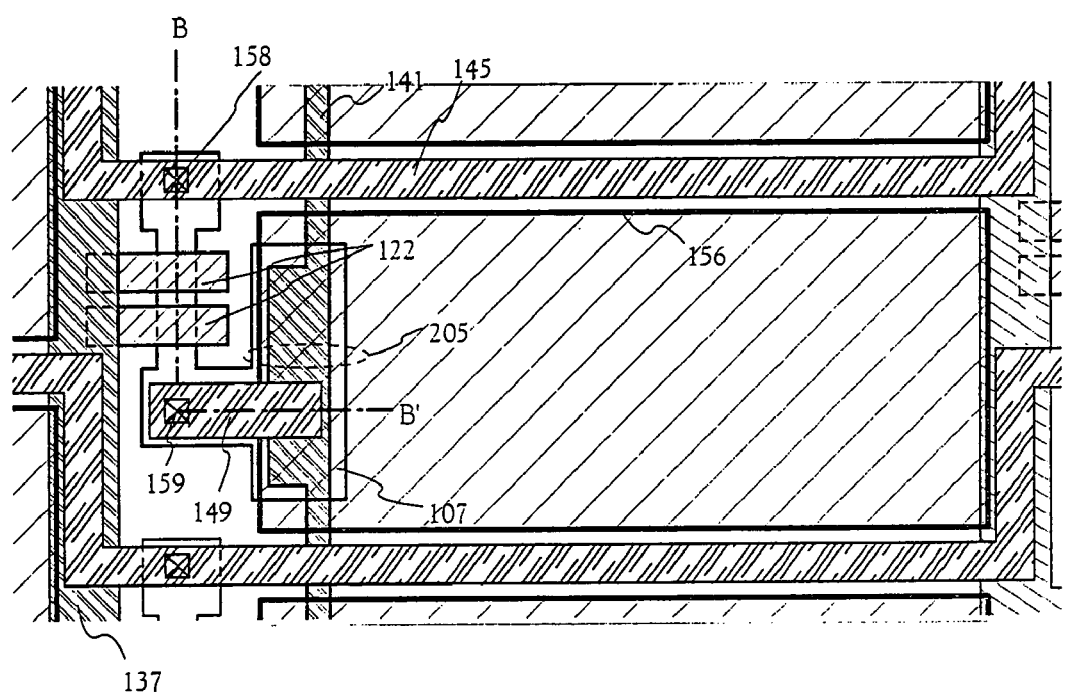
FIG. 13 is a top view of a pixel portion of Embodiment 3.

FIG. 13 is a top view showing about one pixel portion of the display region 306. Also not shown on the semiconductor layer are a source region, drain region and an $L_{off}$ region as an n⁻ region. A numeral 158 shows a contact portion of the source wiring 145 and the source region 224, a numeral 159 shows a contact portion of the drain region 226 and the drain wiring 149. A storage capacitor 205 is formed by the second region of the semiconductor layer 227 extending from the drain region 226 of the pixel TFT 204 as a bottom electrode overlapping with the capacitor wirings 139 as an upper electrode via a gate electrode film.

Embodiment 4

Figure 10:
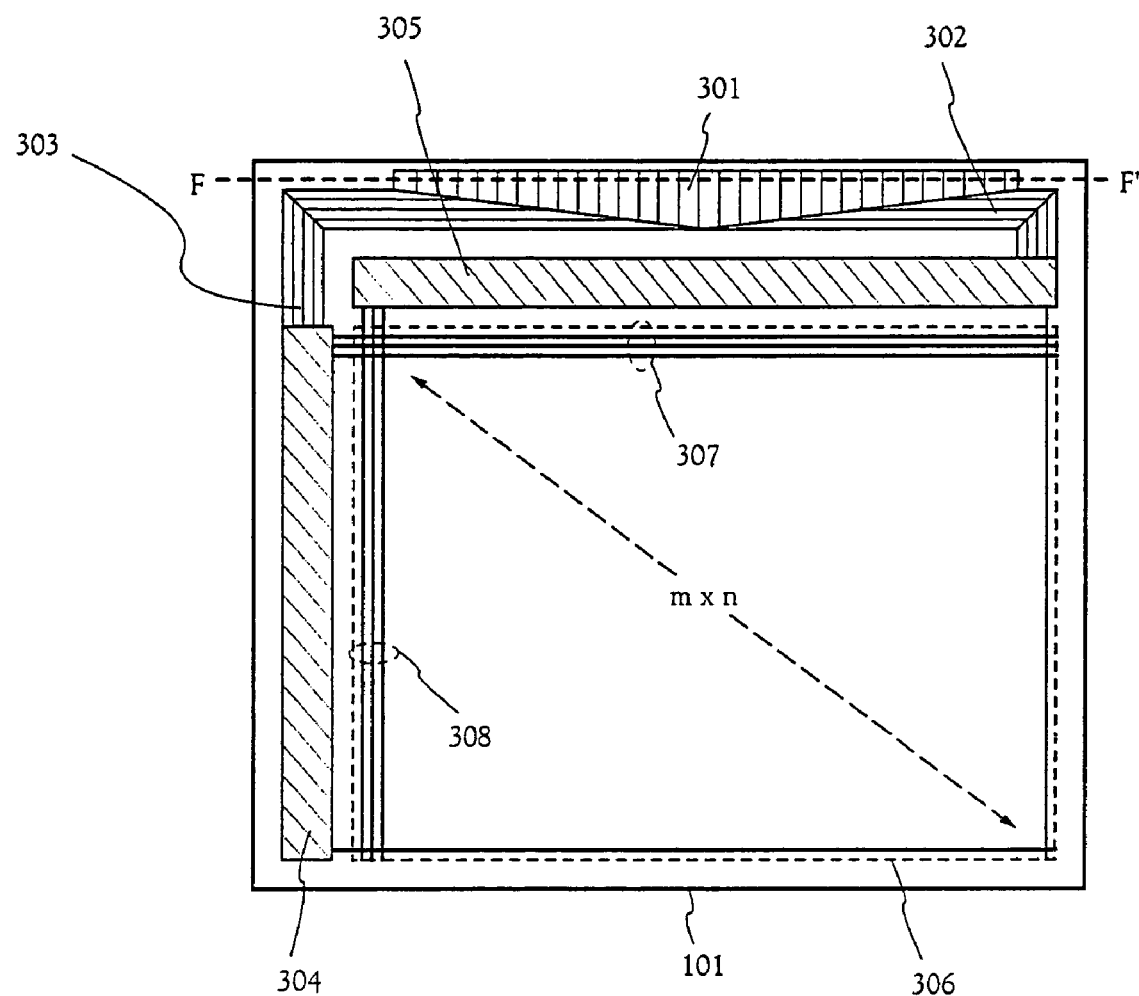
FIG. 10 is a top view showing a layout of an input/output terminal and circuits of a liquid crystal display device of Embodiment 4.

FIG. 10 shows an example of a layout of input and output terminals, a pixel portion, and driver circuits in a liquid crystal display unit. In the pixel portion 306, n gate wirings and n source wirings are formed so as to intersect each other so that the points of intersection form a matrix. For example, if the pixel concentration is set in conformity with the Video Graphics Array (VGA), 480 gate wirings and 640 source wirings are formed. If the pixel concentration is set in conformity with the Extended Graphics Array (XGA), 768 gate wirings and 1024 source wirings are formed. The screen size of the pixel portion is 340 mm in length along a diagonal line in the case of the 13-inch class, and is 460 mm in the case of the 18-inch class. To realize this liquid crystal display device, it is necessary to form gate wirings from a low-resistance material such as that described above with respect to Embodiment 1 or Embodiment 2.

A scanning signal driver circuit 304 and an image signal driver circuit 305 are provided on the periphery of the pixel portion 306. The lengths of gate wirings in these driver circuits are necessarily increased if the screen size of the pixel portion is increased. To realize a large screen, therefore, it is also preferable to form the gate wirings from a low-resistance material such as that described above with respect to Embodiment 1 or Embodiment 2.

According to the present invention, input wirings 302 and 303 for connection between the input terminal 301 to each of the driver circuits can be formed of the same material, which contributes to the effect of reducing the wiring resistance.

Figures 1, 19A:
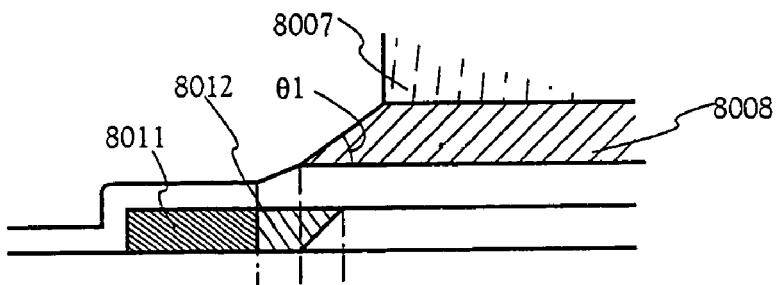
FIGS. 19A-1, 19A-2, 19B-1, and 19B-2 are diagrams showing a concentration distribution of an impurity element in an LDD region of Embodiment 6.
Figures 2, 19A:
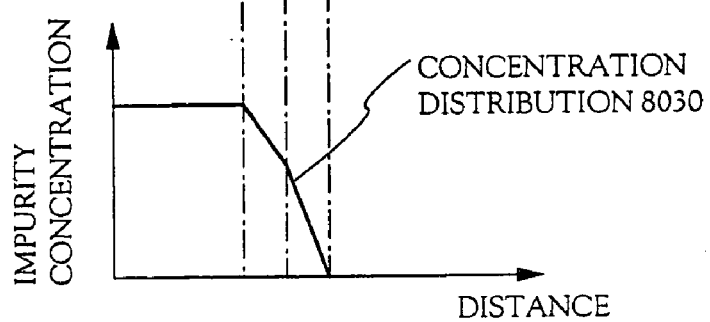

FIGS. 37A-1 through 37E-1 show steps of forming the input terminal portion. The cross sections of FIGS. 37A-1 to 37E-1 correspond to the cross section of the input terminal portion 301 taken along the line of F–F' in FIG. 10. The steps of this process are shown to be related to the steps of the process of Embodiment 1 by being indicated by corresponding reference characters. Note, FIGS. 37A-2 through 37E-2 show corresponding steps forming the pixel portion.

First, in the step of forming the interlayer insulating film 141 in the driver circuit portion and the pixel section on the substrate on which the base film has been formed, an interlayer insulating film 141x is formed by using an organic resin material, such as polyimide, acrylic, polyamide, polyimide-amide, or benzocyclobutene (BCB). (FIG. 37B)

Next, metal films for forming source and drain wirings, i.e., titanium (Ti) film having a thickness of 50 to 150 nm, and aluminum (Al) film having a thickness of 300 to 400 nm, are successively formed. On the aluminum film, a transparent conductive film of indium oxide ($In_2O_3$), indium oxide-tin oxide alloy ($In_2O_3$—$SnO_2$; ITO) or the like is formed by, for example, sputtering or vacuum deposition. (FIGS. 37C, 37D)

When columnar spacers 150 are formed after the films have been etched to form source and drain wirings and pixel electrode in the predetermined shapes, a spacer 150x is formed to hold the metal film and the transparent conductive film in order to prevent the films from being peeled off. It is also possible to increase the mechanical strength of the substrate by forming the spacer 150x. (FIG. 37E)

After the active matrix substrate on which the pixel portion and the driver circuits are formed and the opposed substrate have been attached to each other, connection wirings and a flexible printed circuit (FPC) 191 are electrically connected by using an anisotropic conductive film 195 at the terminal portion to connect the circuit on the active matrix substrate to a circuit for inputting an image signal, a power source for supplying power to the circuits on the substrate, etc. (FIG. 20)

Figure 20:
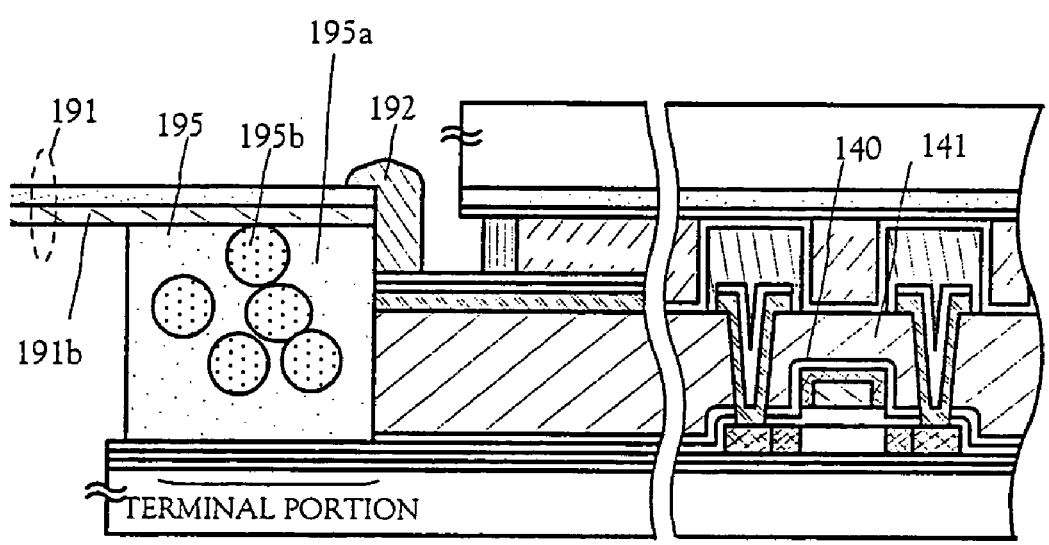
FIG. 20 is a cross-sectional view of a structure for contact between a connection wiring terminal portion and an anisotropic conductive film of Embodiment 4.

As shown in FIG. 20, the anisotropic conductive film 195 is constituted by particles 195b having a diameter of several ten to several hundred microns, plated with gold or chromium and bound together by an adhesive 195a. The particles 195b are brought into contact with the connection wirings and into contact with wirings 191b of the FPC 191, thereby establishing electrical connections between the active matrix substrate 100 and the FPC 191. To improve the strength of bonding between the substrate 101 and the FPC 191 extending outward from the outer terminal portion, a resin layer 192 is provided at the end portion of the FPC 191. The mechanical strength of the connection portion is thereby improved.

Embodiment 5

Figure 14:
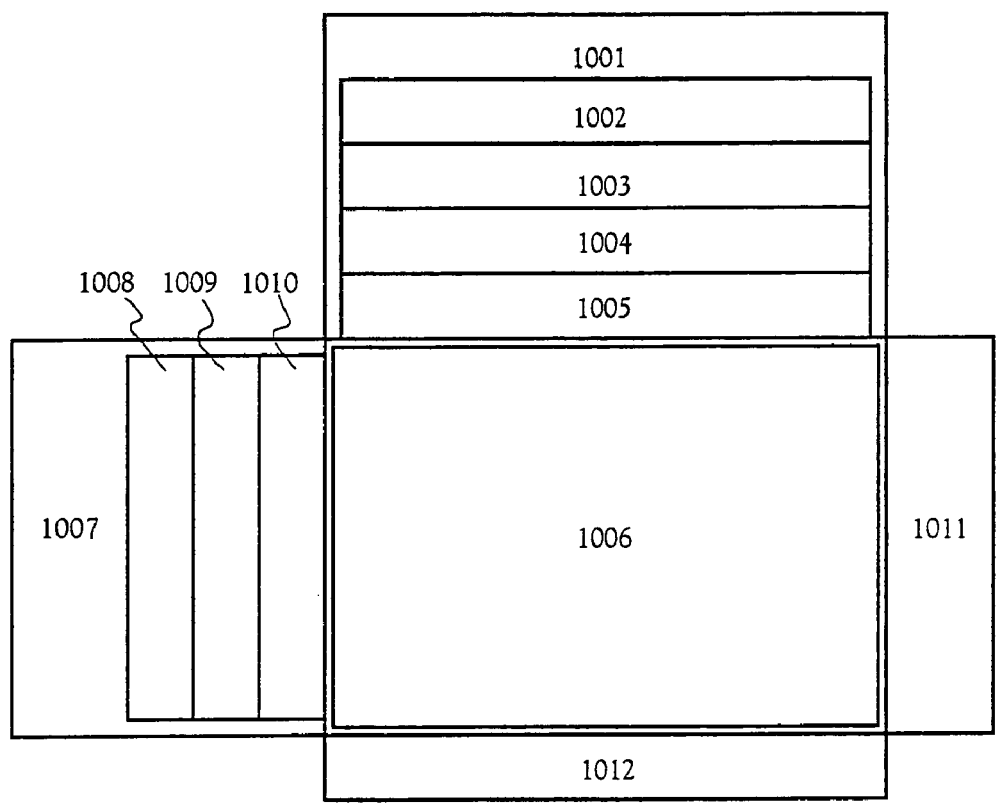
FIG. 14 is a circuit block diagram of a liquid crystal display device of Embodiment 5.

FIG. 14 is an illustration of the construction of the active matrix substrate shown in Embodiment 1 or Embodiment 2, for a direct-view display device circuit construction. The active matrix substrate of this embodiment has an image signal driver circuit 1001, a scanning signal driver circuit (A) 1007, a scanning signal driver circuit (B) 1011, a precharge circuit 1012 and a pixel portion 1006. Throughout this specification, the term "driver circuit" will include the image signal driver circuit 1001 and the scanning signal driver circuit (A) 1007.

The image signal driver circuit 1001 is provided with a shift register circuit 1002, a level shifter circuit 1003, a buffer circuit 1004 and a sampling circuit 1005. The scanning signal driver circuit (A) 1007 is provided with a shift register circuit 1008, a level shifter circuit 1009 and a buffer circuit 1010. The scanning signal driver circuit (B) 1011 also has the same construction.

The shift register circuits 1002, 1008 have a driving voltage of 5–16 V (typically 10 V), and the n-channel TFT of the CMOS circuit forming this circuit suitably has the construction shown as 202 in FIG. 5. The level shifter circuits 1003, 1009 and buffer circuits 1004, 1010 have a driving voltage as high as 14–16 V, and a CMOS circuit including the n-channel TFT 202 in FIG. 5 is suitable, as for the shift register circuit. In these circuits, formation of the gates with a multi-gate structure is effective for raising the voltage resistance and improving the circuit reliability.

The sampling circuit 1005 has a driving voltage of 14–16 V, but since it is necessary to reduce the off-current value while driving is effected with an alternating reverse polarity, a CMOS circuit containing the n-channel TFT 203 in FIG. 5 is suitable. FIG. 5 shows only an n-channel TFT, but in an actual sampling circuit it is formed in combination with a p-channel TFT. Here, the p-channel TFT is adequate with the construction shown by 201 in the same drawing.

The pixel TFT 204 has a driving voltage of 14–16 V, and from the standpoint of reduced power consumption, a further reduction in the off-current value compared to the sampling circuit is required, and therefore the structure preferably has an LDD ($L_{off}$) region provided without overlapping of the gate electrodes in the manner of the pixel TFT 204.

The construction of this embodiment may be easily realized by fabricating the TFT according to the steps indicated for Embodiment 1. In this embodiment there is only shown the construction for the pixel portion and the controlling circuit, but by following the steps for Embodiment 1 it is possible to form a signal processing circuit such as a signal division circuit, sub-harmonic circuit, D/A converter, γ-correction circuit, operational amplifier circuit, memory circuit or computational processing circuit, or a logic circuit, over the same substrate. Thus, the present invention can realize a semiconductor device comprising a pixel portion and its controlling circuit over the same substrate, for example, a semiconductor device equipped with a signal controlling circuit and a pixel portion.

Embodiment 6

An embodiment of the present invention will be described with reference to FIGS. 16A through 18C. The embodiment will be described with respect to details of steps of a process in which pixel TFTs and storage capacitors in a pixel portion and TFTs in driver circuits provided on the periphery of the pixel portion are simultaneously manufactured.

Figure 16A:
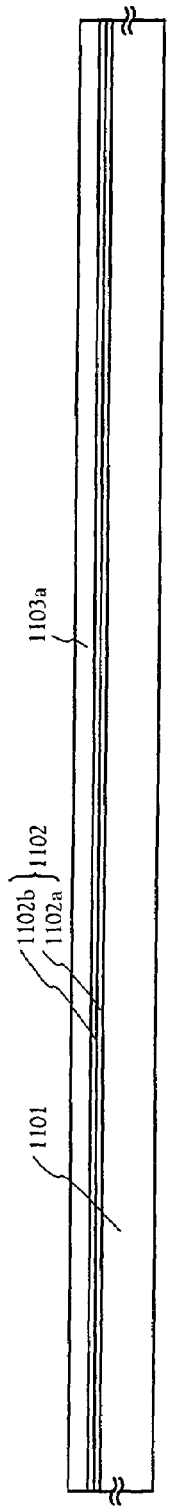
FIGS. 16A to 16D are cross-sectional views showing a process of manufacturing a pixel TFT, a storage capacitor, and TFTs in a driver circuit of Embodiment 6.

Referring to FIG. 16A, a glass substrate formed of barium borosilicate glass or alumino-borosilicate glass represented by #7059 glass or #1737 glass, a product from by Corning Inc., a quartz substrate or the like is used as substrate 1101. If a glass substrate is used, it may be heat-treated in advance at a temperature lower than the glass strain point by 10 to 20° C. On the surface of the substrate 1101 on which TFTs are to be formed, a base film 1102, which is formed of an insulating film, such as a silicon oxide film, a silicon nitride film, or a silicon nitride oxide film, is formed for the purpose of preventing impurity diffusion from the substrate 1101. For example, a silicon nitride oxide film 1102a made from $SiH_4$, $NH_3$, and $N_2O$ is deposited by plasma CVD to form a layer having a thickness of 10 to 200 nm (preferably, 50 to 100 nm), and a hydrogenated silicon nitride oxide film 1102b made from $SiH_4$ and $N_2O$ is then deposited by plasma CVD to form a lamination having a thickness of 50 to 200 nm (preferably, 100 to 150 nm). The base film 1102 has been described as a film of a two-layer structure. However, it may alternatively be of a single layer structure using one of the above-described insulating films or of a lamination structure using two or more insulating films, such as those described above.

The silicon nitride oxide film is formed by parallel-plate plasma CVD. The silicon nitride oxide film 1102a is formed by introducing $SiH_4$ at 10/60 $cm^3$/s, $NH_3$ at 100/60 $cm^3$/s, and $N_2O$ at 20/60 $cm^3$/s into a reaction chamber and by setting the substrate temperature to 325° C., the reaction pressure to 40 Pa, the charge power concentration to 0.41 $W/cm^2$, and the charge frequency to 60 MHz. On the other hand, the hydrogenated silicon nitride oxide film 1102b is formed by introducing $SiH_4$ at 5/60 $cm^3$/s, $N_2O$ at 120/60 $cm^3$/s, and $H_2$ at 125/60 $cm^3$/s into the reaction chamber, and by setting the substrate temperature to 400° C., the reaction pressure to 20 Pa, the charge power concentration to 0.41 $W/cm^2$, and the charge frequency to 60 MHz. These films can be successively formed by only changing the substrate temperature and changing the reactive gas.

The silicon nitride oxide film 1102a formed in the above-described manner has a concentration of $9.28 \times 10^{22}/cm^3$ and has a low etching rate of about 63 nm/min at 20° C. by a mixture solution containing 7.13% of ammonium hydrofluoride ($NH_4HF_2$) and 15.4% of ammonium fluoride ($NH_4F$) (commercial name: LAL500, product from Stella Chemifa Corporation). Thus, it is a dense hard film. Such a film used as a base film is effective in preventing alkali metal elements in the glass substrate from being diffused in a semiconductor layer formed on the glass substrate.

Next, a semiconductor layer 1103a of an amorphous structure having a thickness of 25 to 80 nm (preferably, 30 to 60 nm) is formed by plasma CVD or sputtering. The semiconductor film of an amorphous structure comprises an amorphous semiconductor layer or a microcrystalline semiconductor film. A chemical compound semiconductor film of an amorphous structure, such as an amorphous silicon germanium film, may also be used. The base film 1102 and the amorphous semiconductor layer 1103a may be successively formed without intermission if they are formed by plasma CVD. For example, after successively forming the silicon nitride oxide film 1102a and the hydrogenated silicon nitride oxide film 1102b by plasma CVD as described above, the reaction gas may be changed from $SiH_4$, $N_2O$, and $H_2$ to $SiH_4$ and $H_2$ or to $SiH_4$ alone to enable successive formation of the semiconductor layer 1103a without temporary atmospheric exposure. Consequently, contamination of the surface of the hydrogenated silicon nitride oxide film 1102b can be prevented, thereby reducing fluctuations in the characteristics and variation in the threshold voltage of TFTs manufactured.

A crystallization step is then performed to form a crystalline silicon layer 1103b from the amorphous semiconductor layer 1103a. For this crystallization, laser annealing, thermal annealing (solid-phase growth), or rapid thermal annealing (RTA) may be used. If the above-described glass substrate or a plastic substrate inferior in heat resistance is used, it is preferable to use laser annealing in particular. In RTA, an infrared lamp, a halogen lamp, a metal halide lamp, a xenon lamp, or the like may be used as a light source. Alternatively, the crystalline semiconductor layer 1103b may be formed by crystallization using a catalytic element in accordance with a technique disclosed in Japanese Patent Application Laid-open No. Hei 7-130652. It is preferable in the crystallization step to first release hydrogen contained in the amorphous semiconductor layer. To do so, a heat treatment may be performed at 400 to 500° C. for about one hour to reduce the hydrogen content to 5 atomic % or less (atomic % hereinafter used as a unit representing a proportion of atoms) before crystallization. Such a heat treatment is advantageous because it is effective in preventing roughening of the film surface.

The step of forming the amorphous silicon film by plasma CVD may be performed by using a reactive gas formed of $SiH_4$ and argon (Ar) and by setting the substrate temperature to 400 to 450° C. during forming of the film to reduce the hydrogen content to 5 atomic % or less. If this step is formed in this manner, there is no need for a heat treatment for releasing hydrogen.

Figure 16B:
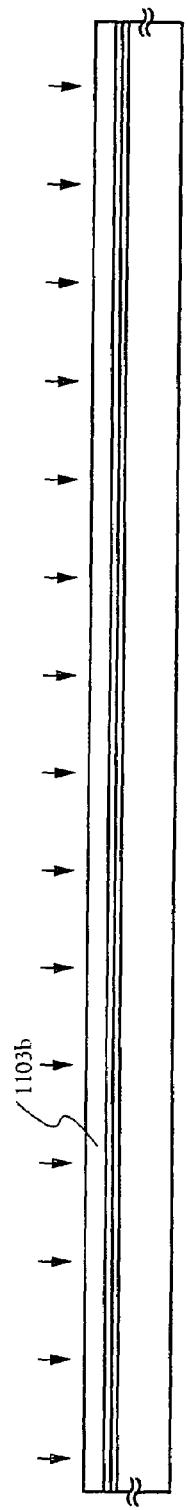

If the crystallization is performed by laser annealing, a pulse oscillation type or a continuous emission type of excimer laser or argon laser is used as a light source for laser annealing. In the case where a pulse oscillation type of excimer laser device, laser light is shaped into a linear beam to perform laser annealing. Laser annealing conditions are suitably selected by the operator. For example, the laser pulse oscillation frequency is set to 30 Hz and the laser energy concentration is set to 100 to 500 mJ/cm$^2$ (typically, 300 to 400 mJ/cm$^2$). The entire surface is irradiated with the linear beam. At this time, the overlapping ratio of the linear beam is set to 80 to 98%. Thus, crystalline semiconductor layer 1103b is obtained as shown in FIG. 16B.

Figure 16C:
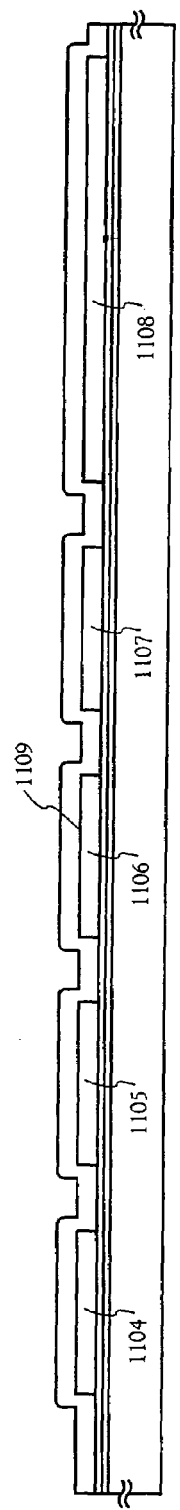

A first photomask is formed on the crystalline semiconductor layer 1103b, a resist pattern is formed by using a photolithography technique, the crystalline semiconductor layer is divided into island-like portions by dry etching, thereby forming island-like semiconductor layers 1104 to 1108, as shown in FIG. 16C. The island-like semiconductor layer 1108 has a first region which is to form an active layer of a pixel TFT afterward, and a second region which is to form a lower electrode of a storage capacitor afterward. For dry etching of the crystalline silicon film, a mixture gas of $CF_4$ and $O_2$ is used.

An impurity element for imparting p-type conductivity may be added to the material forming the entire surfaces of the island-like semiconductor layers so that its concentration in the material is about $1\times10^{16}$ to $5\times10^{17}$ atoms/cm$^3$, for the purpose of threshold voltage (Vth) control of TFTs. As impurity elements capable of imparting p-type conductivity in a semiconductor, elements in Group 13 in the periodic table, e.g., boron (B), aluminum (Al) and gallium (Ga) are known. As a method for adding such an impurity element, ion implantation or ion doping (or ion shower doping) may be used. In particular, ion doping is suitable for processing of a large-area substrate. In ion doping, diborane ($B_2H_6$) is used as a source gas for addition of boron (B). Introduction of such an impurity element is not always necessary and may be omitted. However, this technique can be suitably used for the purpose of setting the threshold voltages of n-channel TFTs within a predetermined range.

A gate insulating film 1109 which is an insulating film containing silicon and having a thickness of 40 to 150 nm is formed by plasma CVD or sputtering. In this embodiment, the gate insulating film 1109 is formed of a silicon nitride oxide film and has a thickness of 120 nm. In a silicon nitride oxide film made by adding $O_2$ to $SiH_4$ and $N_2O$, the concentration of fixed charge is reduced. This silicon nitride oxide film is therefore preferred as a material used for this purpose. A silicon nitride oxide film made from $SiH_4$, $N_2O$ and $H_2$, is also preferred because it is capable of reducing the interface defect concentration of the gate insulating film. Needless to say, the gate insulating film is not limited to such a silicon nitride oxide film. A single-layer structure or a lamination structure of any other insulating films containing silicon may be used. For example, a silicon oxide film may be formed by plasma CVD using a mixture of tetraethyl orthosilicate (TEOS) and $O_2$, setting the reaction pressure to 40 Pa and the substrate temperature to 300 to 400° C., and causing discharge at a high frequency (13.56 MHz) and at a power concentration of 0.5 to 0.8 W/cm$^2$. The silicon oxide film made in this manner can have favorable characteristics when completed as a gate insulating film by subsequent thermal annealing at 400 to 500° C.

Figure 16D:
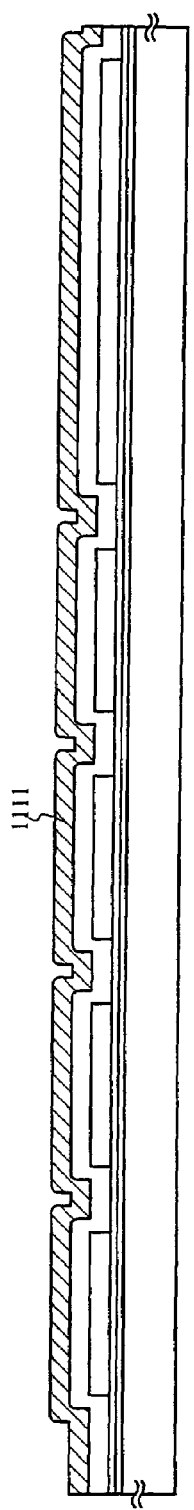

Then, as shown in FIG. 16D, a heat-resistant conductive layer 1111 for forming gate electrodes is formed on the gate insulating film 1109 having a first configuration. The heat-resistant conductive layer 1111 has a thickness of 200 to 400 nm (preferably, 250 to 350 nm). The heat-resistant conductive layer may have a single-layer structure or a lamination structure formed of two, three or more layers according to need. The heat-resistant conductive layer defined in this specification comprises a film of an element selected from Ta, Ti, and W, a film of an alloy containing these elements, and a film of an alloy containing a combination of these elements. The heat-resistant conductive layer is formed by sputtering or CVD. It is preferable to reduce the concentration of impurities contained in the heat-resistant conductive layer in order to achieve a low-resistance characteristic. In particular, it is preferable to limit the oxygen concentration to 30 ppm or less. In this embodiment, a W film having a thickness of 300 nm is formed. A W film may be formed by sputtering using a W target or by thermal CVD using tungsten hexafluoride ($WF_6$). In either case, it is necessary for the formed W film to have a low-resistance characteristic such as to be suitable for use as a gate electrode. It is desirable that the resistivity of the formed W film be 20 μΩcm or less. The resistivity of a W film can be reduced by increasing the crystal grain size. However, if there is a large amount of impurity such as oxygen in W, the crystallization is obstructed so that the resistivity is increased. Therefore, sputtering for forming the desired W film is performed in such a manner that a W target having a purity of 99.9999% is used and great care is taken to prevent mixing of impurities from the vapor phase during forming of the film, thus realizing a resistivity of 9 to 20 μΩcm.

On the other hand, in the case where a Ta film is used as the heat-resistant conductive layer 1111, it can also be formed by sputtering. Ar gas is used as a sputtering gas for forming a Ta film. A suitable amount of Xe or Kr may be added to the sputtering gas to reduce internal stress in the formed film for the purpose of preventing the film from being peeled off. The resistivity of the Ta film in the α phase is about 20 μΩcm, and the Ta film in this phase can be used as a gate electrode. The resistivity of the Ta film in the β phase is about 180 μΩcm, and Ta film in this phase is not suitable for use as a gate electrode. A TaN film has a crystal structure close to the α phase. Therefore, if the TaN film is formed as a base on which the Ta film is formed, the Ta film in the α phase can easily be obtained. Forming a silicon film (not shown) doped with phosphorus (P) and having a thickness of 2 to 20 nm as a layer on which the heat-resistant conductive layer 1111 is formed is effective in achieving improved adhesion of the conductive layer to be formed thereon, in preventing oxidization of the conductive layer 1111, and in preventing alkali metal elements contained in a very small amount in the heat-resistant conductive layer 1111 from being diffused in the first gate insulating film 1109. In any case, it is desirable to set the resistivity of the heat-resistant conductive layer 1111 in the range of 10 to 50 μΩcm.

Next, resist masks 1112 to 1116 are formed by using a second photomask and by using a photolithography technique. Then first etching (dry etching) is performed. In this embodiment, the first etching is performed by using an inductive coupled plasma (ICP) etching apparatus and by using an etching gas formed of $Cl_2$ and $CF_4$. Electric power of a radio-frequency (RF) (13.56 MHz) is supplied at 3.2 W/cm$^2$ to form a plasma at a pressure of 1 Pa. RF (13.56 MHz) power is also supplied at 224 mW/cm$^2$ on the substrate side (sample stage), thereby applying a substantial negative self-bias voltage. The W film etching rate under these conditions is about 100 nm/min. A time period in which etching of W film can be completed is estimated on the basis of this etching rate. This estimated time period is increased by 20% to set it as the etching time.

Figure 17A:
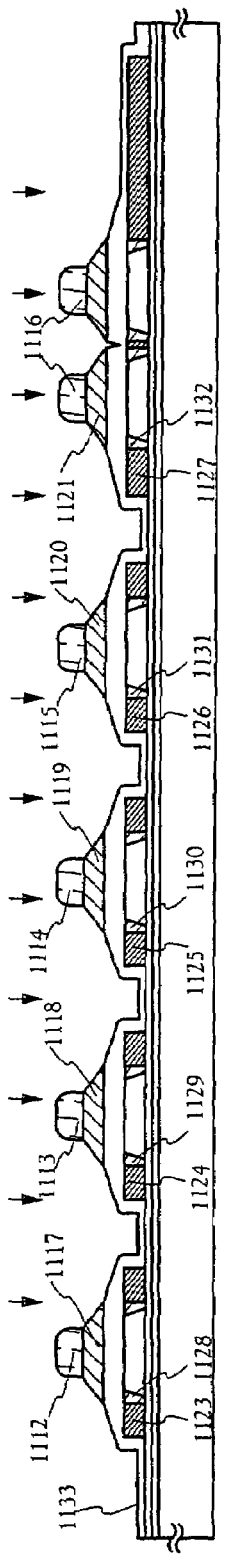
FIGS. 17A to 17C are cross-sectional views showing a process of manufacturing a pixel TFT, a storage capacitor, and TFTs in a driver circuit of Embodiment 6.
Figure 17B:
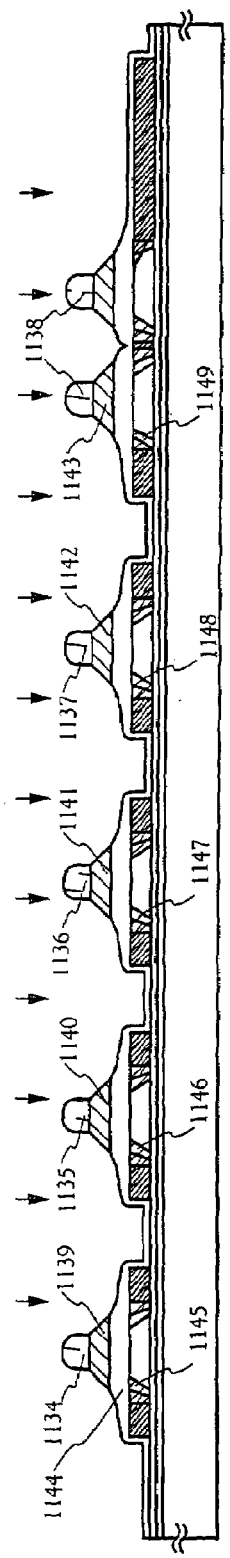
Figure 17C:
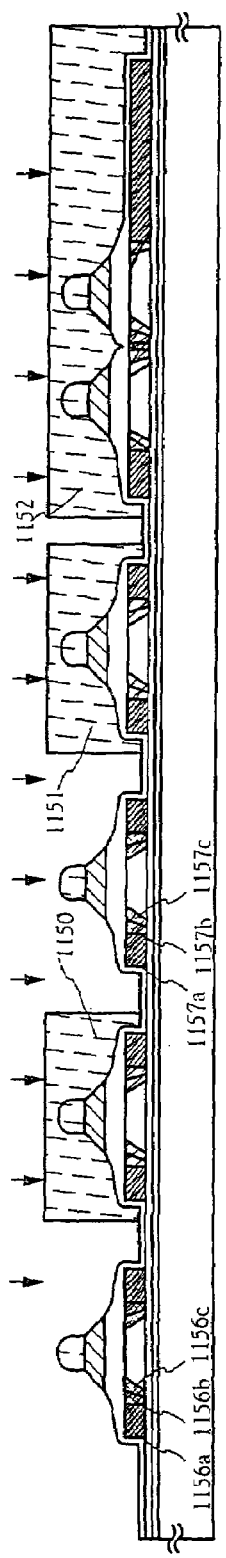

As shown in FIG. 17B, by the first etching, conductive layers 1117 to 1121 having a first tapered shape are formed. Each conductive layer is formed so that the angle of the tapered portion is 15 to 30°, as shown in FIG. 19A. To perform etching without leaving a residue, the etching time is increased by about 10 to 20% for over-etching. Because the selectivity of the silicon nitride oxide film (the gate insulating film 1109 having the first configuration) to the W film is 2 to 4 (typically 3), the exposed surfaces of the silicon nitride oxide film are etched by about 20 to 50 nm by over-etching to become thinner than the portions on which gate electrodes are formed. As a result, a gate insulating film 1113 having a second configuration is formed so as to fit the tapered shape of the first conductive layers.

First doping is then performed to add an impurity element of one conductivity to the island-like semiconductor layers. In this embodiment, a step of adding an impurity element for imparting n-type conductivity is performed. Ion doping is performed to effect in a self-alignment manner addition of an impurity for imparting n-type conductivity by using the entire masks 1112 to 1116 used for forming the first shape of conductive layers and by using the conductive layers 1117 to 1121 of the first tapered shape as masks. This doping is performed by setting the dose to $1\times10^{13}$ to $5\times10^{14}$ atoms/cm$^2$ and the acceleration voltage to 80 to 160 keV, thereby enabling an impurity element for imparting n-type conductivity to pass through tapered end portions of the gate electrodes and the gate insulating film and to reach the semiconductor layer located below the gate insulating film. As an impurity element for imparting n-type conductivity, an element belonging to Group 15, typically phosphorus (P) or arsenic (As) may be used. In this embodiment, phosphorus (P) is used. By the above-described ion doping, the impurity element for imparting n-type conductivity is added to first impurity regions 1123 to 1127 so that the concentration of the element in these regions is in the range from $1\times10^{20}$ to $1\times10^{21}$ atoms/cm$^3$. The impurity element for imparting n-type conductivity is also added to second impurity regions (A) 1128 to 1132 formed below the tapered portions so that the concentration of the element in these regions is in the range from $1\times10^{17}$ to $1\times10^{20}$ atoms/cm$^3$, although it is probable that the concentration in each region is not uniform. A region 1127b is a region (the second region of the semiconductor layer 1108) which is to form a lower electrode of a storage capacitor afterward. Since the impurity element is added through the entire surface of the region which is to form a lower electrode of a storage capacitor, the conductivity of the lower electrode of the storage capacitor can be increased without increasing the number of process steps.

In this step, in the second impurity regions (A) 1128 to 1132, variation in the concentration of the impurity element for imparting n-type conductivity contained at least in the portions overlapping with the conductive layers 1117 to 1121 of the first shape reflects the non-uniformity of the thickness of the tapered portions. That is, the concentration of phosphorus added to each of the second impurity regions (A) 1128 to 1132, in the portions overlapping with the conductive layer of the first shape, is reduced gradually along a direction from the end of the conductive layer toward an inner portion of the conductive layer. This is because the amount of phosphorus (P) reaching the semiconductor layer changes in accordance with the non-uniform thickness of the tapered portion. The concentration of phosphorus (P) changes correspondingly, as shown in FIG. 19A-2.

Next, second etching (dry etching) is performed, as shown in FIG. 17B. This etching is also performed by using the ICP etching apparatus and a mixture of $CF_4$ and $Cl_2$ as an etching gas at an RF power of 3.2 W/cm$^2$ (13.56 MHz), a bias power of 45 mW/cm$^2$ (13.56 MHz), and a pressure of 1.0 Pa. Conductive layers 1139 to 1143 having a second shape are formed under these conditions. Each conductive layer has tapered end portions in which the thickness is gradually increased along a direction from the end toward an inner portion. The bias voltage applied to the substrate is reduced relative to that in the first etching. Correspondingly, the proportion of the amount of isotropic etching is increased. As a result, the angle of the tapered portion is 30 to 60°. Also, the surface of the gate insulating film 1133 having the second shape is etched by about 40 nm, thereby newly forming a gate insulating film 1144 having a third configuration. The gate insulating film 1144 having a reduced thickness includes a region to be used as a dielectric of a storage capacitor, thus making it possible to form a storage capacitor having an increased capacitance without increasing the number of process steps.

Figures 1, 19B:
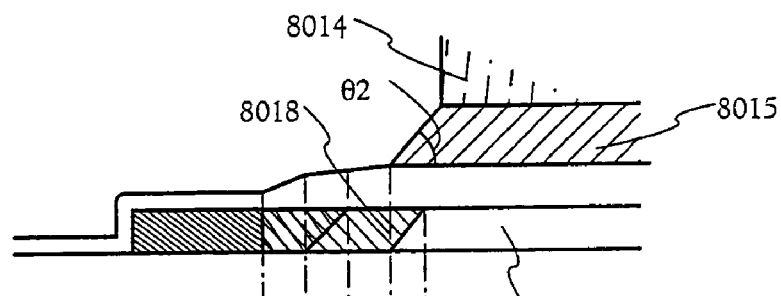
Figures 2, 19B:
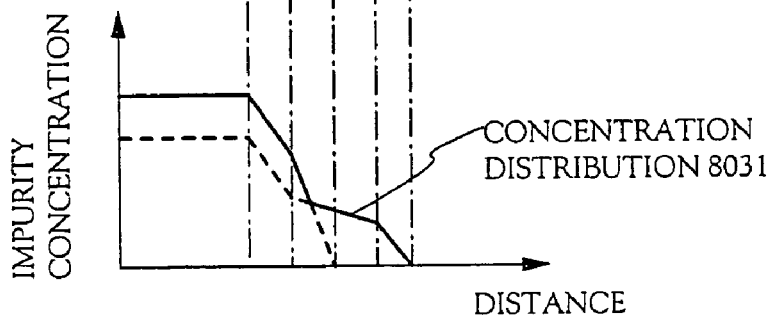

Doping with an impurity element for imparting n-type conductivity is then performed at a high acceleration voltage condition while the dose is reduced in comparison with the first doping. For example, doping is performed by setting the acceleration voltage to 70 to 120 keV and the dose to $1\times10^{13}$ to set the concentration of the impurity in regions overlapping with the conductive layers 1139 to 1143 having the second shape to $1\times10^{16}$ to $5\times10^{18}$ atoms/cm$^3$, preferably, $1\times10^{16}$ to $1\times10^{18}$ atoms/cm$^3$. In this manner, second impurity regions (B) 1145 to 1149 are formed. As shown in FIG. 19B-1, the second etching is performed in which it is important that a width in the channel length direction is shortened. Therefore, the taper angle θ2 becomes larger than θ1. In addition, as shown in FIG. 19B-2, because an amount of the impurity added in the second doping is low, an effect thereof in the first impurity regions can be negligible.

Thereafter, on the island-like semiconductor layers 1104 and 1106 for forming p-channel TFTs, impurity regions 1156 and 1157 having conductivity opposite to the above-mentioned one conductivity are formed. In this case, too, the impurity regions are formed in a self-aligning manner by adding an impurity element for imparting p-type conductivity with the conductive layers 1139 and 1141 having the second shape used as a mask. At this time, the entire surfaces of the island-like semiconductor layers 1105, 1107, and 1108 for forming n-channel TFTs are covered with resist masks 1150 to 1152 formed by using a third photomask. The impurity regions 1156 and 1157 are formed by ion doping using diborane ($B_2H_6$). The concentration of the impurity element for imparting p-type conductivity in the impurity regions 1156 and 1157 is set to $2\times10^{20}$ to $2\times10^{21}$ atoms/cm$^3$.

In more detail, each of these impurity regions 1156 and 1157 is considered to have three different regions with respect to the concentration of the impurity elements for imparting n-type conductivity. Third impurity regions 1156a and 1157a contain the impurity elements for imparting n-type conductivity at a concentration of $1\times10^{20}$ to $1\times10^{21}$ atoms/cm$^3$; fourth impurity regions (A) 1156b and 1157b contain the impurity elements for imparting n-type conductivity at a concentration of $1\times10^{17}$ to $1\times10^{20}$ atoms/cm$^3$; and fourth impurity regions (B) 1156c and 1157c contain the impurity elements for imparting n-type conductivity at a concentration of $1\times10^{16}$ to $5\times10^{18}$ atoms/cm$^3$. However, the concentration of an impurity element for imparting p-type conductivity in the impurity regions 1156b, 1156c, 1157b, and 1157c may be set to $1\times10^{19}$ atoms/cm$^3$ or higher, and the concentration of an impurity element for imparting p-type conductivity in the third impurity regions 1156a and 1157a may be set to a value 1.5 to 3 times higher. Under this condition, the third impurity regions can function as source or drain regions of p-channel TFTs without causing any problem. The fourth impurity regions (B) 1156c and 1157c partially overlap the conductive layers 1139 and 1141 having the second tapered shape, respectively.

Next, a step of activating the impurity elements for imparting n-type and p-type conductivity contained added at the respective concentrations is performed. In this step, thermal annealing using an annealing furnace is performed. Laser annealing, rapid thermal annealing (RTA) or any other method may alternatively be used. Thermal annealing is performed at a temperature of 400 to 700° C., typically 500 to 600° C. in a nitrogen atmosphere in which the oxygen concentration is 1 ppm or lower, preferably 0.1 ppm or lower. In this embodiment, the heat treatment is performed at 550° C. for 4 hours. If a plastic substrate inferior in heat resistance is used as the substrate 1101, it is preferable to use laser annealing.

After the activation step, the atmosphere gas is changed and a step of hydrogenating the island-like semiconductor layers is performed. In this step, a heat treatment is performed at 300 to 450° C. for 1 to 12 hours in an atmosphere containing 3 to 100% of hydrogen. This is a step of terminating the dangling bond of $10^{16}$ to $10^{18}$/cm$^3$ in the semiconductor layer by thermally excited hydrogen. Another hydrogenation means based on plasma hydrogenation (using hydrogen excited by plasma) may alternatively be performed. In either case, it is desirable to limit the defect concentration in the island-like semiconductor layers 1104 to 1108 to $10^{16}$/cm$^3$ or less. To do so, about 0.01 to 0.1 atomic % of hydrogen may be added.

Figure 18A:
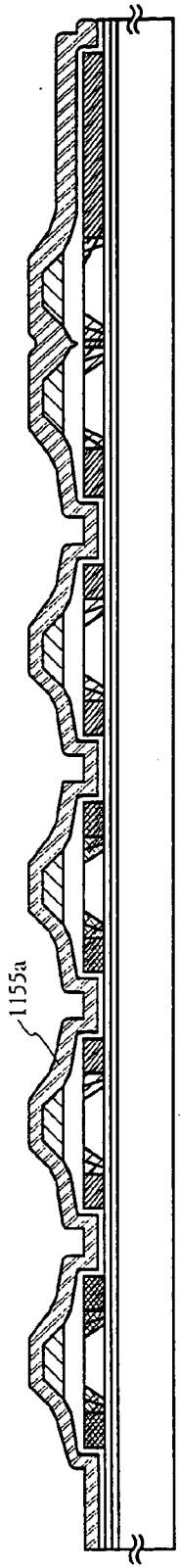
FIGS. 18A to 18C are cross-sectional views showing a process of manufacturing a pixel TFT, a storage capacitor, and TFTs in a driver circuit of Embodiment 6.

Next, to form storage capacitors, a film of a material 155a containing aluminum (Al) as a main constituent is formed and a capacitor wiring 1155 as an upper electrode of a storage capacitor is formed, as shown in FIG. 18A. Thereafter, a first interlayer insulating film 1158 is formed on the gate electrodes and the gate insulating film. The first interlayer insulating film 1158 may be a silicon oxide film, a silicon nitride oxide film, a silicon nitride film or a lamination film consisting of a combination of these films. In any case, the first interlayer insulating film 1158 is formed of an inorganic insulating material. The thickness of the first interlayer insulating film 1158 is set to 100 to 200 nm. If a silicon oxide film is used, plasma CVD may be performed using a mixture of TEOS and $O_2$, by setting the reaction pressure to 40 Pa and the substrate temperature to 300 to 400° C., and by causing discharge at a radio frequency (13.56 MHz) and at a power concentration of 0.5 to 0.8 W/cm$^2$. If a silicon nitride oxide film is used, a silicon nitride oxide film made from $SiH_4$, $N_2O$, and $NH_3$ or from $SiH_4$ and $N_2O$ by plasma CVD may be used. In this case, the silicon nitride oxide film may be made under the following conditions: a reaction pressure of 20 to 200 Pa, a substrate temperature of 300 to 400° C., and high frequency (60 MHz) power concentration of 0.1 to 1.0 W/cm$^2$. A hydrogenated silicon nitride oxide film made from $SiH_4$, $N_2O$, and $H_2$ may also be used. It can also be made from $SiH_4$ and $NH_3$ by plasma CVD.

A second interlayer insulating film 1159 formed of an organic insulating material is suitable, for it can level the surface. Ordinarily, an organic resin material has a low dielectric constant and is therefore effective in reducing parasitic capacitance. However, such a material has hygroscopicity and is not suitable for use as a protective film. Therefore, if such a material is used, it is necessary that the material be used in combination with a silicon oxide film, a silicon nitride oxide film, a silicon nitride film or the like, such as that formed as the first interlayer insulating film 1158 in this embodiment.

Thereafter, a resist mask having a predetermined pattern is formed by using a fourth photomask, and contact holes are formed until they reach the impurity regions that are formed in the island-like semiconductor layers to serve as the source and drain regions. The contact holes are formed by dry etching, as described below. A mixture of $CF_4$, $O_2$, and He is used as an etching gas to first etch the second interlayer insulating film 1159 made from an organic resin material. Subsequently, the first interlayer insulating film 1158 is etched by using a mixture of $CF_4$ and $O_2$ as another etching gas. The gate insulating film 1144 having the third configuration is then etched by changing the etching gas to $CHF_3$ in order to increase the selectivity to the island-like semiconductor layers, thus forming the contact holes.

A conductive metallic film is then formed by sputtering or vacuum evaporation, a resist mask pattern is formed by using a fifth photomask, and source wirings 1160 to 1164 and drain wirings 1165 to 1168 are formed by etching. A pixel electrode 1169 is formed along with the drain wirings. A pixel electrode 1171 is illustrated as a pixel electrode of the adjacent pixel portion. These wirings are formed as described below in this embodiment. A Ti film (not shown) having a thickness of 50 to 150 nm is formed so as to form a contact with the impurity region forming the source or drain region in each island-like semiconductor layer. A layer of aluminum (Al) having a thickness of 300 to 400 nm is formed on the Ti film (as indicated by 1160a to 1169a in FIG. 18C), and a transparent conductive film having a thickness of 80 to 120 nm is formed to overlap the aluminum layer (as indicated by 1160b to 1169b in FIG. 18C). To form the transparent conductive film, an indium oxide-zinc oxide alloy ($In_2O_3$—ZnO) or zinc oxide (ZnO) is preferably used. It is also preferable to use zinc oxide with added gallium (Ga) (ZnO:Ga) for the purpose of improving the transmittance with respect to visible light as well as the conductivity.

As described above, a substrate on which TFTs in a driver circuit 1300 and a pixel TFT in a pixel portion 1301 are formed can be completed by using six photomasks. A first p-channel TFT 1200, a first n-channel TFT 1201, a second p-channel TFT 1202, and a second n-channel TFT 1203 are formed in the driver circuit 1300, and a pixel TFT 1204 and a storage capacitor 1205 are formed in the pixel potion. In this specification, for convenience' sake, a substrate with circuit components formed in the above-described manner is called an active matrix substrate.

The structure of the first p-channel TFT 1200 in the driver circuit 1300 is such that the conductive layer having the second tapered shape functions as a gate electrode 1220, and a channel forming region 1206, a third impurity region 1207*a* that functions as a source region or a drain region, a fourth impurity region (A) 1207*b* forming an LDD region not overlapping the gate electrode 1220, and a fourth impurity region (B) 1207*c* forming an LDD region partially overlapping the gate electrode 1220 are formed in the island-like semiconductor layer 1104.

The structure of the first n-channel TFT 1201 is such that the conductive layer having the second tapered shape functions as a gate electrode 1221, and a channel forming region 1208, a first impurity region 1209*a* that functions as a source region or a drain region, a second impurity region (A) 1209*b* forming an LDD region not overlapping the gate electrode 1221, and a second impurity region (B) 1209*c* forming an LDD region partially overlapping the gate electrode 1221 are formed in the island-like semiconductor layer 1105. With respect to a channel length of 2 to 7 µm, the length by which the second impurity region (B) 1209*c* overlaps the gate electrode 1221 (Lov) is set to 0.1 to 0.3 µm. The length of this Lov is controlled through the thickness of the gate electrode 1221 and the angle of the tapered portion. In the n-channel TFT, such an LDD region is formed to reduce the high intensity of electric field generated in the vicinity of the drain region to limit generation of hot carriers, thus limiting degradation of the TFT.

The structure of the second p-channel TFT 1202 in the driver circuit 1300 is such that the conductive layer having the second tapered shape functions as a gate electrode 1222, and a channel forming region 1210, a third impurity region 1211*a* which functions as a source region or a drain region, a fourth impurity region (A) 1211*b* forming an LDD region not overlapping the gate electrode 1222, and a fourth impurity region (B) 1211*c* forming an LDD region overlapping the gate electrode 1222 are formed in the island-like semiconductor layer 1106.

The structure of the second n-channel TFT 1203 in the drive circuit 1300 is such that the conductive layer having the second tapered shape functions as a gate electrode 1223, and a channel forming region 1212, a first impurity region 1213*a* which functions as a source region or a drain region, a second impurity region (A) 1213*b* forming an LDD region not overlapping the gate electrode 1223, and a second impurity region (B) 1213*c* forming an LDD region overlapping the gate electrode 1223 are formed in the island-like semiconductor layer 1107. The length by which the second impurity region (B) 1213*c* overlaps the gate electrode 1223 is set to 0.1 to 0.3 µm, as well as in the second n-channel TFT 1201.

The driver circuits are composed of logic circuits, such as a shift register circuit and a buffer circuit, a sampling circuit formed by analog switches, etc. In FIG. 16B, TFTs constituting these circuits are shown as a single-gate structure in which one gate electrode is provided between a pair of a source and a drain. However, each TFT may alternatively be formed as a multi-gate structure in which a plurality of gate electrodes are provided between a pair of a source and a drain.

The structure of the pixel TFT 1204 is such that the conductive layers having the second tapered shape function as gate electrodes 1224, and channel forming regions 1214*a* and 1214*b*, first impurity regions 1215*a* and 1217 each of which functions as a source region or a drain region, a second impurity region (A) 1215*b* forming an LDD region not overlapping the gate electrode 1224, and a second impurity region (B) 1215*c* forming an LDD region overlapping the gate electrode 1224 are formed in the island-like semiconductor layer 1108. The length by which the second impurity region (B) 1215*c* overlaps the gate electrode 1224 is set to 0.1 to 0.3 µm. Also, the storage capacitor 1205 is formed by a region 1218 extending from the first impurity region 1217, an insulating layer formed as the same layer as the gate insulating film having the third configuration, and a capacitor wiring 1225 made of a material containing aluminum as a main constituent.

The storage capacitor 1205 has a large capacitance for its restricted area, because impurities are added to the semiconductor layer 1218 and because the thickness of the insulating film 1144 having the third configuration is smaller in the capacitor than in the other portions.

The above-described TFT structure for forming each of sections of the driver circuits can be optimized according to specifications required with respect to the pixel TFT and the driver circuits, thereby improving the operating performance and reliability of the semiconductor device. Further, the gate electrode is formed of a conductive material having substantially high heat resistance, thereby facilitating activation of the LDD region and the source and drain regions. Further, when the LDD regions which overlap the gate electrodes with the gate insulating film interposed therebetween are formed, an impurity element added for the purpose of controlling the conductivity is added in such a manner as to set a concentration gradient, which is considered to improve the effect of reducing the electric field in the vicinity of the drain region.

Figure 18B:
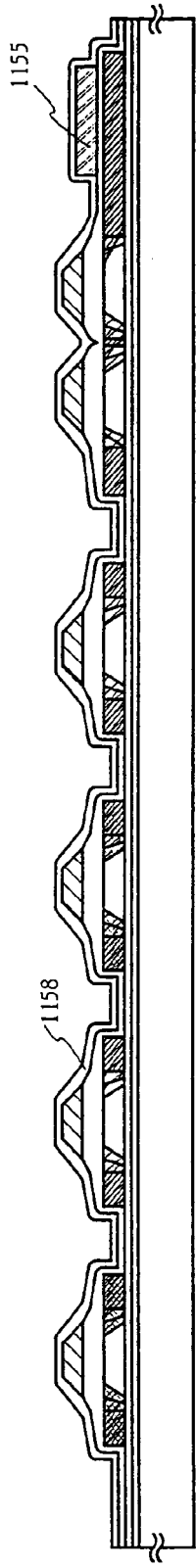
Figure 18C:
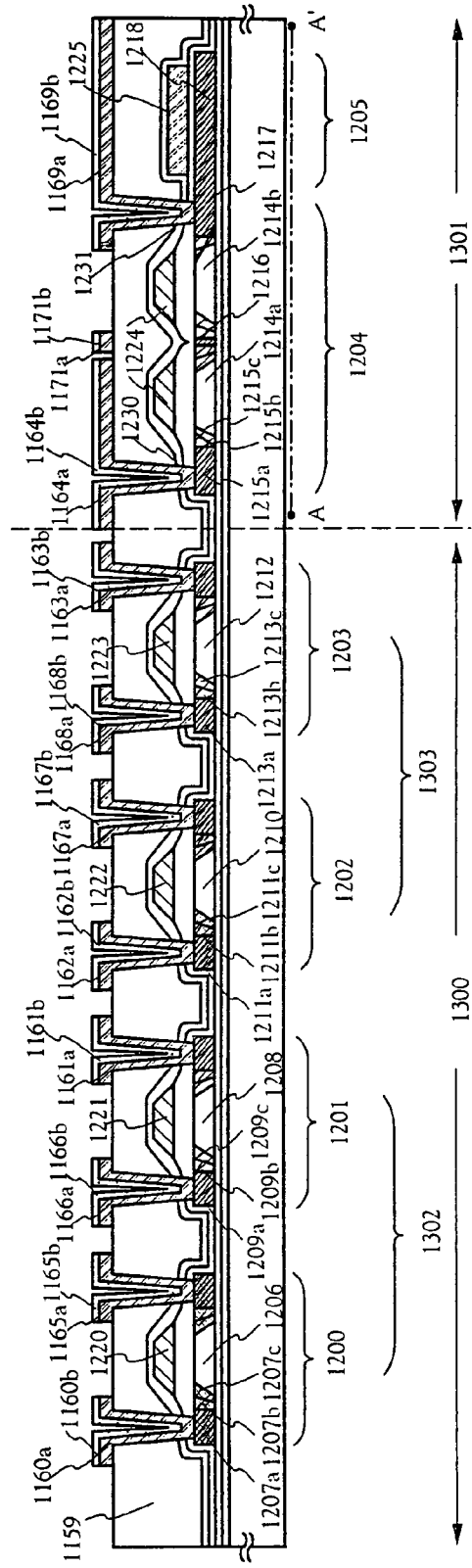
Figure 21A:
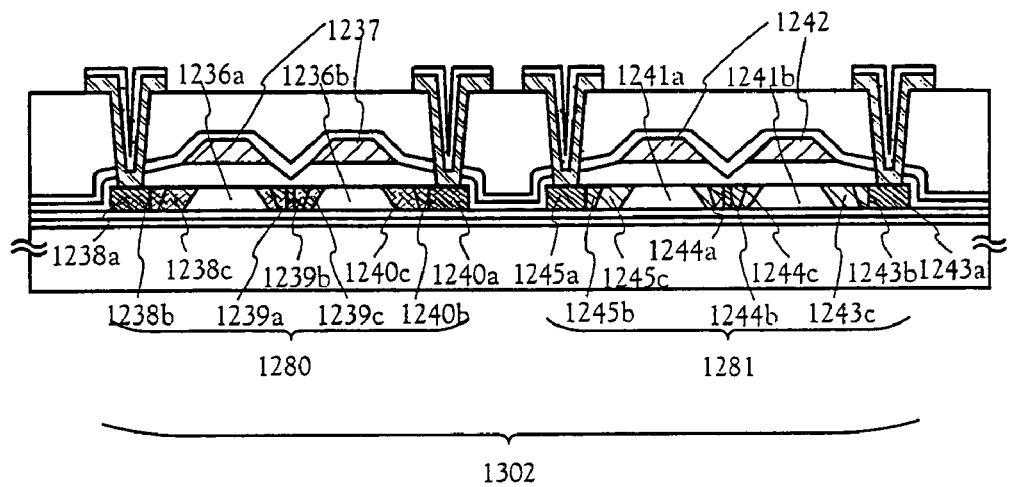
FIGS. 21A and 21B are cross-sectional views of TFTs in driver circuits of Embodiment 6.

In the case where the semiconductor device of the present invention is applied to an active matrix liquid crystal display device, the first p-channel TFT 1200 and the first n-channel TFT 1201 are used to form a shift register circuit, a buffer circuit, a level shifter, and the like, which are designed so as to be capable of high-speed operation, which is considered important. In FIG. 18B, such circuits are represented by a logic circuit portion 1302. The second impurity region (B) 1209*c* of the first n-channel TFT 1201 is designed by attaching importance to the anti-hot carrier effect. To further increase the withstand voltage and stabilize the operation, TFTs of this logic circuit portion 1302 may be formed of a first p-channel TFT 1280 and a first n-channel TFT 1281 as shown in FIG. 21A. Each of these TFTs is of a double-gate structure in which two gate electrodes are provided between a pair of a source and a drain. Such a TFT can be manufactured by the same process as that of this embodiment. The first p-channel TFT 1280 has, in an island-like semiconductor layer, channel forming regions 1236*a* and 1236*b*, third impurity regions 1238*a*, 1239*a*, and 1240*a*, each of which functions as a source or drain region, fourth impurity regions (A) 1238*b*, 1239*b*, and 1240*b*, each of which forms an LDD region, and fourth impurity regions (B) 1238*c*, 1239*c*, and 1240*c*, each of which overlaps one of gate electrodes 1237 and forms an LDD region. The first n-channel TFT 1281 has, in an island-like semiconductor layer, channel forming regions 1241*a* and 1241*b*, first impurity regions 1243*a*, 1244*a*, and 1245*a*, each of which functions as a source or drain region, second impurity regions (A) 1243*b*, 1244*b*, and 1245*b*, each of which forms an LDD region, and second impurity regions (B) 1243*c*, 1244*c*, and 1245*c*, each of which overlaps one of gate electrodes 1242 and forms an LDD region. With respect to a channel length of 3 to 7 µm, the length in the channel length direction of the LDD region overlapping the gate electrode, i.e., the Lov, is set to 0.1 to 0.3 µm.

Figure 21B:
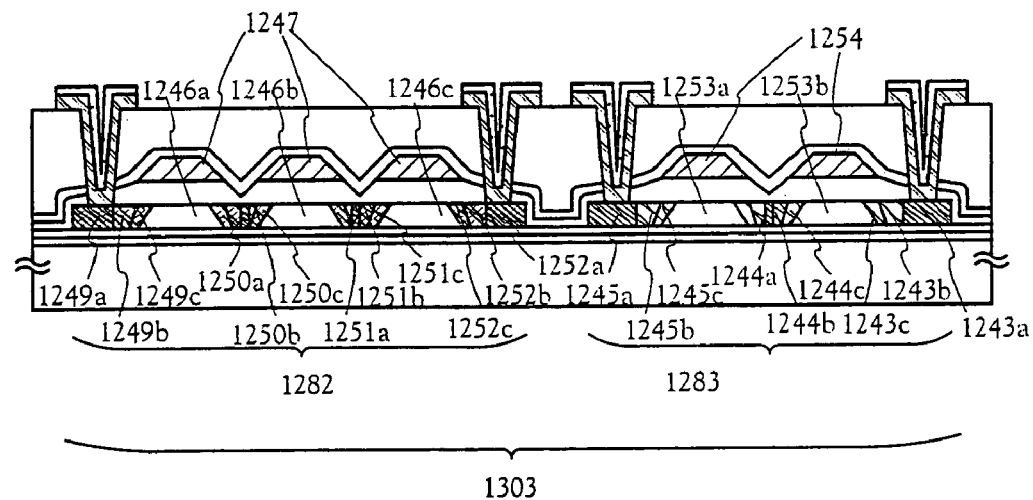

A second p-channel TFT 1202 and a second n-channel TFT 1203 constructed in the same manner can be used in a sampling circuit portion 1303 constituted of analog switches. In the case of a sampling circuit, importance is attached to anti-hot carrier means and low-off current operation. Therefore, TFTs of this circuit may be formed of a second p-channel TFT 1282 and a second n-channel TFT 1283, as shown in FIG. 21B. The second p-channel TFT 1282 is of a triple-gate structure in which three gate electrodes are provided between a pair of a source and a drain. Such a TFT can also be manufactured by the same process as that of this embodiment. The second p-channel TFT 1282 has, in an island-like semiconductor layer, channel forming regions 1246a, 1246b, and 1246c, third impurity regions 1249a, 1250a, 1251a, and 1252a, each of which functions as a source or drain region, fourth impurity regions (A) 1249b, 1250b, 1251b, and 1252b, each of which forms an LDD region, and fourth impurity regions (B) 1249c, 1250c, 1251c, and 1252c, each of which partially overlaps one of gate electrodes 1247 and forms an LDD region. The second n-channel TFT 1283 has, in an island-like semiconductor layer, channel forming regions 1253a and 1253b, first impurity regions 1255a, 1256a, and 1257a, each of which functions as a source or drain region, second impurity regions (A) 1255b, 1256b, and 1257b, each of which forms an LDD region, and second impurity regions (B) 1255c, 1256c, and 1257c, each of which partially overlaps one of gate electrodes 1254 and forms an LDD region. With respect to a channel length of 3 to 7 µm, the length in the channel length direction of the LDD region overlapping the gate electrode, i.e., the Lov, is set to 0.1 to 0.3 µm.

The operator may select the single-gate structure or the multi-gate structure in which a plurality of gate electrodes are provided between a pair of a source and a drain for the gate electrode of the TFT according to the characteristics of a circuit. According to this embodiment, any active matrix liquid crystal display device and any reflection type liquid crystal display device, as in the embodiment 3 can be manufactured.

Embodiment 7

The active matrix substrate manufactured in Embodiment 6 is applicable for a reflection type display device as it is. On the other hand, in the case of applying it to a transmission type liquid crystal display device, it is appropriate to form the pixel electrodes provided in each pixel of the pixel portion with transparent electrodes. A method of manufacturing an active matrix substrate corresponding to the transmission type liquid crystal display device is explained in this embodiment with references to FIGS. 22A to 22D.

Figure 22A:
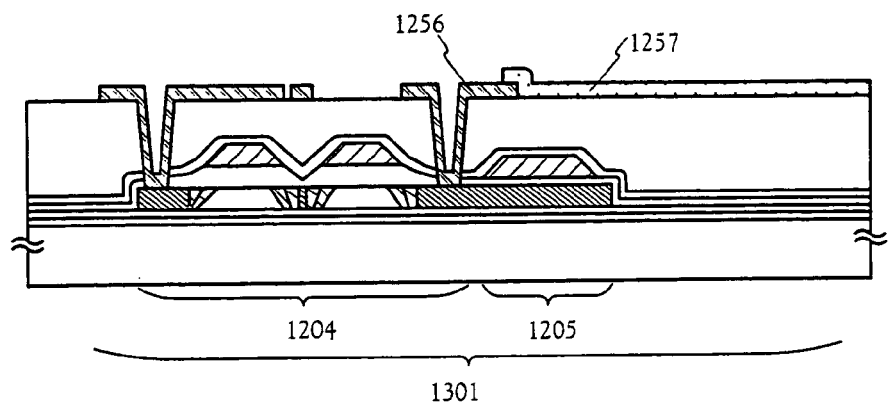
FIGS. 22A to 22D are cross-sectional views of a pixel TFT of Embodiment 7.
Figure 22B:
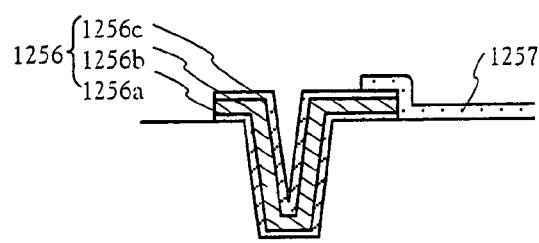

The active matrix substrate is manufactured in the same way as Embodiment 6. In FIG. 22A, a conductive metallic film is formed by sputtering or vacuum evaporation to form a source wiring and a drain wiring. This structure will be explained in detail with reference to FIG. 22B using the drain wiring 1256 as an example. A Ti film 1256a is formed at a thickness of between 50 and 150 nm, and then a contact is formed with a semiconductor film that forms the source or the drain region in an island semiconductor layer. Next an aluminum (Al) film 1256b is formed at a thickness of between 300 and 400 nm overlapping on the Ti film 1256a. Further, a Ti film 1256c or a titanium nitride (TiN) film is formed at a thickness of between 100 and 200 nm to thereby form a three-layer structure. Then a transparent conductive film is formed on the entire surface. A pixel electrode 1257 is formed by a patterning process and an etching process, using a photomask. The pixel electrode 1257 is formed on a second interlayer insulating film made of an organic resin material and sets aside a portion for overlapping with the drain wiring 1256 of the pixel TFT 1204 without contact holes in order to form an electrical connection.

Figure 22C:
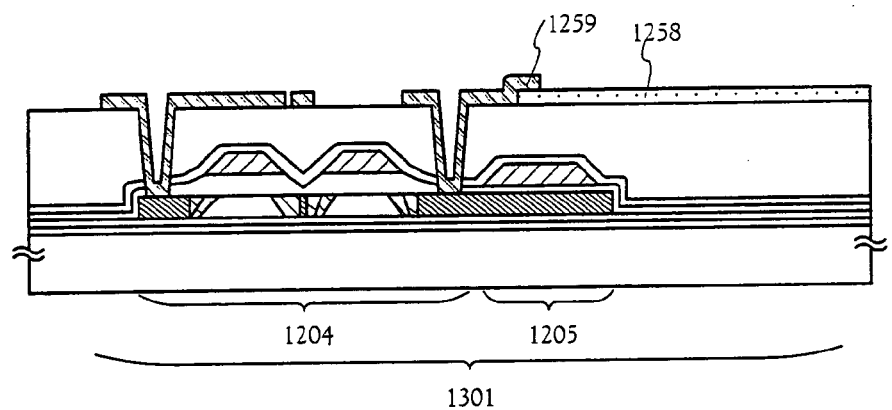
Figure 22D:
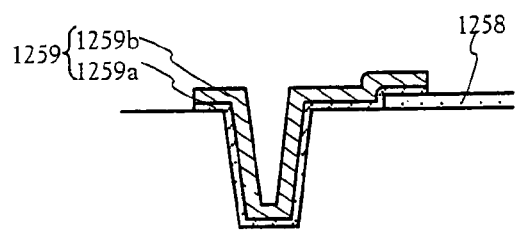

FIG. 22C is an example of first forming a transparent conductive film on the second interlayer insulating film, performing a patterning process and an etching process to form a pixel electrode 1258, and then forming a drain wiring 1259 by a portion that overlaps with the pixel electrode 1258 without contact holes. As shown in FIG. 22D, the drain wiring 1259 is provided by forming a Ti film 1259a at a thickness of between 50 and 150 nm, forming a contact hole with a semiconductor film that forms the source or the drain region in an island semiconductor layer, and then forming an aluminum film 1259b at a thickness of between 300 and 400 nm overlapping on the Ti film 1259a. With this structure, the pixel electrode 1258 is in contact only with the Ti film 1259a that forms the drain wiring 1259. Consequently, the transparent conductive film material and Al reacting from direct contact can definitely be prevented.

Materials such as indium oxide ($In_2O_3$), or an indium oxide/tin oxide alloy ($In_2O_3$—$SnO_2$; ITO) formed by sputtering or vacuum evaporation may be used as materials for the transparent conductive film. The etching treatment of these materials is performed with hydrochloric acid solutions. However, in particular, the etching of ITO readily generates residues. Therefore, an indium oxide/zinc oxide alloy ($In_2O_3$—ZnO) may be used in order to improve the etching workability. The indium oxide/zinc oxide alloy has excellent flat and smooth surface properties, and also has excellent thermal stability with regard to ITO. Accordingly, in the structure of FIGS. 22A and 22B, at an edge surface of a drain wiring 1256 where the Al film 1256b comes into contact with the pixel electrode 1257, corrosion reaction with Al can be prevented. Similarly, zinc oxide (ZnO) is also a suitable material. In order to further improve the transmissivity of visible light and conductivity, zinc oxide (ZnO: Ga) doped with gallium (Ga) or the like may be used.

In Embodiment 6, an active matrix substrate that can be used for manufacturing the reflection type liquid crystal display device was fabricated by using 5 photomasks. The addition of one more photomask (a total of 6 photomasks) can thus complete an active matrix substrate corresponding to the transmission type liquid crystal display device.

Embodiment 8

Another method of manufacturing a crystalline semiconductor layer that forms an active layer of a TFT of the active matrix substrate indicated in Embodiment 1, Embodiment 6 and Embodiment 7 is shown here in this embodiment. A crystalline semiconductor layer is formed by crystallizing an amorphous semiconductor layer by thermal annealing, laser annealing, or rapid thermal annealing (RTA) or the like. Another crystallization method disclosed in Japanese Patent Application Laid-open No. Hei 7-130652 in which a catalyst element is used can also be applied. An example of this case is explained with references to FIGS. 23A to 23C.

Figure 23A:
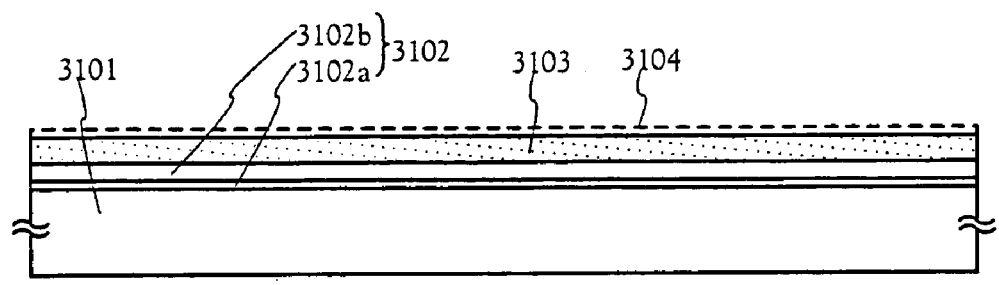
FIGS. 23A to 23C are cross-sectional views showing a process of manufacturing a crystalline semiconductor layer of Embodiment 8.

As shown in FIG. 23A, base films 3102a and 3102b and a semiconductor layer 3103 having an amorphous structure formed at a thickness of between 25 to 80 nm are formed over a glass substrate 3101, similar to Embodiment 1. An amorphous silicon (a-Si) film, an amorphous silicon germanium (a-SiGe) film, an amorphous silicon carbide (a-SiC) film, an amorphous silicon tin (a-SiSn) film, etc. are applicable for the amorphous semiconductor layer. It is appropriate to form these amorphous semiconductor layers to contain hydrogen at about 0.1 to 40 atomic %. For example, an amorphous silicon film is formed at a thickness of 55 nm. An aqueous solution containing 10 ppm by weight conversion of a catalyst element is then applied by spin coating in which application is performed by rotating the substrate with a spinner, forming a layer 3104 containing the catalyst element. Catalyst elements include nickel (Ni), germanium (Ge), iron (Fe), palladium (Pd), tin (Sn), lead (Pb), cobalt (Co), platinum (Pt), copper (Cu), gold (Au), and the like. Other than spin coating, the catalyst element containing layer 3104 may also be made by forming a 1 to 5 nm thick layer of the above catalyst elements by printing, a spraying method, a bar coater method, sputtering or vacuum evaporation.

Figure 23B:
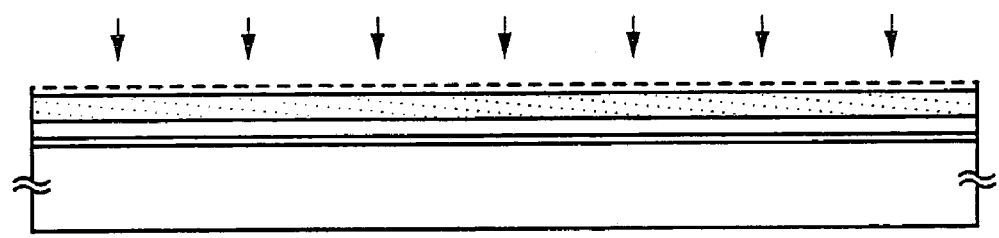
Figure 23C:
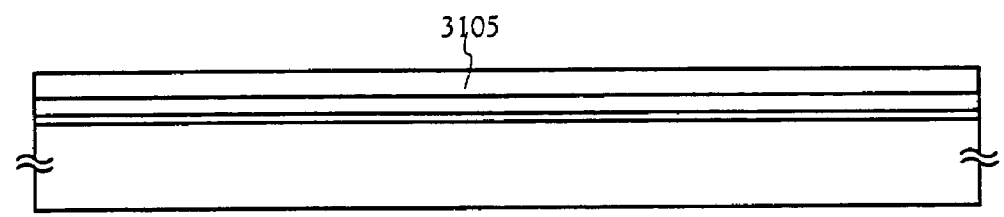

In the crystallization step shown in FIG. 23B, heat treatment is first performed for approximately 1 hour at between 400° C. and 500° C., making the amount of hydrogen contained in the amorphous silicon film 5 atomic % or less. If the initial amount of hydrogen contained in the amorphous silicon film is this value after film deposition, the heat treatment need not be performed. Thermal annealing is then performed in a nitrogen atmosphere at 550° C. to 600° C. for between 1 and 8 hours using an annealing furnace. A crystalline semiconductor layer 3105 made from the crystalline silicon film can thus be obtained through the above steps (See FIG. 23C). However, if the crystalline semiconductor layer 3105 manufactured by this thermal annealing, is observed microscopically using an optical microscope, it is observed that amorphous region remains locally. In this case, from observation of spectrum using a Raman spectroscopy, an amorphous constituent observed at 480 cm$^{-1}$ has a broad peak. Therefore, after thermal annealing, treating the crystalline semiconductor layer 3105 with the laser annealing method explained in Embodiment 1 is an effective means applicable for enhancing the crystallinity of the crystalline semiconductor film.

Figure 24A:
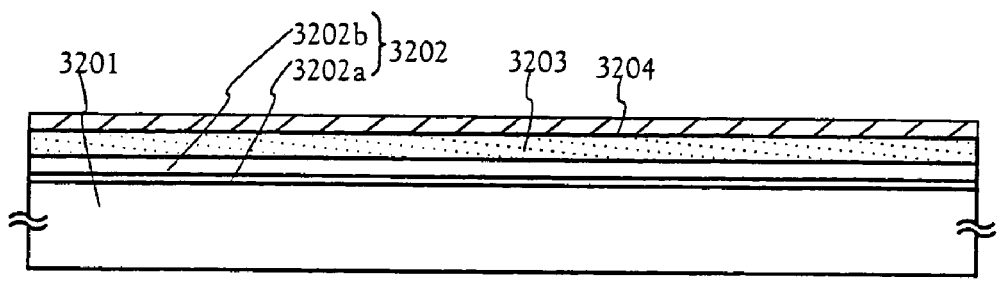
FIGS. 24A to 24C are cross-sectional views showing a process of manufacturing a crystalline semiconductor layer of Embodiment 8.
Figure 24B:
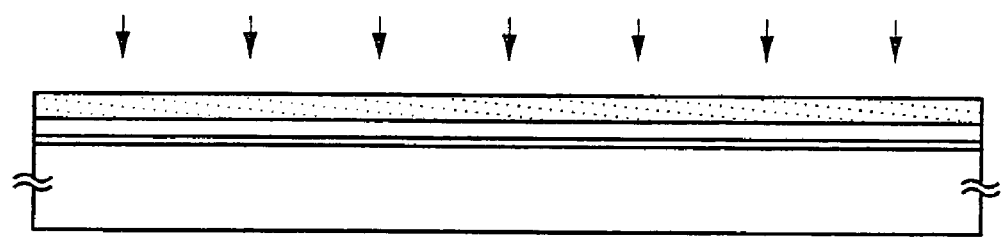
Figure 24C:
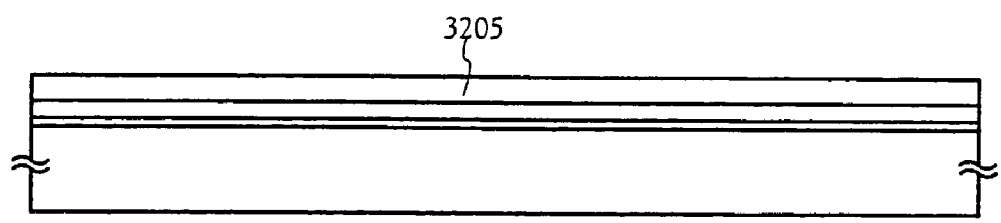

Similarly, FIGS. 24A to 24C also show an example of a crystallization method using a catalyst element in which a layer containing a catalyst element is formed by sputtering. First, base films 3202a and 3202b and a semiconductor layer 3203 having an amorphous structure formed at a thickness of between 25 to 80 nm are formed over a glass substrate 3201, similar to Embodiment 1. Then about a 0.5 to 5 nm thick oxide film is formed on the surface of the semiconductor layer 3203 having an amorphous structure (not shown in the Figure). As an oxide film having such thickness, an appropriate coating may be actively formed by plasma CVD or sputtering, but the oxide film may also be formed by exposing the surface of the semiconductor layer 3203 having an amorphous structure to an oxygen atmosphere in which the substrate has been heated at 100° C. to 300° C. and plasma treated, or exposing the surface of the semiconductor layer 3203 having an amorphous structure to a solution containing hydrogen peroxide ($H_2O_2$). The oxide film may also be formed by irradiating ultraviolet light into an atmosphere containing oxygen to generate ozone and then exposing the semiconductor layer 3203 having an amorphous structure to the ozone atmosphere.

In this way, a layer 3204 containing the above catalyst element is formed by sputtering, on the semiconductor layer 3203 having an amorphous structure with a thin oxide film on its surface. No limitations are placed on the thickness of this layer, but it is appropriate to form this layer at about 10 to 100 nm. For example, an effective method is to form a Ni film with Ni as the target. In sputtering, a part of a high-energy particle made from the above catalyst element accelerated in the electric field also comes flying to the substrate side and is driven into the close vicinity of the surface of the semiconductor layer 3203 having an amorphous structure or into the oxide film which is formed on the surface of the semiconductor layer. This proportion differs depending on conditions of generating plasma or the bias state of the substrate. However, it is appropriate to set the amount of catalyst element to be driven into the close vicinity of the surface of the semiconductor layer 3203 having an amorphous structure or within the oxide film to fall approximately between $1 \times 10^{11}$ and $1 \times 10^{14}$ atoms/cm$^3$.

Then the layer 3204 containing a catalyst element is selectively removed. For example, if this layer is formed from the Ni film, it is possible to remove this layer by a solution such as nitric acid, or if an aqueous solution containing fluoric acid is used, not only the Ni film but also the oxide film formed on the semiconductor layer 3203 having an amorphous structure can be removed at the same time. Whichever is used, the amount of catalyst element in the close vicinity of the surface of the semiconductor layer 3203 having an amorphous structure should be approximately between $1 \times 10^{11}$ and $1 \times 10^{14}$ atoms/cm$^3$. As shown in FIG. 24B, the crystallization step is performed by thermal annealing, similarly to FIG. 23B, and a crystalline semiconductor layer 3205 can thus be obtained (See FIG. 24C)

By forming the island semiconductor layers from the crystalline semiconductor layers 3105 and 3205 manufactured in FIGS. 23A to 23C or FIGS. 24A to 24C, an active matrix substrate can be completed, similarly to Embodiment 1 and Embodiment 6. However, in crystallization process, if a catalyst element for promoting the crystallization of silicon is used, a small amount (about $1 \times 10^{17}$ to $1 \times 10^{19}$ atoms/cm$^3$) of the catalyst element remains within the island semiconductor layers. It is, of course, possible to complete the TFT in such a state, but it is preferred to remove the remaining catalyst element from at least the channel forming region. One of the means of removing this catalyst element is a means using gettering action of phosphorus (P).

Figure 25:
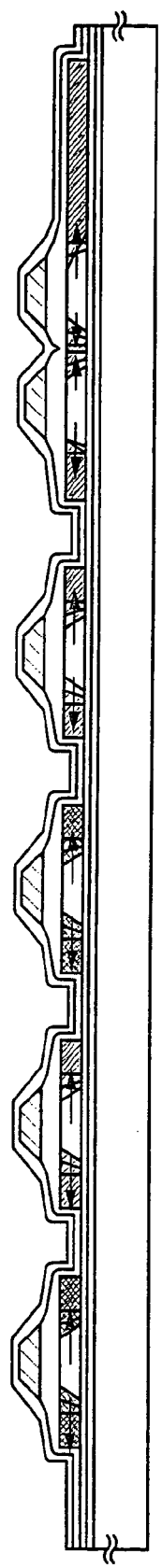
FIG. 25 is a cross-sectional view showing a process of manufacturing a crystalline semiconductor layer of Embodiment 8.

The gettering treatment with phosphorus used in this purpose may be performed together with the activation step. This state is explained with reference to FIG. 25. The concentration of phosphorus (P) necessary for gettering may be on a similar order as the impurity concentration of the high concentration n-type impurity regions, and the catalyst element can be segregated at this concentration from the channel forming regions of the n-channel TFT and the p-channel TFT, into the phosphorus (P) contained impurity regions, by the thermal annealing at the activation step. (direction of an arrow in FIG. 25) As a result, the catalyst element is segregated into the impurity regions at a concentration of about $1 \times 10^{17}$ to $1 \times 10^{19}$ atoms/cm$^3$. A TFT with good characteristics can be attained because the Off current value of a TFT manufactured in this way is reduced, and high electric field mobility is attained due to good crystallinity.

Embodiment 9

Figure 8A:
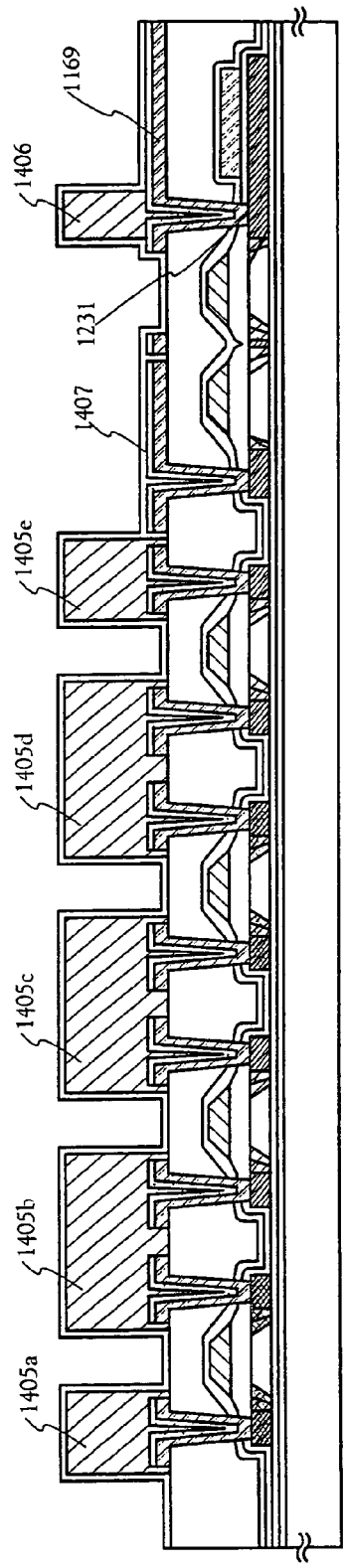
FIGS. 8A and 8B are cross-sectional views showing a process of manufacturing an active matrix liquid crystal display device of Embodiment 9.

A process of manufacturing an active matrix liquid crystal display device from the active matrix substrate fabricated in Embodiment 6 will be explained here in this Embodiment. As shown in FIG. 8A, first a spacer made from a column-shape spacer is formed on the active matrix substrate in the state of FIG. 18B. The spacer may be provided by a method of spraying several μm of grains. A method of forming the spacer by patterning after forming a resin film on the entire surface of the substrate is adopted here in this embodiment. The material for such kind of spacer is not limited. For example, using the JSR product NN700, after application to the substrate by a spinner, a predetermined pattern is formed by exposure and development treatment. Furthermore, it is cured by being heated in a clean oven at 150° C. to 200° C. The shape of the spacer formed in this way may be made different depending on the conditions of the exposure and development treatment. The spacer is formed so that its shape becomes a column-shape with a flat top, which is a preferred shape because when an opposing substrate is bonded to this substrate, its mechanical strength as a liquid crystal display panel can be ensured. The shape of the spacer such as a conical shape or a pyramid shape is not specially limited thereto. For example, when the spacer is a conical shape, its specific measurements are as follows: the height is set between 1.2 and 5 μm, the average radius is set between 5 and 7 μm, and the ratio of the average radius and the radius of the bottom portion is set to 1 to 1.5. The taper angle of the side surface at this point is ±15° or less.

The arrangement of the spacers may be arbitrarily determined, but preferably it is appropriate to form a column-shape spacer 1406 overlapping the contact area 1231 of the pixel electrode 1169 in the pixel portion so as to cover that overlapped portion as shown in FIG. 8A. Liquid crystal cannot be smoothly oriented in a portion where the levelness of the contact area 1231 has been ruined. Hence, the column-shape spacer 1406 is formed as in the form of filling the contact area 1231 with resin used for the spacer, whereby disclination or the like can be prevented. In addition, spacers 1405a to 1405e are formed on the TFT of the driver circuit. These spacers may be formed extending over the entire surface of the driver circuit portion, and may also be formed so as to cover the source wiring and the drain wiring as shown in FIG. 8A.

Thereafter, an orientation film 1407 is formed. A polyimide resin is generally used for the orientation film of a liquid crystal display device. After forming the orientation films, a rubbing treatment is performed so that the liquid crystal molecules are oriented with a certain fixed pre-tilt angle. The rubbing treatment is performed so that an area of 2 μm or less from the edge portion of the column-shape spacer 1406 provided in the pixel portion to the rubbing direction, is not rubbed. Further, since the generation of static electricity from the rubbing treatment is often a problem, an effect of protecting the TFT from the static electricity can be attained by forming the spacers 1405a to 1405e formed on the TFT of the driver circuit. Although not described in the figures, the substrate may have a structure in which the orientation film 1407 is formed before forming the spacers 1406 and 1405a to 1405e.

A light shielding film 1402, a transparent conductive film 1403, and an orientation film 1404 are formed on an opposing substrate 1401, which is opposed to the active matrix substrate. The light shielding film 1402 is formed of films such as a Ti film, a Cr film, and an Al film at a thickness of between 150 and 300 nm. Then, the active matrix substrate on which the pixel portion and the driver circuit are formed, and the opposing substrate are then joined together by a sealant 1408. A filler (not shown in the figures) is mixed into the sealant 1408, and the two substrates are joined together with a uniform spacing by the filler and the spacers 1406 and 1405a to 1405e. Next, a liquid crystal material 1409 is injected between both substrates. A known liquid crystal material may be used as the liquid crystal material.

For example, besides the TN liquid crystal, a thresholdness antiferroelectric mixed liquid crystal that indicates electro-optical response characteristics of continuously changing transmittance with respect to an electric field may also be used. Among such thresholdness antiferroelectric mixture liquid crystal, there is a type that indicates a V-shaped electro-optical response characteristic. In this way, the active matrix type liquid crystal display device shown in FIG. 8B is completed.

Figure 9:
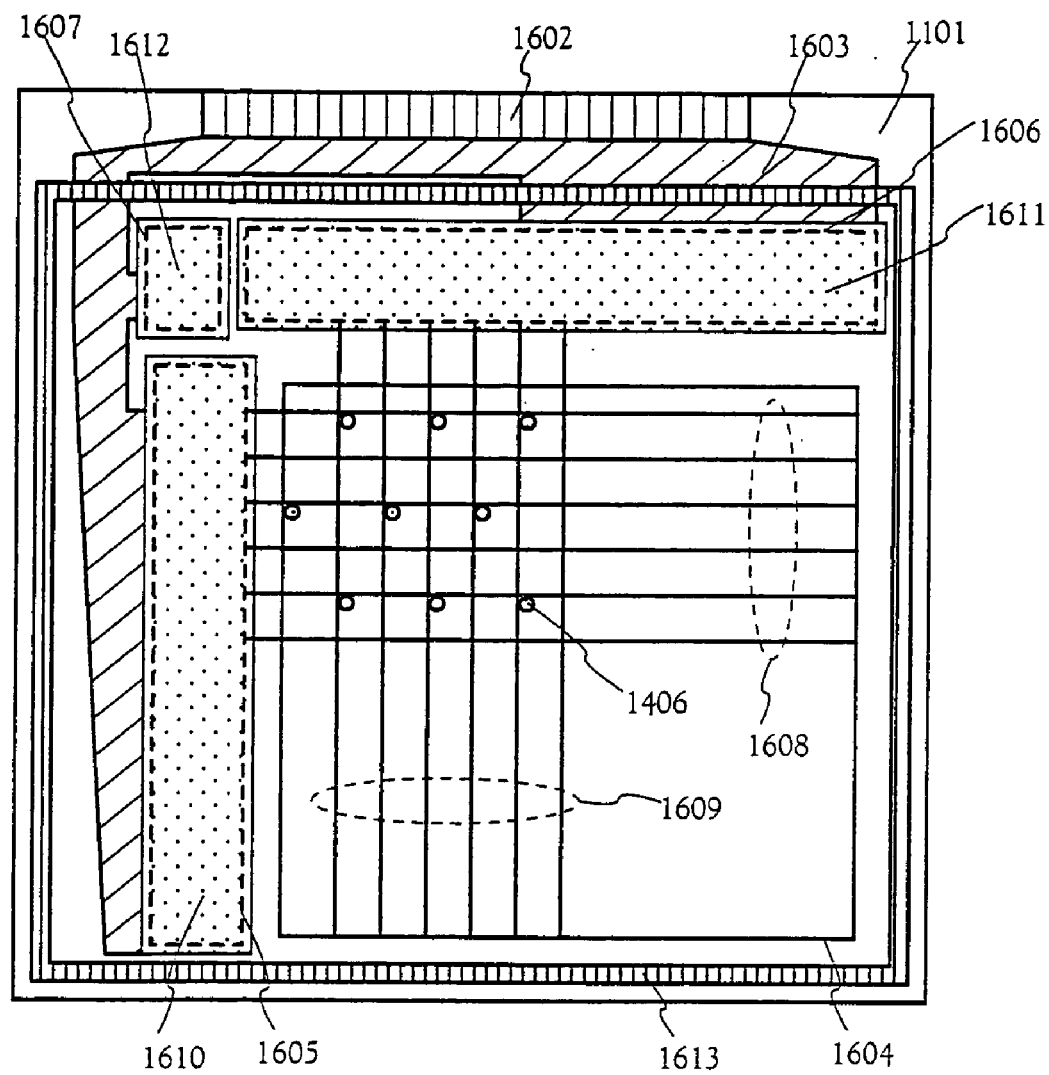
FIG. 9 is a top view showing a layout of an input/output terminal, wiring, circuits, spacers and sealing material of the liquid crystal display device of Embodiment 9.

FIG. 9 is a top view showing this type of active matrix substrate and the positional relation of the pixel portion and the driver circuit portion versus the spacers and the sealant. A scanning signal driver circuit 1605 and an image signal driver circuit 1606 as driver circuits are provided in the periphery of a pixel portion 1604 on the glass substrate 1101 described in Embodiment 1. In addition, a signal processing circuit 1607 such as a CPU or a memory circuit may also be added. Then these driver circuits are connected to an external input/output terminal 1602 by a connecting wiring 1603. In the pixel portion 1604, a set of gate wirings 1608 extending from the scanning signal driver circuit 1605 and a set of source wirings 1609 extending from the image signal driver circuit 1606 intersect in matrix to form pixels. Each pixel is provided with the pixel TFT 1204 and the storage capacitor 1205.

Figure 8B:
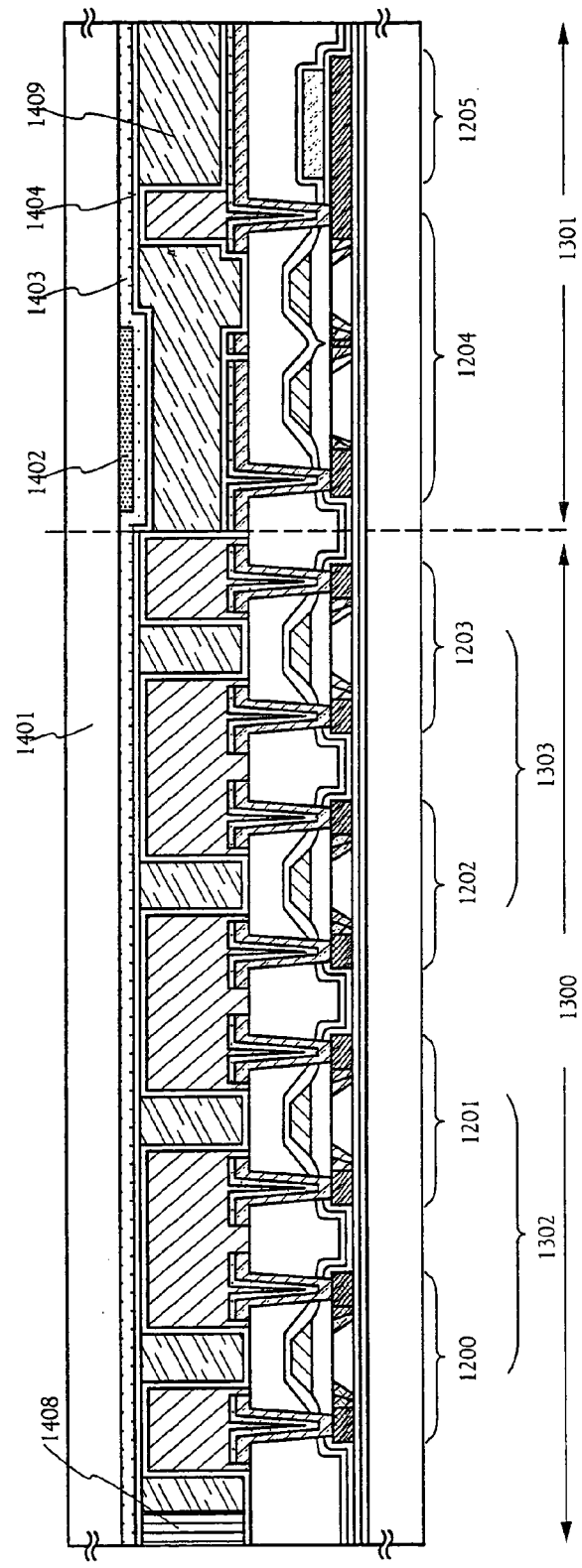

In FIGS. 8A and 8B, the column-shape spacer 1406 provided in the pixel portion may be provided not only to every pixel, but also to every several pixels or several tens of the pixels arranged in a matrix manner as shown in FIG. 9. In other words, it is possible to set the ratio of the total number of pixels composing the pixel portion to the number of spacers between 20% and 100%. In addition, the spacers 1405a to 1405e provided in the driver circuits portion may be formed so as to cover the entire surface of the circuits, or may be provided in accordance with the position of the source wiring and the drain wiring of each TFT. In FIG. 9, reference numerals 1610 to 1612 denote the arrangement of the spacers provided in the driver circuit portion. In FIG. 9, the sealant 1613 is formed on the exterior of the pixel portion 1604, the scanning signal driver circuit 1605, the image signal driver circuit 1606, and the signal processing circuit 1607 of the other circuits, and on the interior of an external input/output terminal 1602, that are formed over the substrate 1101.

A liquid display device with this kind of structure can be formed by using the active matrix substrate described in Embodiments 6 or 7. The reflection type liquid crystal display device can be attained with employment of the active matrix substrate shown in Embodiment 6 whereas the transmission type liquid crystal display device can be attained with employment of the active matrix substrate shown in Embodiment 7.

Embodiment 10

In this embodiment, the semiconductor devices (electrical devices) which are built into an active matrix type liquid crystal device are explained. The following can be given as such semiconductor device: a video camera, a digital camera, a digital vide disk player, a projector (rear type or front type), a head-mounted display (a goggle type display), a personal computer, and a portable information terminal (such as a mobile computer, a portable telephone or an electronic book). Examples of these are shown in FIGS. 26A to 26F, 27A to 27D and 28A to 28C.

Figure 26A:
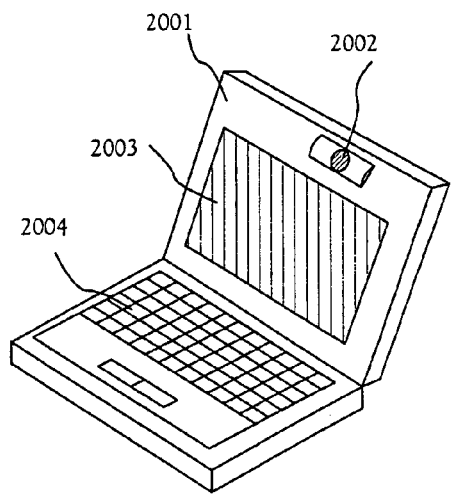
FIGS. 26A to 26F are diagrams showing examples of semiconductor devices of Embodiment 10.

FIG. 26A is a personal computer, and it includes a main body 2001, an image input portion 2002, a display portion 2003, and a keyboard 2004, etc. The present invention can be applied to the image input portion 2002, the display portion 2003 or other signal controlling circuits.

Figure 26B:
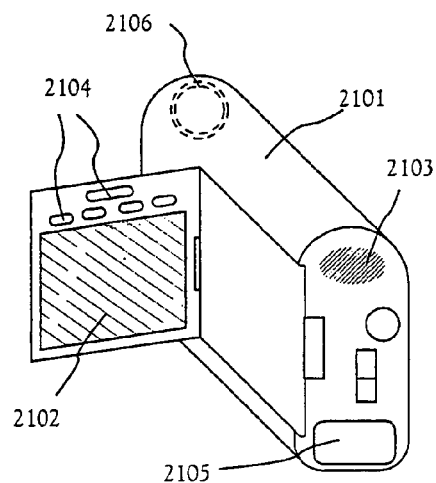

FIG. 26B is a video camera, and it includes a main body 2101, a display portion 2102, an audio input portion 2103, operation switches 2104, a battery 2105, and an image receiving portion 2106, etc. The present invention can be applied to the display portion 2102 or other signal controlling circuits.

Figure 26C:
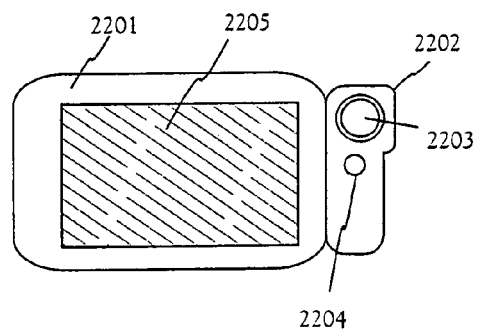

FIG. 26C is a mobile computer, and it includes a main body 2201, a camera portion 2202, an image receiving portion 2203, operation switches 2204, and a display portion 2205. The present invention can be applied to the display portion 2205 or other signal controlling circuits.

Figure 26D:
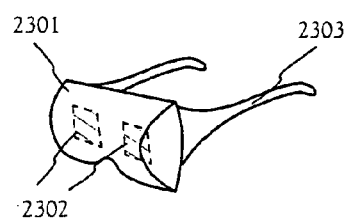

FIG. 26D is a goggle type display, and it includes a main body 2301, a display portion 2302, an arm portion 2303, etc. The present invention can be applied to the display portion 2302 or other signal controlling circuits.

Figure 26E:
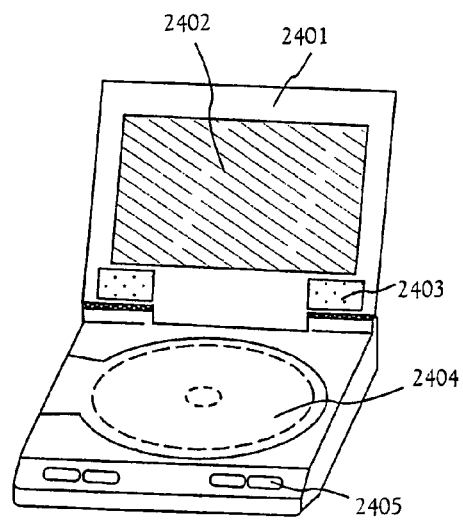

FIG. 26E is a player that uses a recording medium on which a program is recorded (hereafter referred to as a recording medium), and the player includes a main body 2401, a display portion 2402, a speaker portion 2403, a recording medium 2404, and operation switches 2405, etc. Note that this player uses a recording medium such as a DVD (digital versatile disk) or a CD, and the appreciation of music, the appreciation of film, game playing and the Internet can be performed. The present invention can be applied to the display portion 2402 or other signal controlling circuits.

Figure 26F:
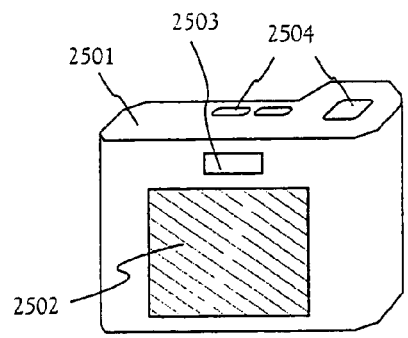

FIG. 26F is a digital camera, and it includes a main body 2501, a display portion 2502, an eyepiece portion 2503, operation switches 2504, and an image receiving portion (not shown in the figure), etc. The present invention can be applied to the display portion 2502 or other signal controlling circuits.

FIG. 27A is a front projector, and it includes a projection system 2601, a screen 2602, etc. The present invention can be applied to a liquid crystal display device 2808 which constitutes a part of the projection system 2601, or other signal controlling circuits.

FIG. 27B is a rear projector, and it includes a main body 2701, a projection system 2702, a mirror 2703, a screen 2704, etc. The present invention can be applied to a liquid crystal display device 2808 which constitutes a part of the projection system 2702 or other signal controlling circuits.

Note that FIG. 27C is a diagram showing an example of the structure of projection systems 2601 and 2702 of FIGS. 27A and 27B. The projection systems 2601 and 2702 comprise an optical light source system 2801, mirrors 2802 and 2804 to 2806, a dichroic mirror 2803, a prism 2807, a liquid crystal display device 2808, phase differentiating plate 2809 and a projection optical system 2810. The projection optical system 2810 comprises an optical system including a projection lens. The present embodiment showed a three plate type, but it is not limited to this structure, and it may be for instance a single plate type. Further, the operator may appropriately dispose an optical system such as an optical lens, a film having light polarizing function, a film for adjusting phase difference and an IR film, in the optical path shown by an arrow in the FIG. 27C.

FIG. 27D is a diagram showing an example of the structure of the optical light source system 2801 of FIG. 27C. In the present embodiment the optical light source system 2801 comprises a reflector 2811, a light source 2812, lens arrays 2813 and 2814, light polarizing conversion element 2815 and a condenser lens 2816. Note that the optical light source system shown in FIG. 27D is merely an example and is not specifically limited. For example, the operator may appropriately dispose an optical system such as an optical lens, a film having light polarizing function, a film for adjusting phase difference and an IR film, etc., in the optical light source system.

Note, the projectors shown in FIG. 27 show a case of using a transmission type electro-optical device and an application example of a reflection type electro-optical device is not shown in the figures.

Figure 28A:
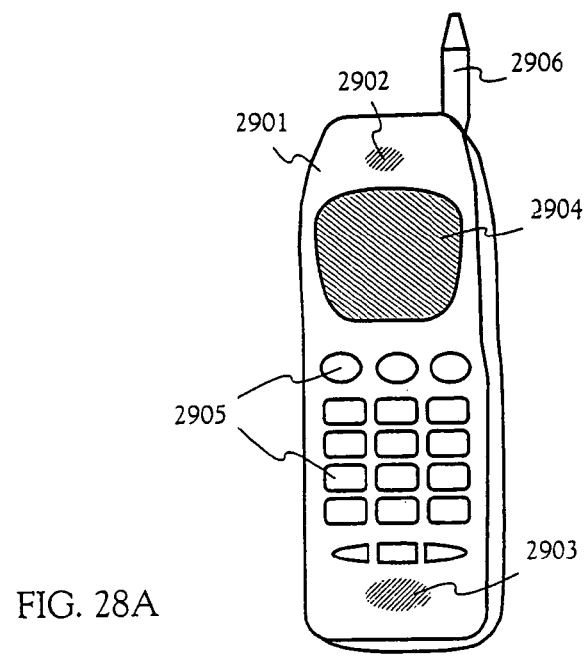
FIGS. 28A to 28C are diagrams showing examples of semiconductor devices of Embodiment 10.

FIG. 28A is a portable telephone, and it includes a main body 2901, an audio output portion 2902, an audio input portion 2903, a display portion 2904, operation switches 2905, and an antenna 2906, etc. The present invention can be applied to the audio output portion 2902, the audio input portion 2903, the display portion 2904 or other signal controlling circuits.

Figure 28B:
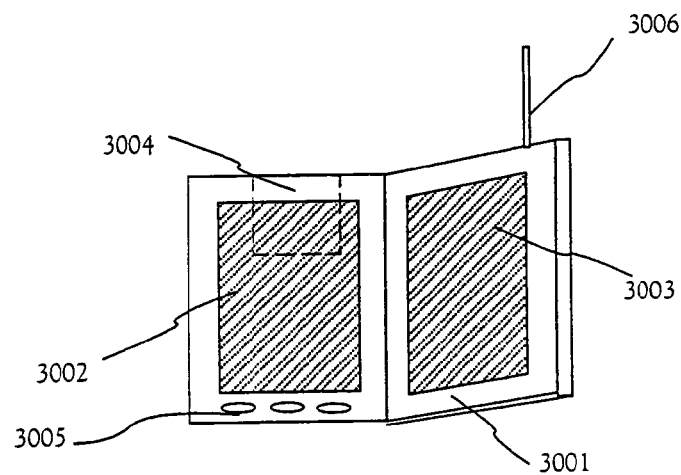

FIG. 28B is a portable book (electronic book), and it includes a main body 3001, display portions 3002 and 3003, a recording medium 3004, operation switches 3005, and an antenna 3006, etc. The present invention can be applied to the display portions 3002 and 3003 or other signal circuits.

Figure 28C:
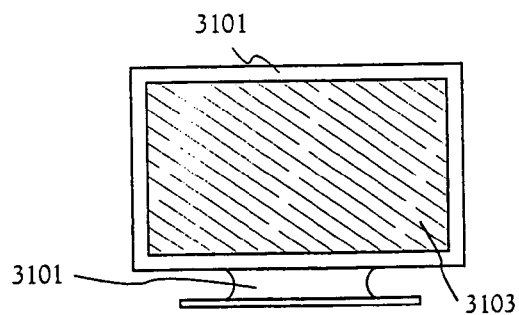

FIG. 28C is a display, and it includes a main body 3101, a support stand 3102, and a display portion 3103, etc. The present invention can be applied to the display portion 3103. The display of the present invention is advantageous for a large size screen in particular, and is advantageous for a display equal to or greater than 10 inches (especially equal to or greater than 30 inches) in the opposite angle.

The applicable range of the present invention is thus extremely wide, and it is possible to apply the present invention to semiconductor device in all fields. Further, the semiconductor device of this embodiment can be realized by using a constitution of any combination of embodiments 1 to 9.

Embodiment 11

An example of manufacturing an EL (electroluminescence) display device using the present invention is explained in this embodiment. The EL display device is also called as a light emitting device or a light emitting diode. In addition, the EL (electroluminescence) device referred to this specification includes triplet-based light emission devices and/or singlet-based light emission devices, for example.

Figure 29A:
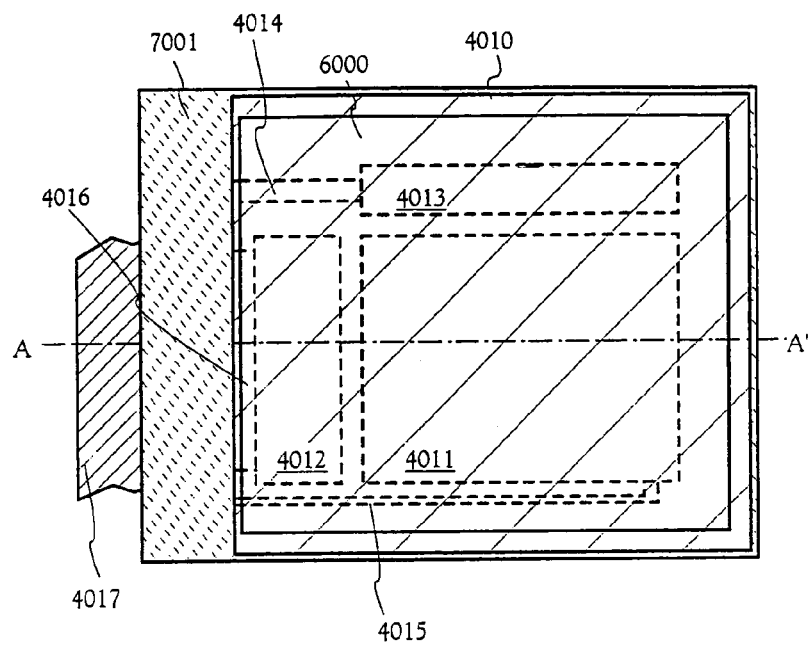
FIGS. 29A and 29B are diagrams showing the structure of an EL display device of Embodiment 11.

FIG. 29A is a top view of an EL display device using the present invention. In FIG. 29A, reference numeral 4010 is a substrate, reference numeral 4011 is a pixel portion, reference numeral 4012 is a source side driver circuit, and reference numeral 4013 is a gate side driver circuit. The driver circuits are connected to external equipment, through an FPC 4017, via wirings 4014 to 4016.

A covering material 6000, a sealing material (also referred to as a housing material) 7000, and an airtight sealing material (a second sealing material) 7001 are formed so as to enclose at least the pixel portion, preferably the driver circuits and the pixel portion, at this point.

Figure 29B:
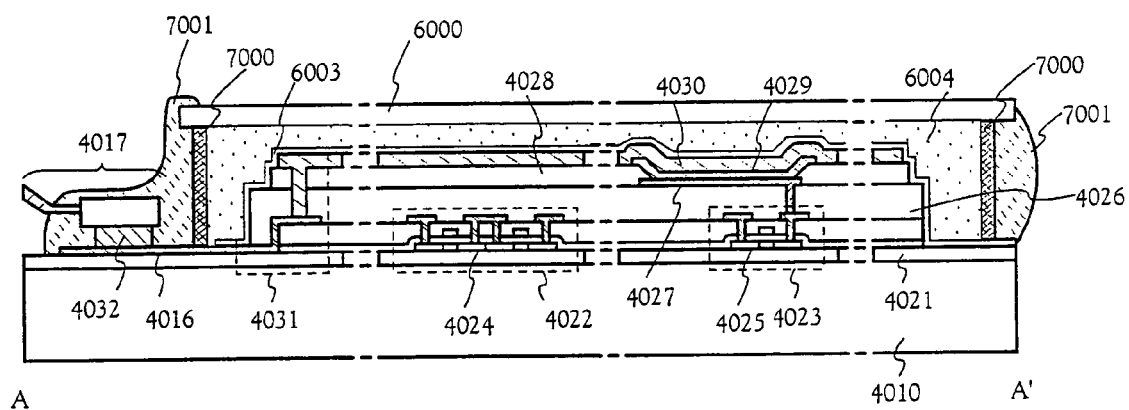

Further, FIG. 29B is a cross sectional structure of the EL display device of the present invention. A driver circuit TFT 4022 (note that a CMOS circuit in which an n-channel TFT and a p-channel TFT are combined is shown in the figure here), a pixel portion TFT 4023 (note that only a TFT for controlling the current flowing to an EL element is shown here) are formed on a base film 4021 on a substrate 4010.

After the driver circuit TFT 4022 and the pixel portion TFT 4023 are completed, a pixel electrode 4027 is formed on an interlayer insulating film (leveling film) 4026 made from a resin material. The pixel electrode is formed from a transparent conductive film for electrically connecting to a drain of the pixel TFT 4023. An indium oxide and tin oxide compound (referred to as ITO) or an indium oxide and zinc oxide compound can be used as the transparent conducting film. An insulating film 4028 is formed after forming the pixel electrode 4027, and an open portion is formed on the pixel electrode 4027.

An EL layer 4029 is formed next. The EL layer 4029 may be formed having a lamination structure, or a single layer structure, by freely combining known EL materials (such as a hole injecting layer, a hole transporting layer, a light emitting layer, an electron transporting layer, and an electron injecting layer). A known technique may be used to determine which structure to use. Further, EL materials exist as low molecular weight materials and high molecular weight (polymer) materials. Evaporation is used when using a low molecular weight material, but it is possible to use easy methods such as spin coating, printing, and ink jet printing when a high molecular weight material is employed.

In this embodiment, the EL layer is formed by evaporation using a shadow mask. Color display becomes possible by forming emitting layers (a red color emitting layer, a green color emitting layer, and a blue color emitting layer), capable of emitting light having different wavelengths, for each pixel using a shadow mask. In addition, methods such as a method of combining a charge coupled layer (CCM) and color filters, and a method of combining a white color light emitting layer and color filters may also be used. Of course, the EL display device can also be made to emit a single color of light.

After forming the EL layer 4029, a cathode 4030 is formed on the EL layer. It is preferable to remove as much as possible any moisture or oxygen existing in the interface between the cathode 4030 and the EL layer 4029. It is therefore necessary to use a method of depositing the EL layer 4029 and the cathode 4030 in an inert gas atmosphere or within a vacuum. The above film deposition becomes possible in this embodiment by using a multi-chamber method (cluster tool method) film deposition apparatus.

Note that a lamination structure of a LiF (lithium fluoride) film and an Al (aluminum) film is used as the cathode 4030. Specifically, a 1 nm thick LiF (lithium fluoride) film is formed by evaporation on the EL layer 4029, and a 300 nm thick aluminum film is formed on the LiF film. An MgAg electrode, a known cathode material, may of course also be used. The wiring 4016 is then connected to the cathode 4030 in a region denoted by reference numeral 4031. The wiring 4016 is an electric power supply line for imparting a predetermined voltage to the cathode 4030, and is connected to the FPC 4017 through a conducting paste material 4032.

In order to electrically connect the cathode 4030 and the wiring 4016 in the region denoted by reference numeral 4031, it is necessary to form a contact hole in the interlayer insulating film 4026 and the insulating film 4028. The contact holes may be formed at the time of etching the interlayer insulating film 4026 (when forming a contact hole for the pixel electrode) and at the time of etching the insulating film 4028 (when forming the opening portion before forming the EL layer). Further, when etching the insulating film 4028, etching may be performed all the way to the interlayer insulating film 4026 at one time. A good contact hole can be formed in this case, provided that the interlayer insulating film 4026 and the insulating film 4028 are the same resin material.

A passivation film 6003, a filling material 6004, and the covering material 6000 are formed covering the surface of the EL element thus made.

In addition, the sealing material 7000 is formed between the covering material 6000 and the substrate 4010, so as to surround the EL element portion, and the airtight sealing material (the second sealing material) 7001 is formed on the outside of the sealing material 7000.

The filling material 6004 functions as an adhesive for bonding the covering material 6000 at this point. PVC (polyvinyl chloride), epoxy resin, silicone resin, PVB (polyvinyl butyral), and EVA (ethylene vinyl acetate) can be used as the filling material 6004. If a drying agent is formed on the inside of the filling material 6004, then it can continue to maintain a moisture absorbing effect, which is preferable.

Further, spacers may be contained within the filling material 6004. The spacers may be a powdered substance such as BaO, giving the spacers themselves the ability to absorb moisture.

When using spacers, the passivation film 6003 can relieve the spacer pressure. Further, a film such as a resin film can be formed separately from the passivation film 6003 to relieve the spacer pressure.

Furthermore, a glass plate, an aluminum plate, a stainless steel plate, an FRP (fiberglass-reinforced plastic) plate, a PVF (polyvinyl fluoride) film, a Mylar film, a polyester film, and an acrylic film can be used as the covering material 6000. Note that if PVB or EVA is used as the filling material 6004, it is preferable to use a sheet with a structure in which several tens of μm of aluminum foil is sandwiched by a PVF film or a Mylar film.

However, depending upon the light emission direction from the EL element (the light irradiating direction), it is necessary for the covering material 6000 to have light transmitting characteristics.

Further, the wiring 4016 is electrically connected to the FPC 4017 through a gap between the sealing material 7001 and the substrate 4010. Note that although an explanation of the wiring 4016 has been made here, the wirings 4014 and 4015 are also electrically connected to the FPC 4017 by similarly passing underneath the sealing material 7001 and sealing material 7000.

Embodiment 12

Figure 30A:
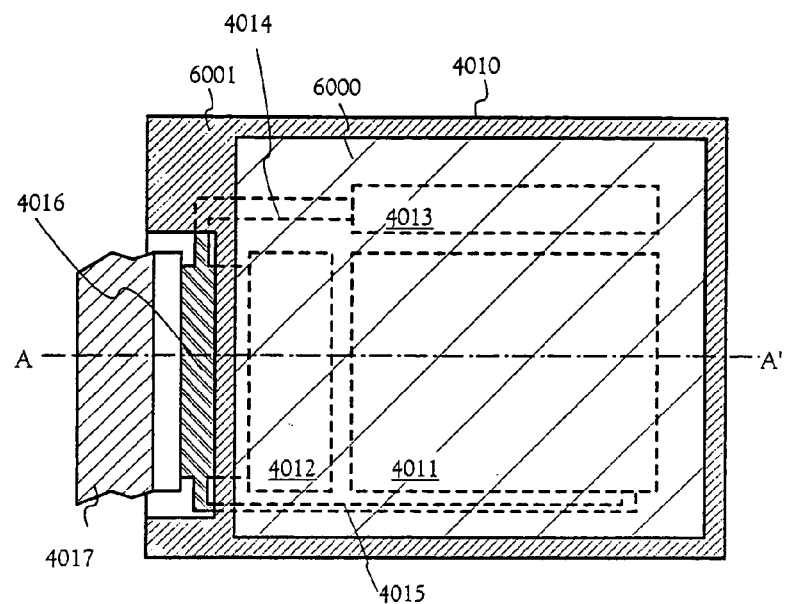
FIGS. 30A and 30B are diagrams showing the structure of an EL display device of Embodiment 12.
Figure 30B:
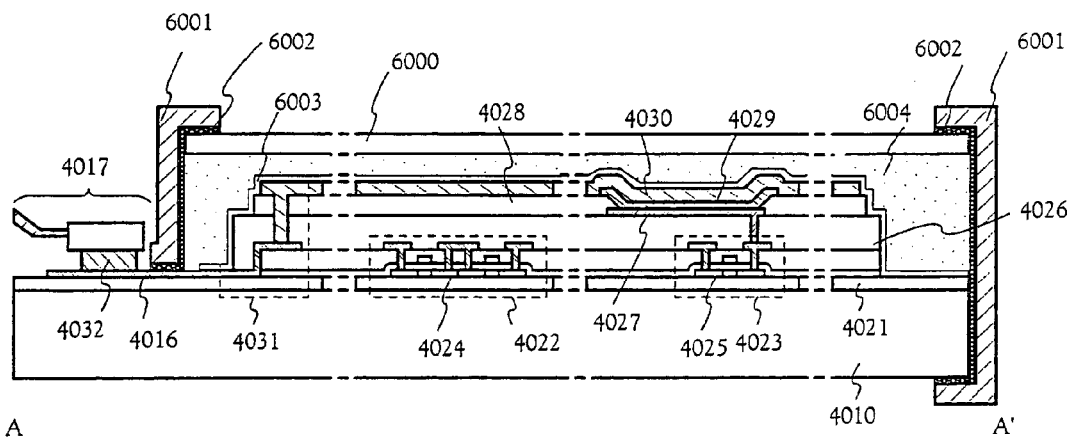

In this embodiment, an example of manufacturing an EL display device having a structure which differs from that of Embodiment 11 is explained using FIGS. 30A and 30B. Parts having the same reference numerals as those of FIGS. 29A and 29B indicate the same portions, and therefore an explanation of those parts is omitted.

FIG. 30A is a top view of an EL display device of this embodiment, and FIG. 30B shows a cross sectional diagram in which FIG. 30A is cut along the line A–A'.

In accordance with Embodiment 11, manufacturing is performed through the step of forming the passivation film 6003 covering the EL element.

In addition, the filling material 6004 is formed so as to cover the EL element. The filling material 6004 also functions as an adhesive for bonding the covering material 6000. PVC (polyvinyl chloride), epoxy resin, silicone resin, PVB (polyvinyl butyral), and EVA (ethylene vinyl acetate) can be used as the filling material 6004. If a drying agent is provided on the inside of the filling material 6004, then it can continue to maintain a moisture absorbing effect, which is preferable.

Further, spacers may be contained within the filling material 6004. The spacers may be a powdered substance such as BaO, giving the spacers themselves the ability to absorb moisture.

When using spacers, the passivation film 6003 can relieve the spacer pressure. Further, a film such as a resin film can be formed separately from the passivation film 6003 to relieve the spacer pressure.

Furthermore, a glass plate, an aluminum plate, a stainless steel plate, an FRP (fiberglass-reinforced plastic) plate, a PVF (polyvinyl fluoride) film, a Mylar film, a polyester film, and an acrylic film can be used as the covering material 6000. Note that if PVB or EVA is used as the filler material 6004, it is preferable to use a sheet with a structure in which several tens of μm of aluminum foil is sandwiched by a PVF film or a Mylar film.

However, depending upon the light emission direction from the EL element (the light irradiating direction), it is necessary for the covering material 6000 to have light transmitting characteristics.

After bonding the covering material 6000 using the filling material 6004, the frame material 6001 is attached so as to cover the lateral surfaces (exposed surfaces) of the filling material 6004. The frame material 6001 is bonded by the sealing material (which functions as an adhesive) 6002. It is preferable to use a light hardening resin as the sealing material 6002 at this point, but provided that the heat resistance characteristics of the EL layer permit, a thermal hardening resin may also be used. Note that it is preferable that the sealing material 6002 be a material which, as much as possible, does not transmit moisture and oxygen. Further, a drying agent may also be added to an inside portion of the sealing material 6002.

The wiring 4016 is electrically connected to the FPC 4017 through a gap between the sealing material 6002 and the substrate 4010. Note that although an explanation of the wiring 4016 has been made here, the wirings 4014 and 4015 are also electrically connected to the FPC 4017 by similarly passing underneath the sealing material 6002.

Embodiment 13

Figure 31:
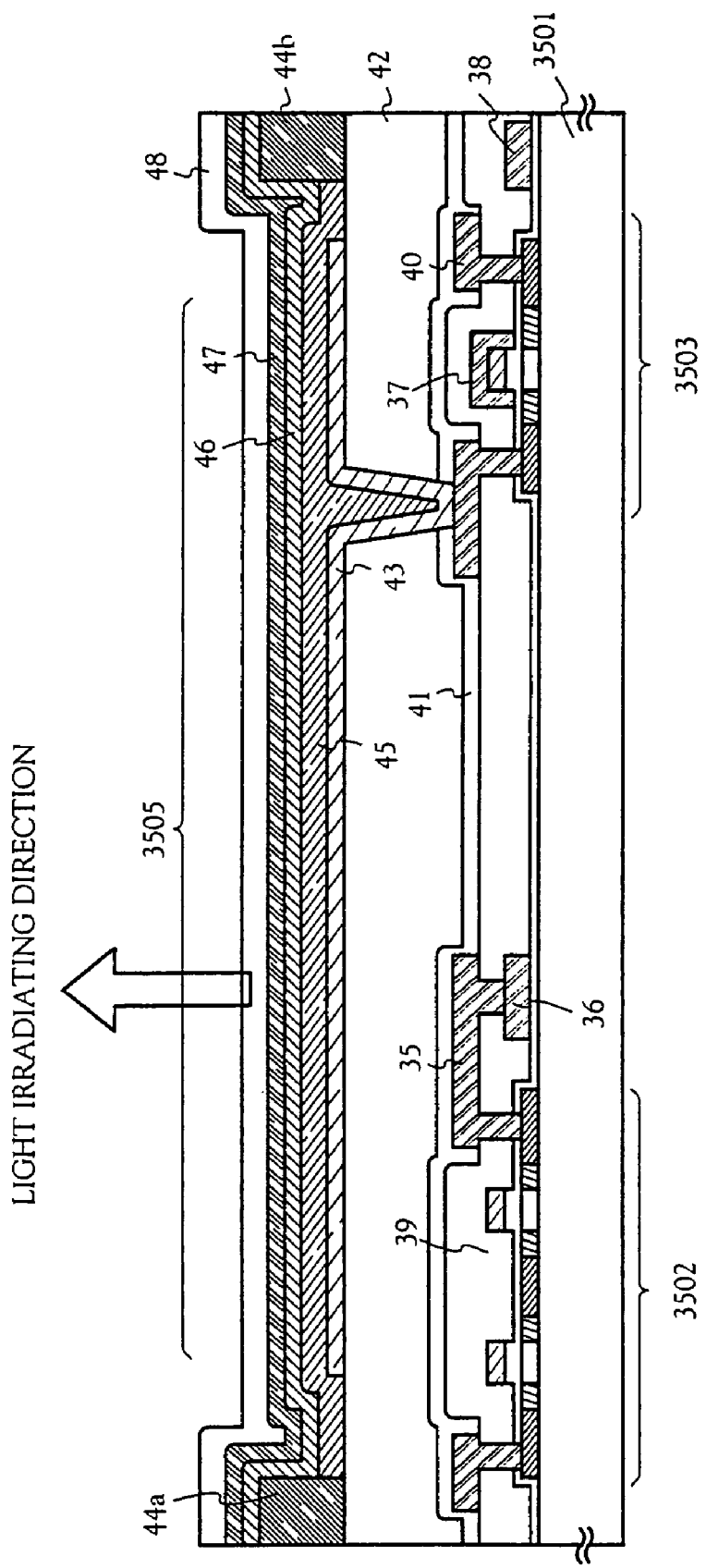
FIG. 31 is a diagram showing the structure of an EL display device of Embodiment 13.
Figure 32A:
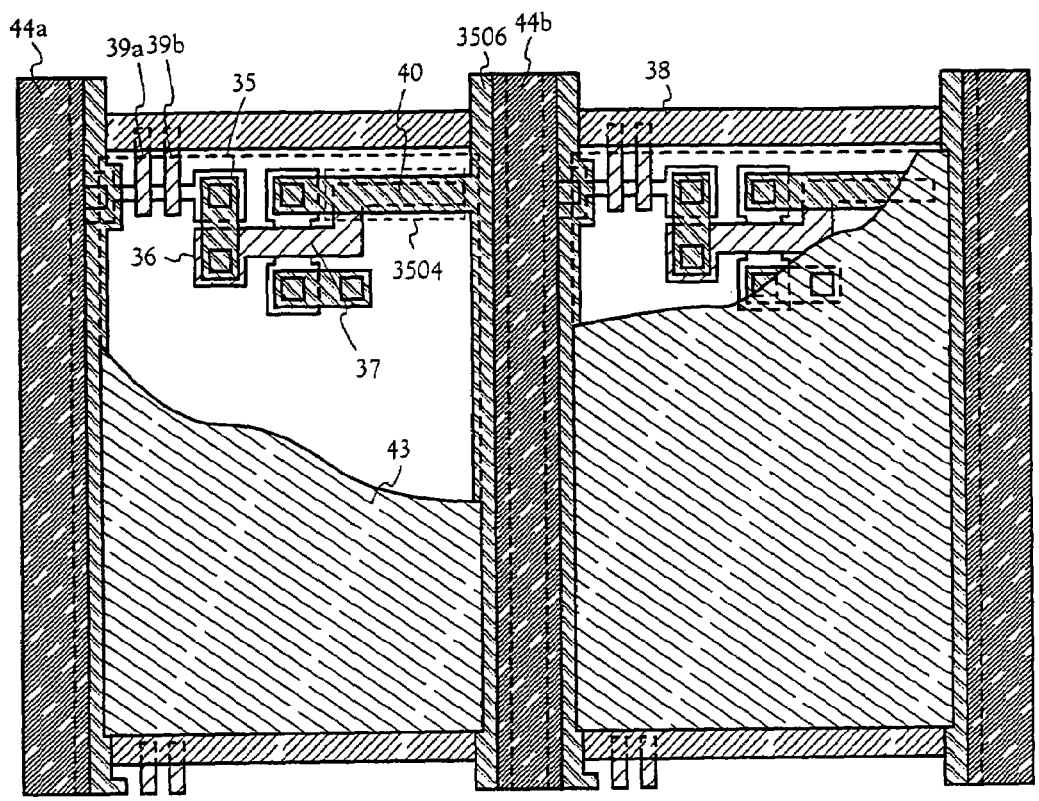
FIGS. 32A and 32B are diagrams showing the structure of an EL display device of Embodiment 13.
Figure 32B:
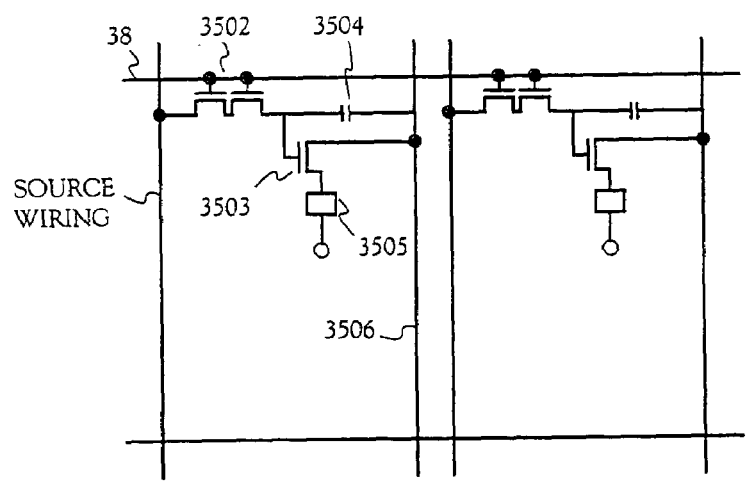

FIG. 31 is a cross-sectional view of details of the structure of the pixel portion in an EL display panel, FIG. 32A is a top view of the structure, and FIG. 32B is a circuit diagram of the pixel portion. Common reference numerals are used in FIGS. 31, 32A and 32B to enable cross-reference.

Referring to FIG. 31, a switching TFT 3502 is formed by using the n-channel type TFT of the present invention (see Embodiments 1 to 9). In this embodiment, a double-gate structure is used. The structure and the manufacturing process of this embodiment are substantially the same as those of the above-described embodiment. Therefore, the description for them will not be repeated. In the double-gate structure used in this embodiment, two TFTs are connected substantially in series, so that the off current value is advantageously reduced. While in this embodiment the double-gate structure is formed, a single-gate structure, a triple-gate structure or a multi-gate structure having four or more gate electrodes may be formed. Also, a p-channel type TFT may constitute the display device.

The current control TFT 3503 is formed by using the n-channel type TFT of the present invention (see Embodiments 1 to 9). A drain wiring 35 of the switching TFT 3502 is electrically connected to a gate electrode 37 of the switching TFT 3502 via wiring 36. Wiring indicated by 38 is gate wiring for electrically connecting gate electrodes 39a and 39b of the switching TFT 3502.

Since the current control TFT is an element for controlling the current flowing through an EL element, a large current flows therethrough and entails a strong risk of degradation due to heat or hot carriers. Therefore, the structure of the present invention in which an LDD region is provided on the drain side of the current control TFT so as to overlap the gate electrode with a gate insulating film interposed therebetween is highly advantageous.

Figure 35A:
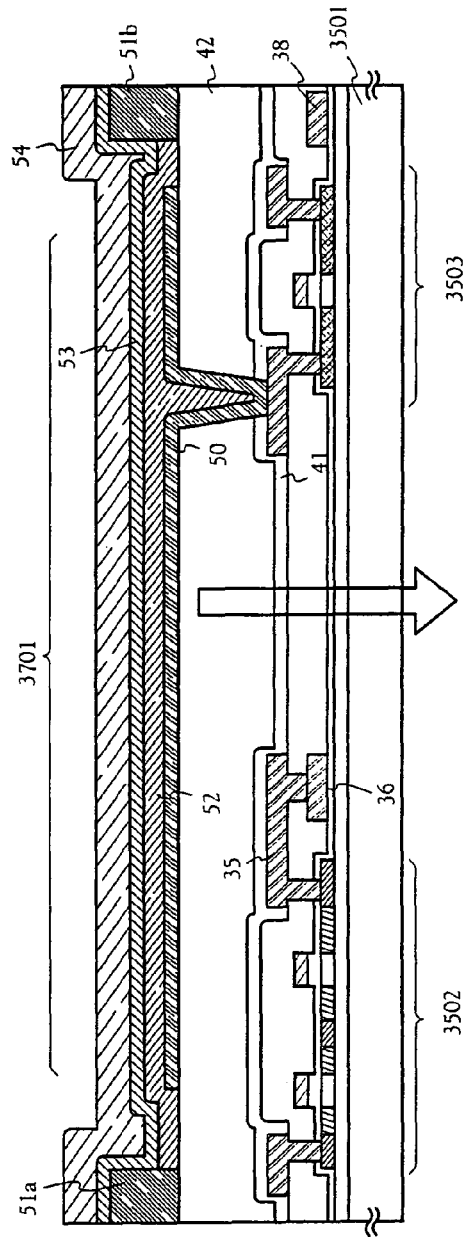
FIGS. 35A and 35B are diagrams showing the structure of an EL display device of Embodiment 13.
Figure 35B:
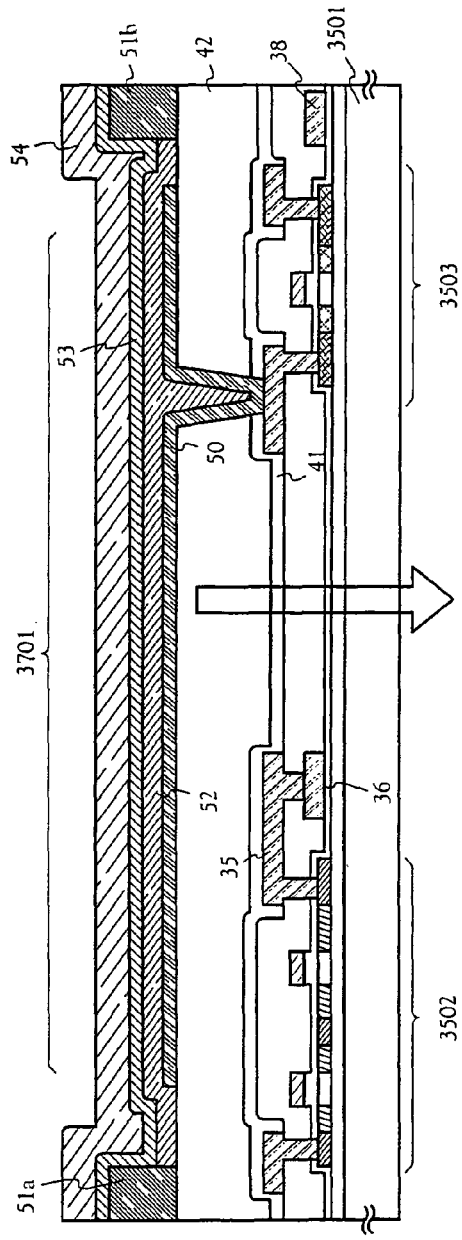

However, if the drive voltage is 10 V or lower (typically, 5V or lower), the device is free from the above-described problem. Under such a condition, therefore, a TFT constructed in such a manner that, in a semiconductor layer, a source region and a drain region are provided on the opposite sides of a channel forming region, as shown in FIG. 35A, may be used as current control TFT 3503. Alternatively, a TFT constructed in such a manner that, in a semiconductor layer, LDD regions are formed on the opposite sides of a channel forming region and a source region and a drain region are provided outside the LDD regions, as shown in FIG. 35B, may be used.

In this embodiment, the single-gate structure of the current control TFT 3503 is illustrated. However, the TFT 3503 may alternatively has a multi-gate structure in which a plurality of TFTs are connected in series, or a structure in which a plurality of TFTs are connected parallel in such a manner as to form a plurality of divided channel forming regions substantially separate from each other, enabling efficient heat dissipation. This structure is effectively used as means for limiting degradation caused by heat.

As shown in FIG. 32A, the wiring forming the gate electrode 37 of the current control TFT 3503 overlaps a drain wiring 40 of the current control TFT 3503 in a region indicated by 3504, with an insulating film interposed therebetween. In the region indicated by 3504, a capacitor is formed. This capacitor 3504 functions as a capacitor for holding a voltage applied to the gate of the current control TFT 3503. The drain wiring 40 is connected to a current supply line (power supply line) 3506, and a constant voltage is always applied to the drain wiring 40.

A first passivation film 41 is formed over the switching TFT 3502 and the current control TFT 3503, and a leveling film 42, which is formed of an insulating resin film, is formed on the passivation film 41. It is very important to eliminate differences in level resulting from the formation of the TFTs. An EL layer formed after this film is extremely thin, and there is a possibility of occurrence of light emission failure in the EL layer. Therefore, it is desirable to level the surface on which the EL layer is formed in order to maximize the flatness of the EL layer.

A pixel electrode (cathode of the EL element) indicated by 43 is a conductive film having high reflectivity. The pixel electrode 43 is electrically connected to the drain of the current-control TFT 3503. To form the pixel electrode 43, a low-resistance conductive film, such as an aluminum alloy film, a copper alloy film, a silver alloy film or a lamination film formed of some of these films is preferably used. Needless to say, such a film may be combined with any other conductive film to form a lamination structure.

A light emitting layer 45 is formed in a groove (corresponding to a pixel) formed between banks 44a and 44b, which are formed of an insulating film (preferably, a resin). While only one pixel is illustrated with respect to this embodiment, light emitting layers corresponding to three colors, red (R), green (G), and blue (B) may be separately formed. As an organic EL material for forming the light emitting layer, a π-conjugated polymeric material is used.

Example of typical polymeric materials usable for this purpose are poly-para-phenylene-vinylene (PPV) resins, polyvinyl carbazole (PVK) resins, and polyolefin resins.

There are various PPV organic EL materials. For example, a suitable material may be selected from those described in "H. Shenk, H. Becker, O. Gelsen, E. Kluge, W. Kreuder, and H. Spreitzer, "Polymers for Light Emitting Diodes", Euro Display, Proceedings, 1999, p. 33–37" and in Japanese Patent Application Laid-Open No. Hei 10-92576.

More specifically, in light-emitting layers, cyano-polyphenylene-vinylene may be used for a red light-emitting layer, polyphenylene-vinylene for a green light-emitting layer, and polyphenylene-vinylene or polyalkylphenylene for a blue light-emitting layer. The film thickness may be set to 30 to 150 nm (preferably, 40 to 100 nm).

However, these materials are only examples of organic EL materials usable for the light emitting layer according to the present invention. Materials used in accordance with the present invention are not limited these examples. A combination of materials for a light emitting layer, a charge transport layer, and a charge injection layer may be freely selected to form an EL layer (layer for emitting light and for causing transfer of carriers for emitting light).

For example, while an example of use of a polymeric material for a light emitting layer has been described, low-molecular organic EL material may alternatively be used. An inorganic material such as silicon carbide may be used as a charge transport layer or a charge injection layer. Well-known materials may be used as these organic EL materials and inorganic materials.

In this embodiment, an EL layer of a lamination structure is used in which a hole injection layer 46 formed of polythiophene (PEDOT) or polyaniline (PAni) is formed on light emitting layer 45. Also, an anode 47 formed by a transparent conductive film is formed on the hole injection layer 46. In this embodiment, light produced by the light emitting layer 45 is emitted to the upper surface side (above the TFT). Therefore, it is necessary that the anode be transparent. To form a transparent conductive film, a compound of indium oxide and tin oxide or a compound of indium oxide and a zinc oxide may be used. However, since a transparent conductive film is formed after the formation of the light emitting layer and the hole injection layer with low resistance to heat, a material capable of being formed at as low a temperature as possible, is preferred.

When the anode 47 is formed, the EL element 3505 is completed. The EL element 3505 referred to in this description denotes a capacitor formed by the pixel electrode (cathode) 43, the light emitting layer 45, the hole injection layer 46 and the anode 47. As shown in FIG. 32A, the area of the pixel electrode 43 coincide generally with the pixel area, and the entire pixel portion functions as one EL element. Therefore, the efficiency of use of emitted light is markedly high and an image can be displayed at a high luminance.

In this embodiment, a second passivation film 48 is further provided on the anode 47. Preferably, a silicon nitride film or a silicon oxide nitride film is formed as second passivation film 48. This film is provided for shielding of the EL element from the outside. It is intended to prevent oxidization of the organic EL materials as well as to prevent degassing from the organic EL materials. Thus, the reliability of the EL display device is improved.

As described above, the EL display panel of the present invention has a pixel portion having pixel constructed as shown in FIG. 31 and constituted of a switching TFT having a sufficiently small off current value and a current control TFT having a high anti-hot carrier effect. Thus, an EL display panel having improved reliability and capable of favorable image display can be obtained.

The arrangement of this embodiment can be freely combined with any of the arrangements of Embodiment 1 to 9 in implementation of the present invention. The EL display panel of this embodiment can be effectively used as a display unit for the electrical device in Embodiment 10.

Embodiment 14

Figure 33:
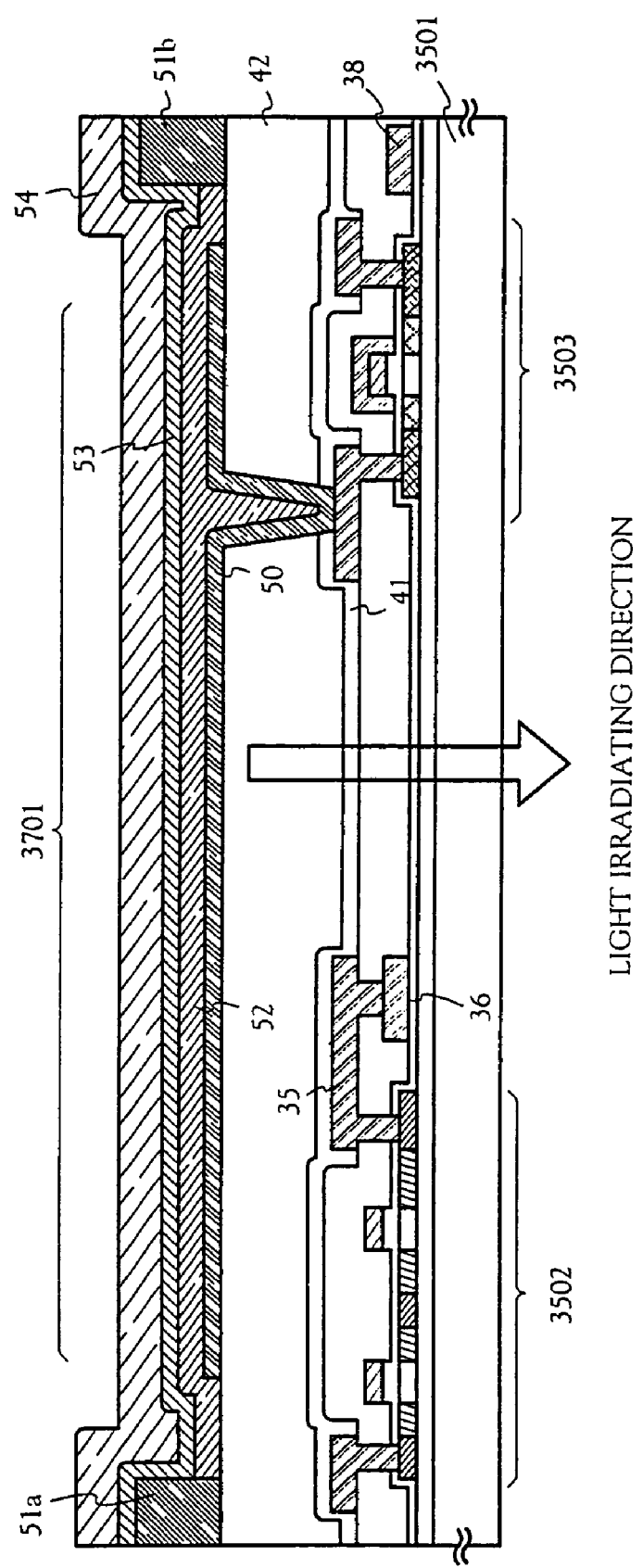
FIG. 33 is a diagram showing the structure of an EL display device of Embodiment 14.

In this embodiment, there will be described a construction in which the structure of the EL element 3505 is reversed in the pixel portion stated in Embodiment 13. Reference will be had to FIG. 33. Incidentally, since the points of difference from the structure shown in FIG. 31 lie only in parts of the EL element and the current controlling TFT, the others shall be omitted from description.

Referring to FIG. 33, a current controlling TFT 3503 is formed using the p-channel type TFT of the invention. Regarding a fabricating process for the TFT 3503, Embodiments 1 to 9 may be referred to.

In this embodiment, a transparent conductive film is employed as a pixel electrode (anode) 50. Concretely, the conductive film is made of a compound of indium oxide and zinc oxide. Of course, a conductive film made of a compound of indium oxide and tin oxide may well be employed.

Besides, after banks 51a and 51b made of an insulating film have been formed, a light emitting layer 52 made of polyvinylcarbazole is formed by coating with a solution. The light emitting layer 52 is overlaid with an electron injection layer 53 made of potassium acetylacetonate (expressed as "acacK"), and a cathode 54 made of an aluminum alloy. In this case, the cathode 54 functions also as a passivation film. Thus, an EL element 3701 is formed.

In the case of this embodiment, light generated by the light emitting layer 52 is emitted toward a substrate formed with TFTs as indicated by an arrow.

By the way, the construction of this embodiment can be performed by being optionally combined with the constructions of Embodiments 1–9. Further it is effective to use the EL display panel of this embodiment as a display portion of the electrical devices which are shown in Embodiment 10.

Embodiment 15

In this embodiment, examples in the case where a pixel has a structure different from that of the circuit diagram shown in FIG. 32B will be described with reference to FIGS. 34A–34C. Here in this embodiment, numeral 3801 designates the source wiring line of a switching TFT 3802; numeral 3803, the gate wiring line of the switching TFT 3802; numeral 3804, a current controlling TFT; numeral 3805, a capacitor; each of numerals 3806 and 3808, a current feeder line; and numeral 3807, an EL element.

Figure 34A:
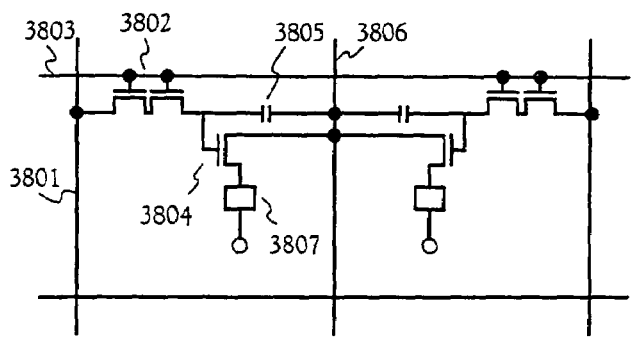
FIGS. 34A to 34C are diagrams showing the structure of an EL display device of Embodiment 15.

FIG. 34A illustrates the example in the case where the current supply line 3806 is made common to two pixels. That is, this example features that the two pixels are formed in line symmetry with respect to the current supply line 3806. In this case, the number of the supply voltage feeder lines can be decreased, so that a pixel unit can be endowed with a still higher definition.

Figure 34B:
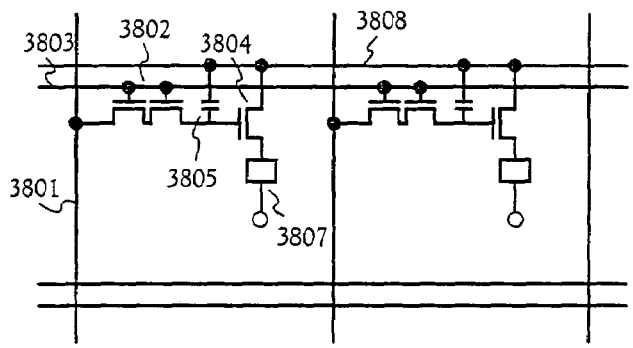

Besides, FIG. 34B illustrates the example in the case where the current supply line 3808 is laid in parallel with the gate wiring 3808. In the structure of FIG. 34B, the current supply line 3808 and the gate wiring 3803 are laid so as not to overlie each other, but when both the wirings 3808 and 3803 are formed in different layers, they can be laid so as to overlie each other through an insulating film. Since, in this case, the current supply line 3808 and the gate wiring 3803 can share an occupation area, a pixel unit can be endowed with a still higher definition.

Figure 34C:
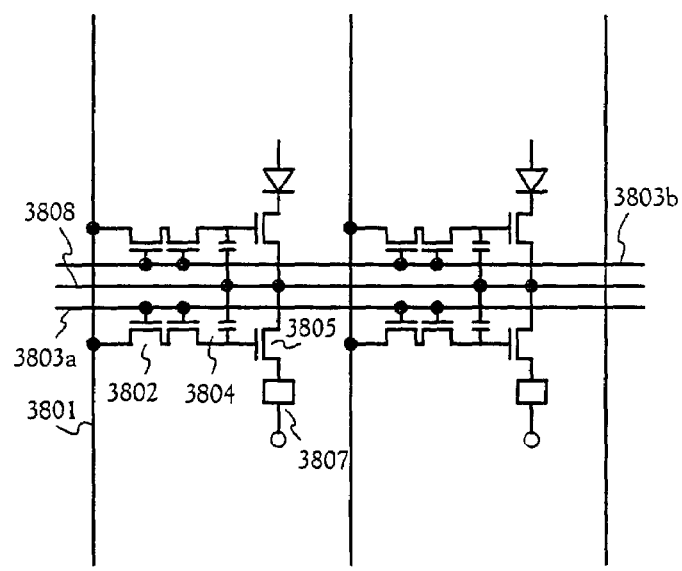

In addition, the example illustrated in FIG. 34C features that the current supply line 3808 is laid in parallel with the gate wiring 3803 in the same manner as in the structure of FIG. 34B, and further that two pixels are formed in line symmetry with respect to the current supply line 3808. It is also effective that the current feeder line 3808 is laid so as to overlie either of the gate wiring lines 3803 of the two pixels. In this case, the number of the current supply lines can be decreased, so that a pixel unit can be endowed with a still higher definition.

By the way, the construction of this embodiment can be performed by being optionally combined with the construction of Embodiments 1–9. Further it is effective to use the EL display panel of this embodiment as a display portion of the electrical devices which are shown in Embodiment 10.

Embodiment 16

In the structure of Embodiment 13 shown in FIGS. 32A and 32B, the capacitor 3504 is disposed in order to hold the voltage applied to the gate of the current controlling TFT 3503. It is also possible, however, to dispense with the capacitor 3504. In the case of Embodiment 13, the NTFT of the present invention as shown in Embodiments 1–9 is employed as the current controlling TFT 3503, so that the LDD region provided so as to be overlapped by the gate electrode through the gate insulating film is included. A parasitic capacitance generally called "gate capacitance" is formed in the overlapping domain. This embodiment features that the parasitic capacitance is positively utilized instead of the capacitor 3504.

Since the magnitude of the parasitic capacitance changes depending upon the area of the overlap between the gate electrode and the LDD region, it is determined by the length of the LDD region included in the overlapping domain.

Also in each of the structures of Embodiment 15 as shown in FIGS. 34A–34C, the capacitor 3805 can be similarly dispensed with.

By the way, the construction of this embodiment can be performed by being freely combined with the construction of Embodiments 1–9. Further it is effective to use the EL display panel of this embodiment as a display portion of the electrical devices which are shown in Embodiment 10.

According to the present invention, in a semiconductor device having a substrate on which a plurality of functional circuits are formed (specifically, an electro-optical device), an impurity element is added to a semiconductor layer forming a lower electrode of a storage capacitor, so that the conductivity of the lower electrode can be increased. Also, a gate insulating film reduced in thickness by an etching process is used as a dielectric for the storage capacitor. Therefore, a storage capacitor having a large capacity for its restricted area can be obtained without increasing the number of process steps. Since the area of the storage capacitor can be reduced, the aperture ratio can be increased.

Also, the performance of a TFT can be optimized according to specifications required with respect to a circuit in which the TFT is used, thereby advantageously improving the operating characteristics of the TFT.

What is claimed is:

1. A semiconductor device comprising:
   a pixel portion formed over a substrate;
   a pixel thin film transistor in the pixel portion;
   a storage capacitor in the pixel portion;
   a leveling film in the pixel portion, formed over the pixel thin film transistor and the storage capacitor;
   a pixel electrode in the pixel portion, formed on the leveling film; and
   a column-shape spacer in the pixel portion formed over the leveling film,
   wherein the pixel thin film transistor includes:
      a first region of a semiconductor film having a channel forming region, a source region and a drain region;
      a gate insulating film being in contact with the first region; and
      a gate electrode being formed on the gate insulating film,
   wherein the storage capacitor includes:
      a second region of the semiconductor film;
      an insulating film being in contact with the second region; and
      a storage wiring being formed on the insulating film,
   wherein the insulating film in contact with the second region has a thinner thickness than the gate insulating film in contact with the first region,
   wherein the column-shape spacer has a top surface and a bottom surface, and
   wherein an area of the bottom surface is larger than an area of the top surface.

2. The semiconductor device according to claim 1, wherein one layer in the gate electrode and the storage wiring comprises same material.

3. The semiconductor device according to claim 1, wherein the storage wiring comprises at least one of aluminum (Al) and copper (Cu).

4. The semiconductor device according to claim 1, wherein the pixel thin film transistor is an n-channel thin film transistor.

5. The semiconductor device according to claim 1, wherein the semiconductor device is one selected from the group consisting of a personal computer, a video camera, a portable information terminal, a digital camera, a digital video disk player, and a projector.

6. A semiconductor device comprising:
   a pixel portion and a driver circuit portion formed over a substrate;
   a pixel thin film transistor in the pixel portion;
   a storage capacitor in the pixel portion;
   a leveling film in the pixel portion, formed over the pixel thin film transistor and the storage capacitor;
   a pixel electrode in the pixel portion, formed on the leveling film; and
   a column-shape spacer in the pixel portion, formed over the leveling film,
   wherein pixel thin film transistor includes:
      a first region of a semiconductor film having a channel forming region, a source region and a drain region;
      a gate insulating film being in contact with the first region; and
      a gate electrode being formed on the gate insulating film,
   wherein the storage capacitor includes:
      a second region of the semiconductor film;
      an insulating film being in contact with the second region; and
      a storage wiring being formed on the insulating film, wherein the insulating film in contact with the second region has a thinner thickness than the gate insulating film in contact with the first region,
wherein the column-shape spacer has a top surface and a bottom surface, and
wherein an area of the bottom surface is larger than an area of the top surface.

7. The semiconductor device according to claim 6,
wherein one layer in the gate electrode and the storage wiring comprises same material.

8. The semiconductor device according to claim 6,
wherein the storage wiring comprises at least one of aluminum (Al) and copper (Cu).

9. The semiconductor device according to claim 6,
wherein the pixel thin film transistor is an n-channel thin film transistor.

10. The semiconductor device according to claim 6,
wherein the semiconductor device is one selected from the group consisting of a personal computer, a video camera, a portable information terminal, a digital camera, a digital video disk player and a projector.

11. A semiconductor device comprising:
a pixel portion formed over a substrate;
a pixel thin film transistor in the pixel portion;
a storage capacitor in the pixel portion;
an n-channel thin film transistor and a p-channel thin film transistor in a driver circuit; and
a leveling film in the pixel portion;
a pixel electrode in the pixel portion, formed on the leveling film; and
a column-shape spacer in the pixel portion, formed over the leveling film,
wherein the pixel thin film transistor includes:
    a first region of a first semiconductor film having a first channel forming region, a first source region and a first drain region;
    a first gate insulating film being in contact with the first region; and
    a first gate electrode being formed on the first gate insulating film,
wherein the storage capacitor includes:
    a second region of the first semiconductor film;
    an insulating film being in contact with the second region; and
    a storage wiring being formed on the insulating film,
wherein the insulating film in contact with the second region has a thinner thickness thah the first gate insulating film in contact with the first region,
wherein the n-channel thin film transistor has a second semiconductor film, a second gate insulating film on the second semiconductor film, and a second gate electrode on the second gate insulating film,
wherein the second semiconductor film includes a second channel forming region, a second source region, and a second drain region,
wherein the second gate electrode includes a first conductive layer and a second conductive layer on the first conductive layer,
wherein the column-shape spacer has a top surface and a bottom surface, and
wherein an area of the bottom surface is larger than an area of the top surface.

12. The semiconductor device according to claim 11,
wherein the second conductive layer comprises at least one of aluminum (Al) and copper (Cu).

13. The semiconductor device according to claim 11,
wherein the semiconductor device is one selected from the group consisting of a personal computer, a video camera, a portable information terminal, a digital camera, a digital video disk player and a projector.

14. A semiconductor device comprising:
a pixel thin film transistor in a pixel portion; and
a storage capacitor in the pixel portion,
wherein the pixel thin film transistor includes:
    a first region of a semiconductor film having a channel forming region, an LDD region, a source region and a drain region;
    a gate insulating film being in contact with the first region; and
    a gate electrode being formed on the gate insulating film,
wherein the storage capacitor includes:
    a second region of the semiconductor film;
    an insulating film being in contact with the second region; and
    a storage wiring being formed on the insulating film,
wherein the insulating film in contact with the second region has a thinner thickness than the gate insulating film in contact with the first region, and
wherein the LDD region comprises a first portion and a second portion,
wherein a concentration of an element decreases from the first portion to the second portion, and
wherein the second portion is closer to the channel forming region than the first portion.

15. The semiconductor device according to claim 14,
wherein one layer in the gate electrode and the storage wiring comprises same material.

16. The semiconductor device according to claim 14
wherein the storage wiring comprises at least one of aluminum (Al) and copper (Cu).

17. The semiconductor device according to claim 14,
wherein the pixel thin film transistor is an n-channel thin film transistor.

18. The semiconductor device according to claim 14,
wherein the semiconductor device is one selected from the group consisting of a personal computer, a video camera, a portable information terminal, a digital camera, a digital video disk player and a projector.

19. A semiconductor device comprising:
a pixel portion and a driver circuit portion formed over a substrate;
a pixel thin film transistor in the pixel portion; and
a storage capacitor in the pixel portion,
wherein the pixel thin film transistor includes:
    a first region of a semiconductor film having a channel forming region, an LDD region, a source region and a drain region;
    a gate insulating film being in contact with the first region; and
    a gate electrode being formed on the gate insulating film,
wherein the storage capacitor includes:
    a second region of the semiconductor film;
    an insulating film being in contact with the second region; and
    a storage wiring being formed on the insulating film,
wherein the insulating film in contact with the second region has a thinner thickness than the gate insulating film in contact with the first region, and
wherein the LDD region comprises a first portion and a second portion, wherein a concentration of an element decreases from the first portion to the second portion, and wherein the second portion is closer to the channel forming region than the first portion.

20. The semiconductor device according to claim 19, wherein one layer in the gate electrode and the storage wiring comprises same material.

21. The semiconductor device according to claim 19, wherein the storage wiring comprises at least one of aluminum (Al) and copper (Cu).

22. The semiconductor device according to claim 19, wherein the pixel thin film transistor is an n-channel thin film transistor.

23. The semiconductor device according to claim 19, wherein the semiconductor device is one selected from the group consisting of a personal computer, a video camera, a portable information terminal, a digital camera, a digital video disk player and a projector.

24. A semiconductor device comprising:
a pixel portion formed over a substrate;
a pixel thin film transistor in the pixel portion;
a storage capacitor in the pixel portion;
an n-channel thin film transistor and a p-channel thin film transistor in a driver circuit;
a leveling film in the pixel portion;
a pixel electrode in the pixel portion, formed on the leveling film; and
a column-shape spacer in the pixel portion, formed over the leveling film,
wherein the pixel thin film transistor includes:
  a first region of a first semiconductor film having a first channel forming region, a first source region and a first drain region;
  a first gate insulating film being in contact with the first region; and
  a first gate electrode being formed on the first gate insulating film,
wherein the storage capacitor includes:
  a second region of the first semiconductor film;
  an insulating film being in contact with the second region; and
  a storage wiring being formed on the insulating film,
wherein the insulating film in contact with the second region has a thinner thickness than the first gate insulating film in contact with the first region,
wherein the n-channel thin film transistor has a second semiconductor film, a second gate insulating film on the second semiconductor film, and a second gate electrode on the second gate insulating film,
wherein the second semiconductor film includes a second channel forming region, an LDD region, a second source region, and a second drain region,
wherein the second gate electrode includes a first conductive layer and a second conductive layer,
wherein the LDD region comprises a first portion and a second portion,
wherein a concentration of an element decreases from the first portion to the second portion, and
wherein the second portion is closer to the second channel forming region than the first portion.

25. The semiconductor device according to claim 24, wherein the storage wiring comprises at least one of aluminum (Al) and copper (Cu).

26. The semiconductor device according to claim 24, wherein the semiconductor device is one selected from the group consisting of a personal computer, a video camera, a portable information terminal, a digital camera, a digital video disk player and a projector.

27. The semiconductor device according to claim 1, wherein the top surface is a flat surface.

28. The semiconductor device according to claim 6, wherein the top surface is a flat surface.

29. The semiconductor device according to claim 11, wherein the top surface is a flat surface.

* * * * *